US010249768B2

(12) United States Patent
Koezuka et al.

(10) Patent No.: US 10,249,768 B2
(45) Date of Patent: Apr. 2, 2019

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Junichi Koezuka, Tochigi (JP); Masami Jintyou, Tochigi (JP); Yukinori Shima, Gunma (JP); Daisuke Kurosaki, Tochigi (JP); Masataka Nakada, Tochigi (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/935,324

(22) Filed: Mar. 26, 2018

(65) Prior Publication Data
US 2018/0219102 A1 Aug. 2, 2018

Related U.S. Application Data

(60) Division of application No. 15/226,051, filed on Aug. 2, 2016, now Pat. No. 9,997,637, which is a
(Continued)

(30) Foreign Application Priority Data

Feb. 7, 2014 (JP) .................................. 2014-022871
Feb. 7, 2014 (JP) .................................. 2014-022872
(Continued)

(51) Int. Cl.
*H01L 29/10* (2006.01)
*H01L 29/786* (2006.01)
*H01L 27/12* (2006.01)

(52) U.S. Cl.
CPC .... *H01L 29/78693* (2013.01); *H01L 27/1225* (2013.01); *H01L 27/1251* (2013.01);
(Continued)

(58) Field of Classification Search
CPC ............. H01L 27/1225; H01L 27/1251; H01L 29/78606; H01L 29/7869; H01L 29/78696
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2207206 A 7/2010
(Continued)

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.
(Continued)

*Primary Examiner* — Dzung Tran
(74) *Attorney, Agent, or Firm* — Nixon Peabody LLP; Jeffrey L. Costellia

(57) ABSTRACT

The semiconductor device includes a first transistor provided in a driver circuit portion and a second transistor provided in a pixel portion; the first transistor and the second transistor have different structures. In an oxide semiconductor film of each of the transistors, an impurity element is contained in regions which do not overlap with a gate electrode. The regions of the oxide semiconductor film which contain the impurity element function as low-resis-
(Continued)

tance regions. Furthermore, the regions of the oxide semiconductor film which contain the impurity element are in contact with a film containing hydrogen. Furthermore, the first transistor provided in the driver circuit portion may include the oxide semiconductor film in which a first film and a second film are stacked, and the second transistor provided in the pixel portion may include the oxide semiconductor film which differs from the first film in the atomic ratio of metal elements.

10 Claims, 53 Drawing Sheets

Related U.S. Application Data continuation of application No. 14/608,224, filed on Jan. 29, 2015, now Pat. No. 9,412,876.

(30) Foreign Application Priority Data

| Mar. 14, 2014 | (JP) | ................................. | 2014-051131 |
| Mar. 14, 2014 | (JP) | ................................. | 2014-051136 |

(52) U.S. Cl.
CPC .... *H01L 29/7869* (2013.01); *H01L 29/78606* (2013.01); *H01L 29/78696* (2013.01)

(58) Field of Classification Search
USPC .......................................................... 257/43
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,662,704 B2 | 2/2010 | Yasukawa |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,003,981 B2 | 8/2011 | Iwasaki et al. |
| 8,058,645 B2 | 11/2011 | Jeong et al. |
| 8,067,775 B2 | 11/2011 | Miyairi et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,222,092 B2 | 7/2012 | Yamazaki et al. |
| 8,274,078 B2 | 9/2012 | Itagaki et al. |
| 8,274,079 B2 | 9/2012 | Yamazaki |
| 8,367,489 B2 | 2/2013 | Yamazaki |
| 8,373,832 B2 | 2/2013 | Takasawa et al. |
| 8,384,076 B2 | 2/2013 | Park et al. |
| 8,436,342 B2 | 5/2013 | Park et al. |
| 8,513,661 B2 | 8/2013 | Takahashi et al. |
| 8,624,240 B2 | 1/2014 | Sato et al. |
| 8,643,008 B2 | 2/2014 | Yamazaki et al. |
| 8,674,354 B2 | 3/2014 | Yamazaki |
| 8,698,138 B2 | 4/2014 | Yamazaki |
| 8,748,215 B2 | 6/2014 | Yamazaki |
| 8,748,881 B2 | 6/2014 | Yamazaki |
| 8,765,522 B2 | 7/2014 | Yamazaki |
| 8,779,420 B2 | 7/2014 | Yamazaki |
| 8,878,180 B2 | 11/2014 | Yamazaki |
| 9,136,390 B2 | 9/2015 | Yamazaki et al. |
| 9,202,923 B2 | 12/2015 | Yamazaki |
| 9,646,829 B2 | 5/2017 | Ohno et al. |
| 9,711,651 B2 | 7/2017 | Yamazaki et al. |
| 9,728,555 B2 | 8/2017 | Yamazaki |
| 9,991,288 B2 | 6/2018 | Yamazaki |
| 2001/0030323 A1 | 10/2001 | Ikeda |
| 2001/0046027 A1 | 11/2001 | Tai et al. |
| 2002/0043662 A1 | 4/2002 | Yamazaki et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |

(56) References Cited

U.S. PATENT DOCUMENTS

| | | |
|---|---|---|
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0321732 A1 | 12/2009 | Kim et al. |
| 2010/0051935 A1 | 3/2010 | Lee et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2010/0163868 A1 | 7/2010 | Yamazaki et al. |
| 2010/0320458 A1 | 12/2010 | Umeda et al. |
| 2010/0320459 A1 | 12/2010 | Umeda et al. |
| 2011/0073856 A1 | 3/2011 | Sato et al. |
| 2011/0127579 A1 | 6/2011 | Yamazaki |
| 2011/0193083 A1 | 8/2011 | Kim et al. |
| 2011/0210328 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |
| 2011/0215328 A1 | 9/2011 | Morosawa et al. |
| 2012/0052624 A1 | 3/2012 | Yamazaki |
| 2012/0061668 A1 | 3/2012 | Miyairi et al. |
| 2012/0119205 A1 | 5/2012 | Taniguchi et al. |
| 2014/0014947 A1 | 1/2014 | Yamazaki |
| 2014/0197407 A1 | 7/2014 | Yamazaki |
| 2014/0306217 A1* | 10/2014 | Yamazaki ............ H01L 29/7869 257/43 |
| 2014/0346501 A1 | 11/2014 | Yamazaki |
| 2014/0349443 A1 | 11/2014 | Yamazaki |
| 2017/0317215 A1 | 11/2017 | Yamazaki et al. |
| 2018/0211980 A1 | 7/2018 | Yamazaki |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2007-102054 A | 4/2007 |
| JP | 2007-220817 A | 8/2007 |
| JP | 2007-220818 A | 8/2007 |
| JP | 2007-250983 A | 9/2007 |
| JP | 2009-176865 A | 8/2009 |
| JP | 2009-231613 A | 10/2009 |
| JP | 2009-278115 A | 11/2009 |
| JP | 2010-016347 A | 1/2010 |
| JP | 4415062 | 2/2010 |
| JP | 2010-067954 A | 3/2010 |
| JP | 2010-161327 A | 7/2010 |
| JP | 2010-171404 A | 8/2010 |
| JP | 2010-177431 A | 8/2010 |
| JP | 4571221 | 10/2010 |
| JP | 2011-181913 A | 9/2011 |
| JP | 2012-033836 A | 2/2012 |
| JP | 2012-160679 A | 8/2012 |
| JP | 2012-199530 A | 10/2012 |
| JP | 2013-048219 A | 3/2013 |
| JP | 2014-033194 A | 2/2014 |
| WO | WO-2004/114391 | 12/2004 |
| WO | WO-2008/133345 | 11/2008 |
| WO | WO-2009/093722 | 7/2009 |
| WO | WO-2011/052471 | 5/2011 |
| WO | WO-2011/096263 | 8/2011 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

(56) References Cited

OTHER PUBLICATIONS

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technicals Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214TH ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3-BO Systems [A;Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3 and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Left. (Applied Physical Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15TH International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

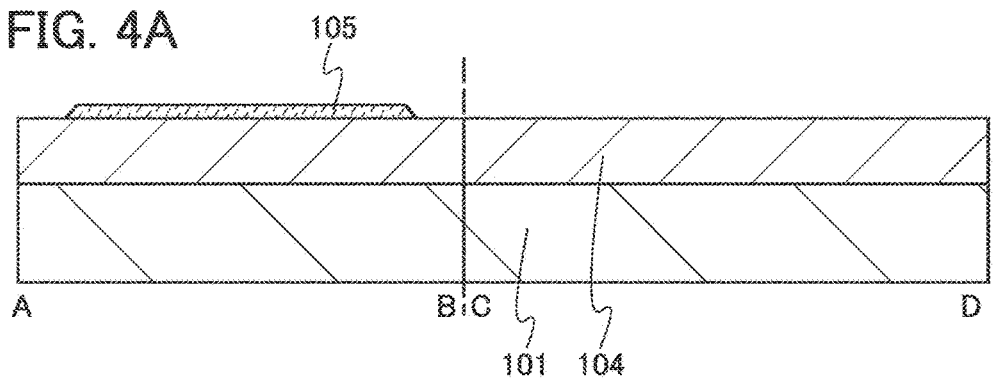
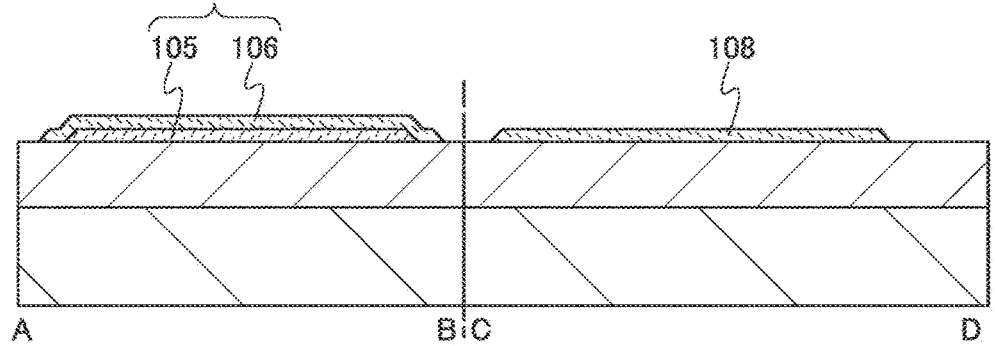
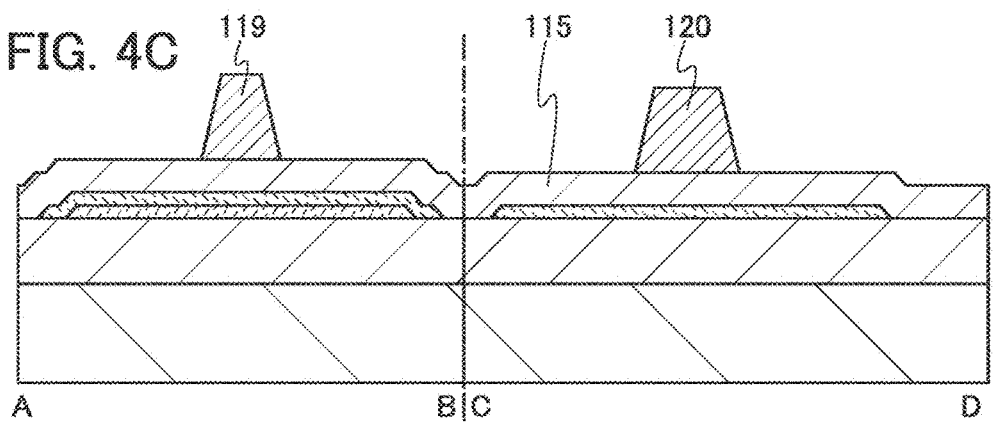

FIG. 7A
100k
FIG. 7B
100z
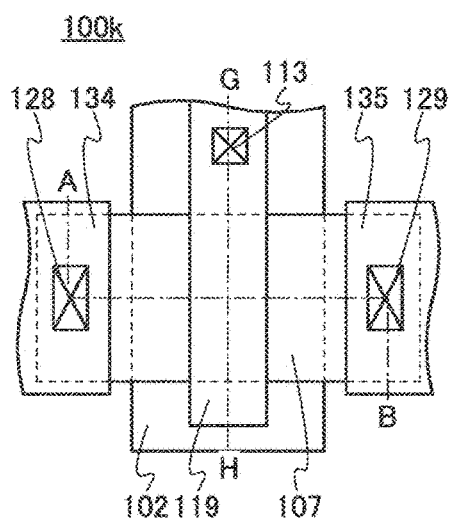
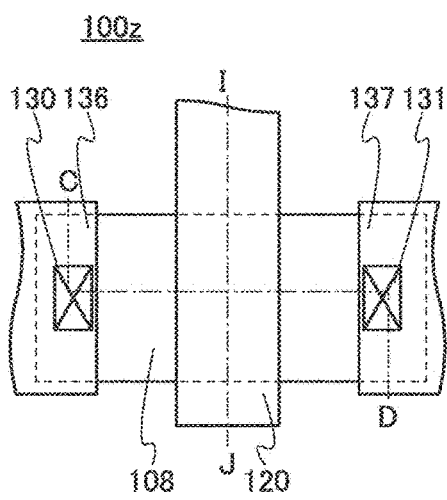

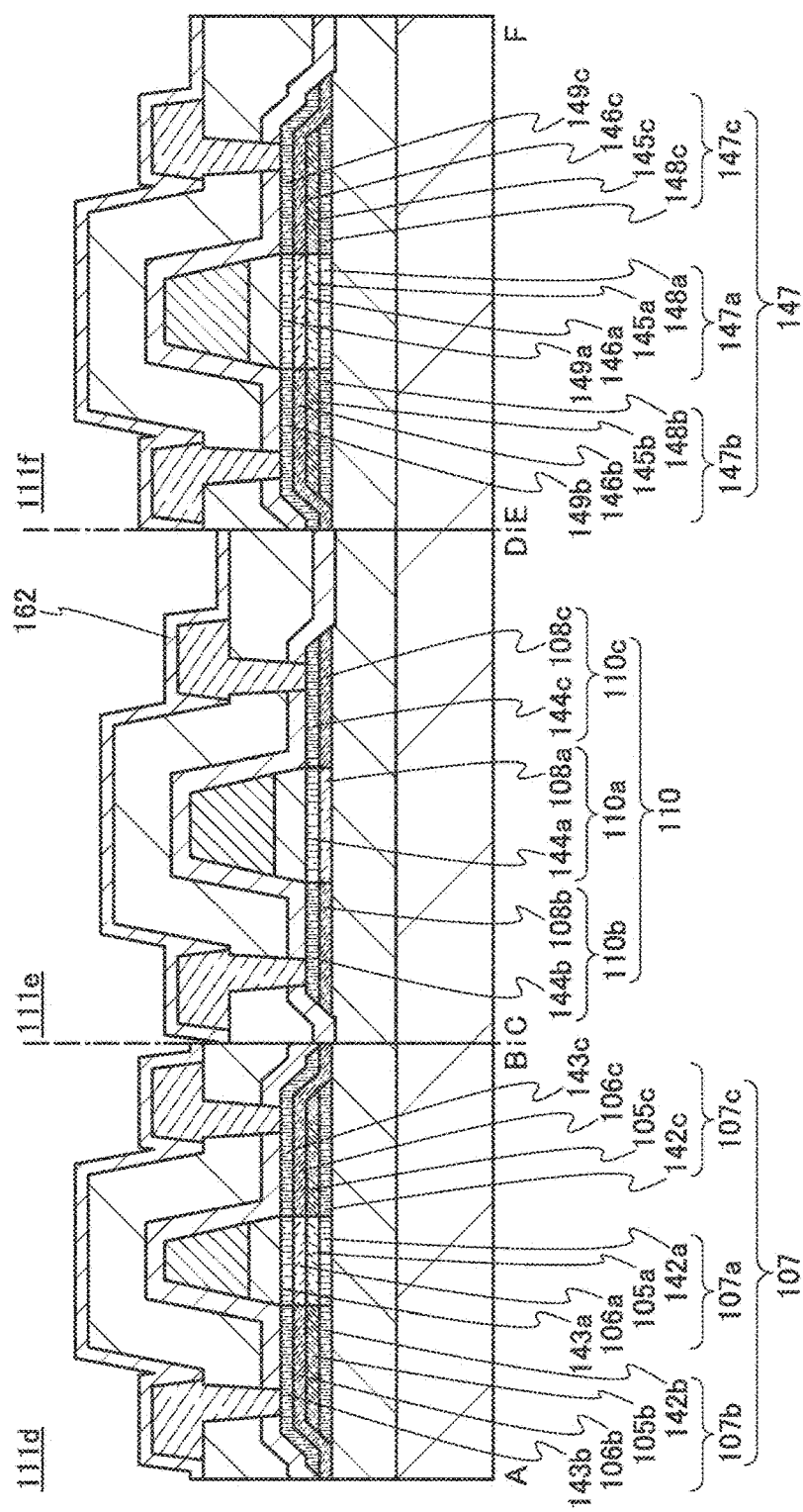

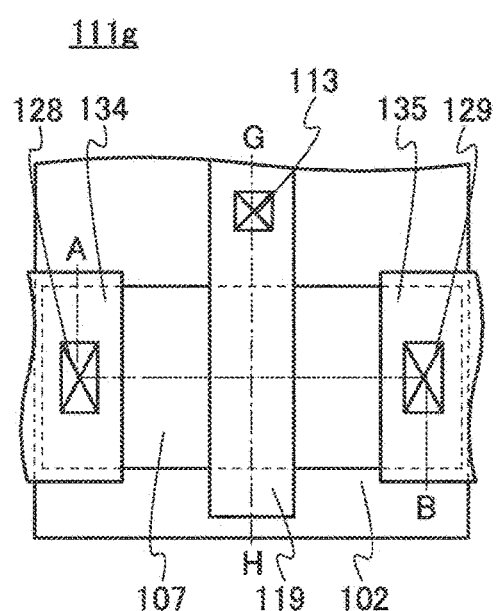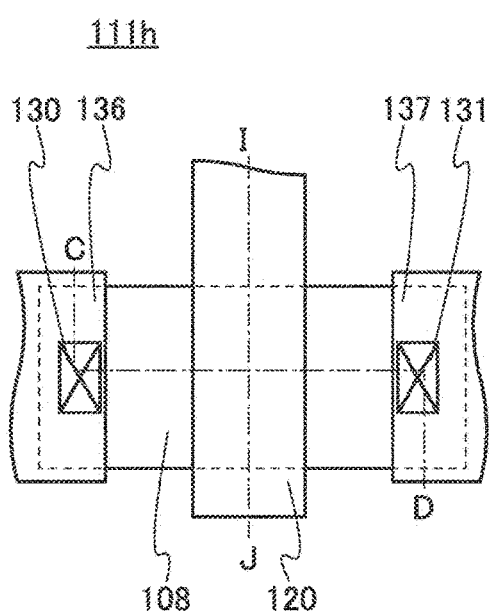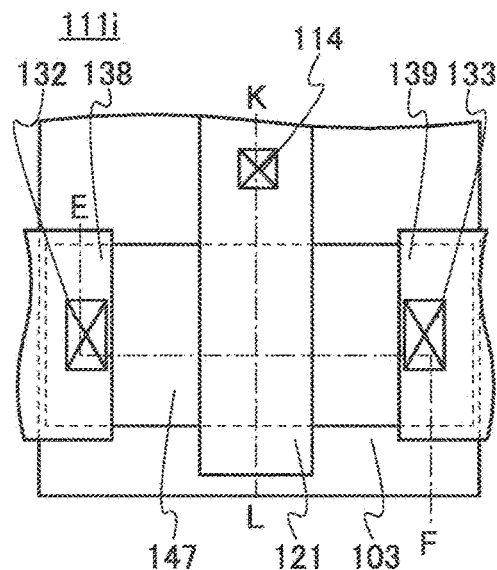

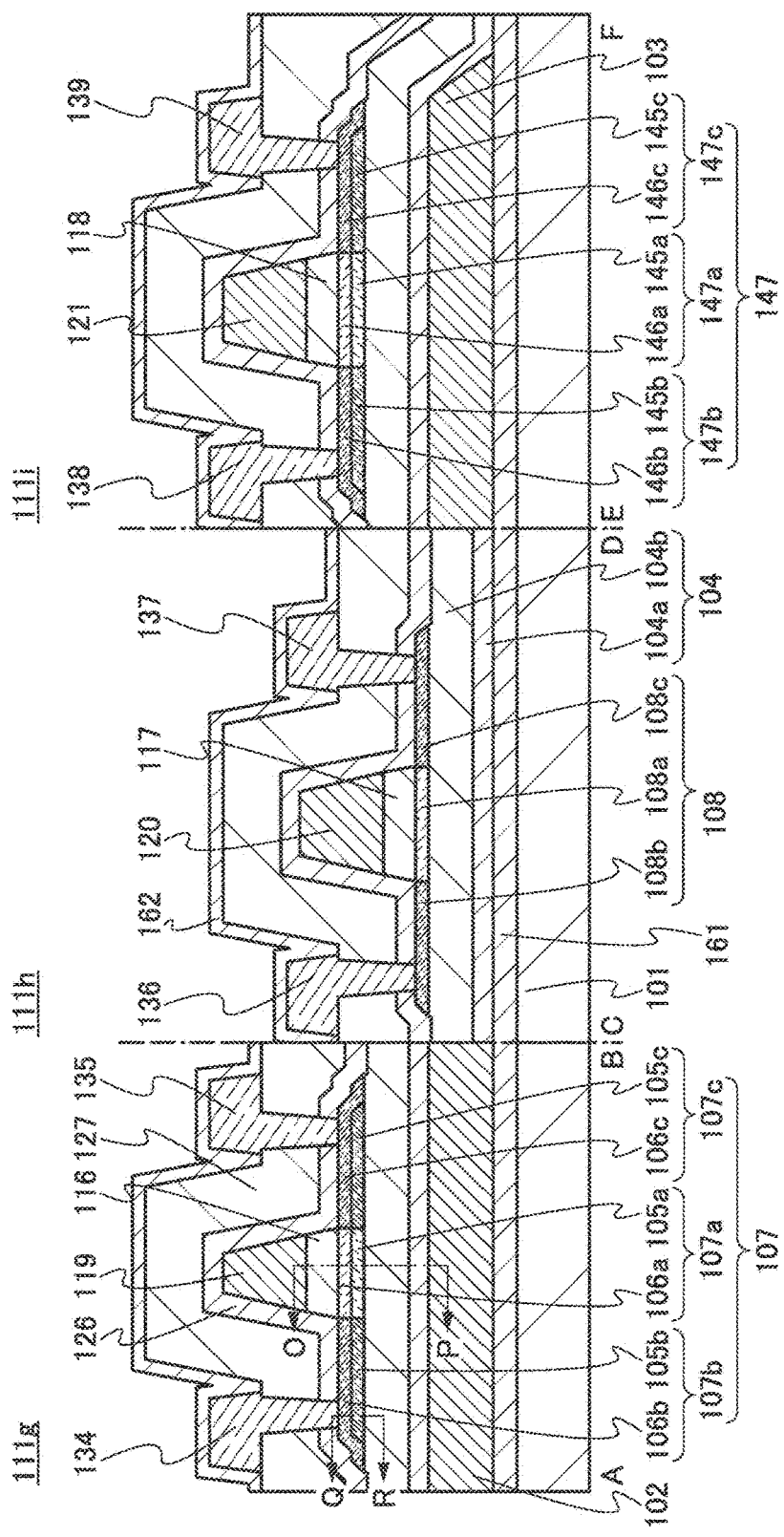

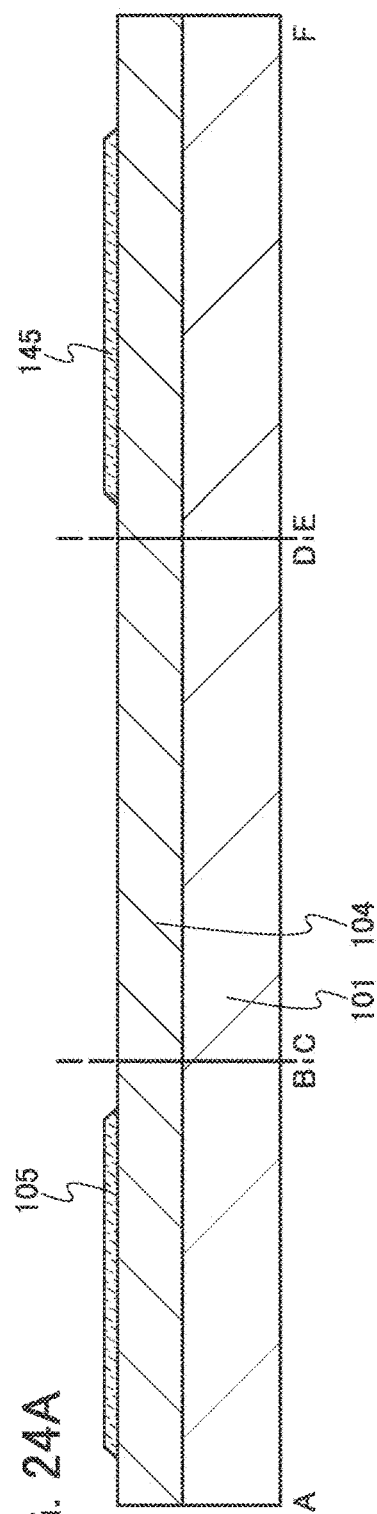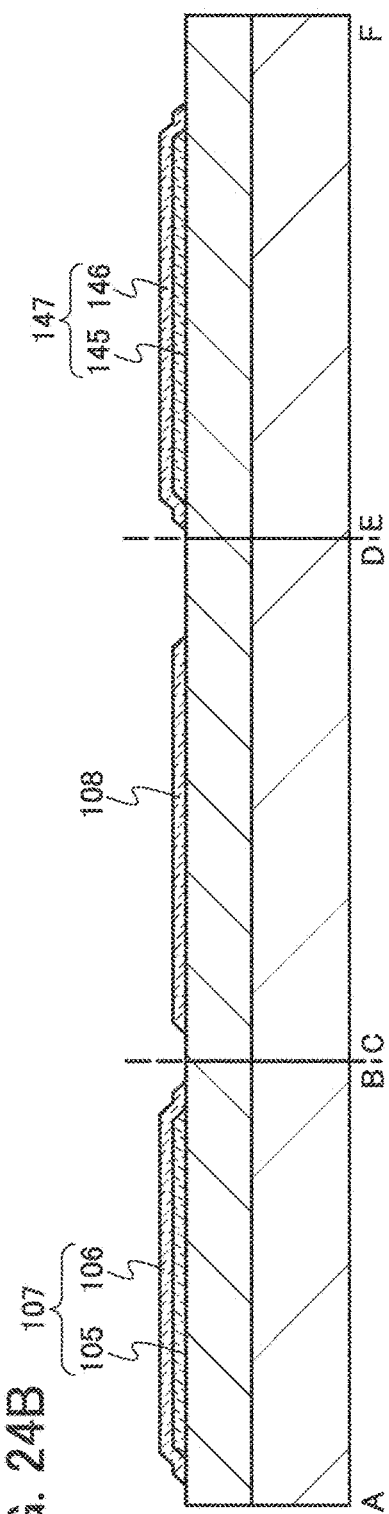

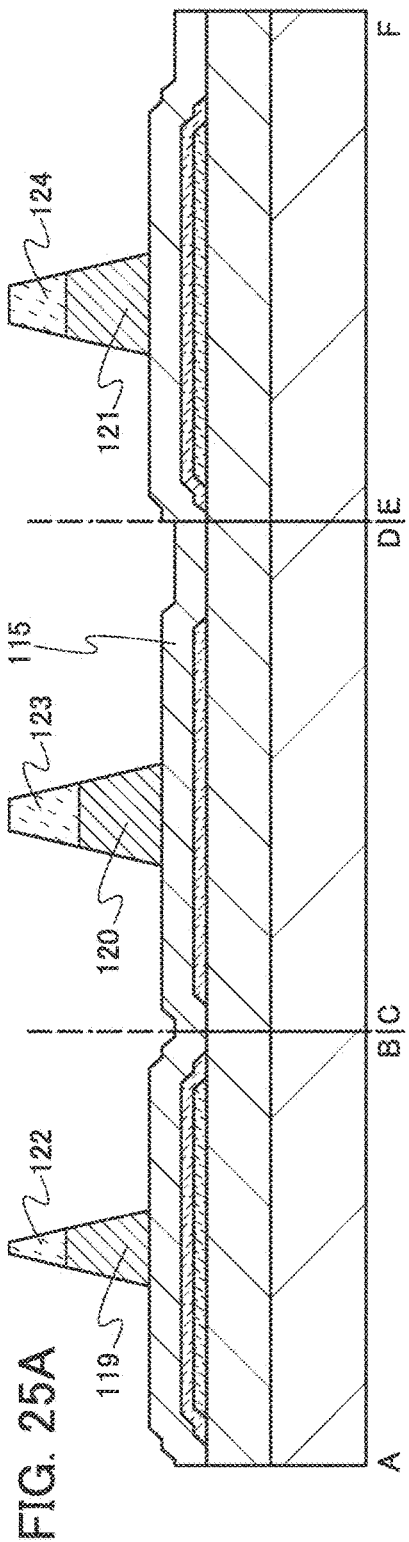
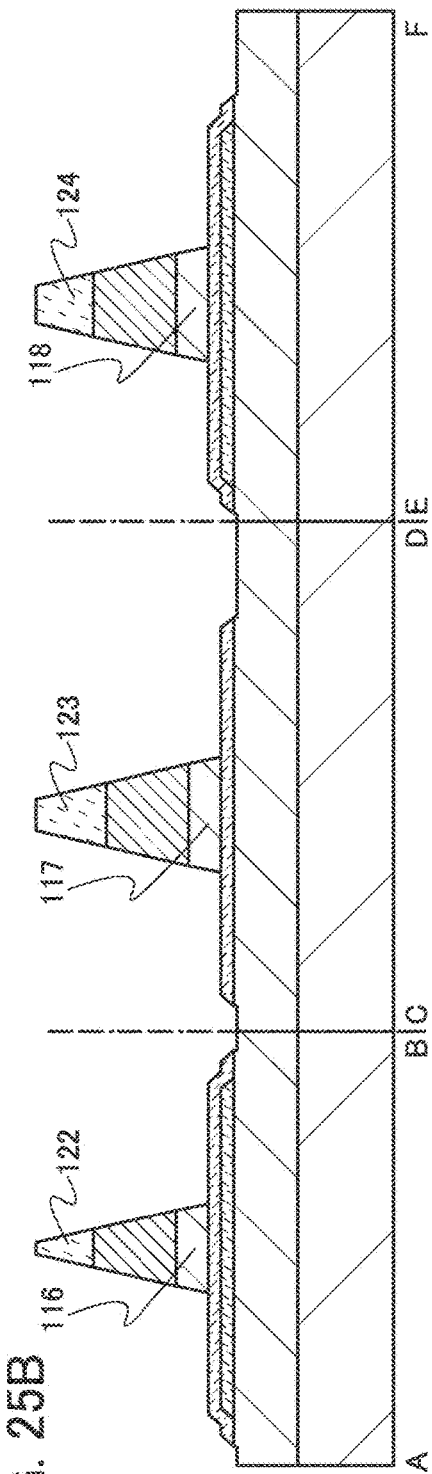

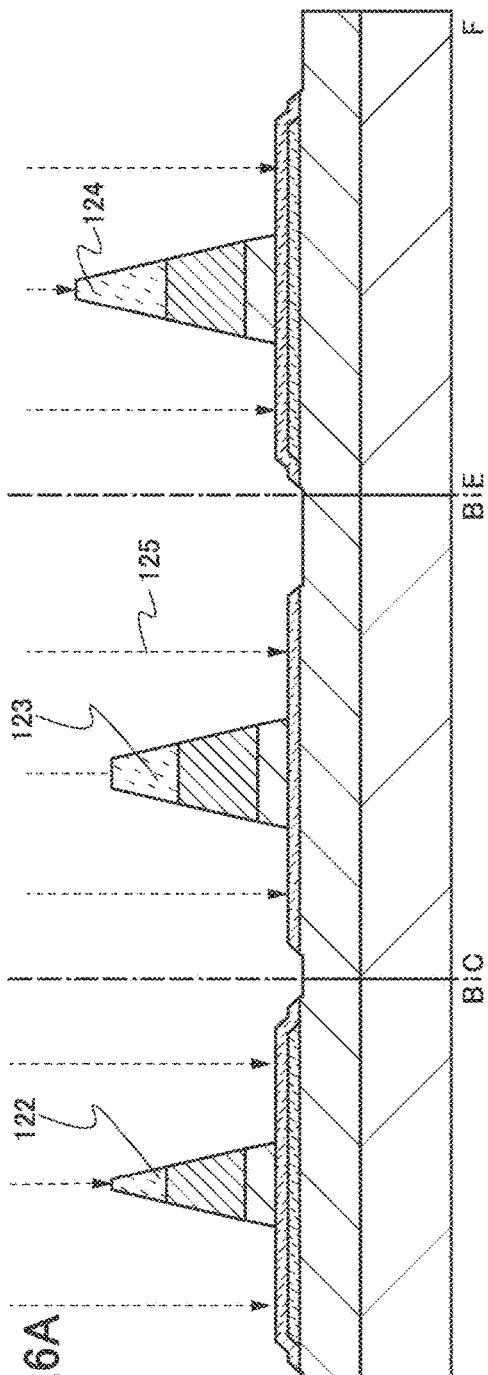
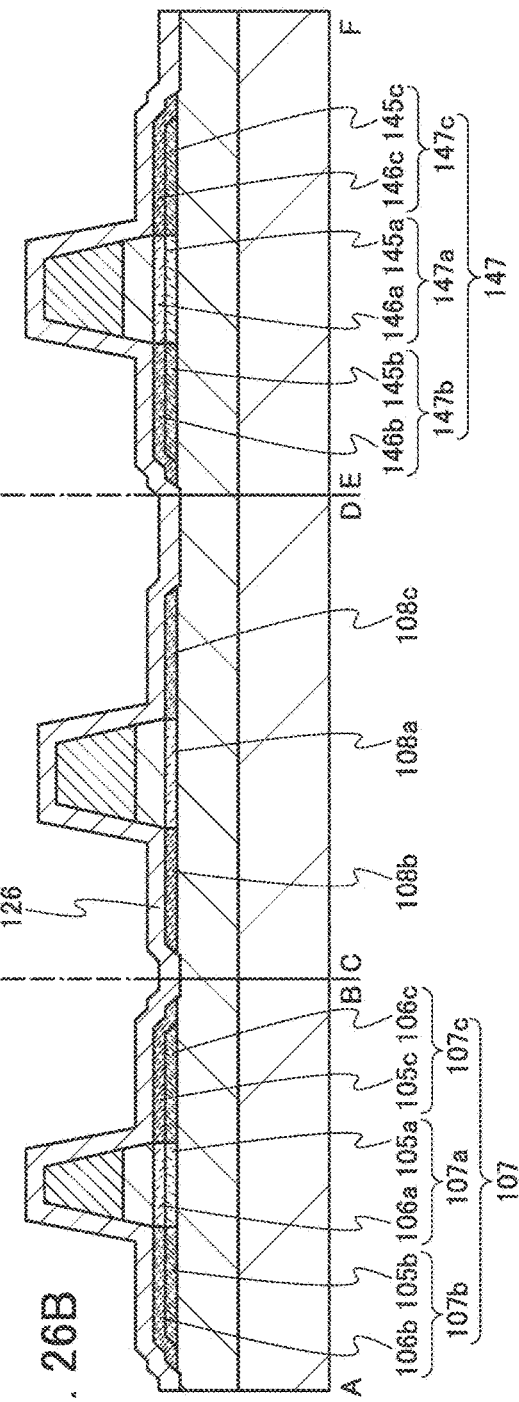
FIG. 26A
FIG. 26B

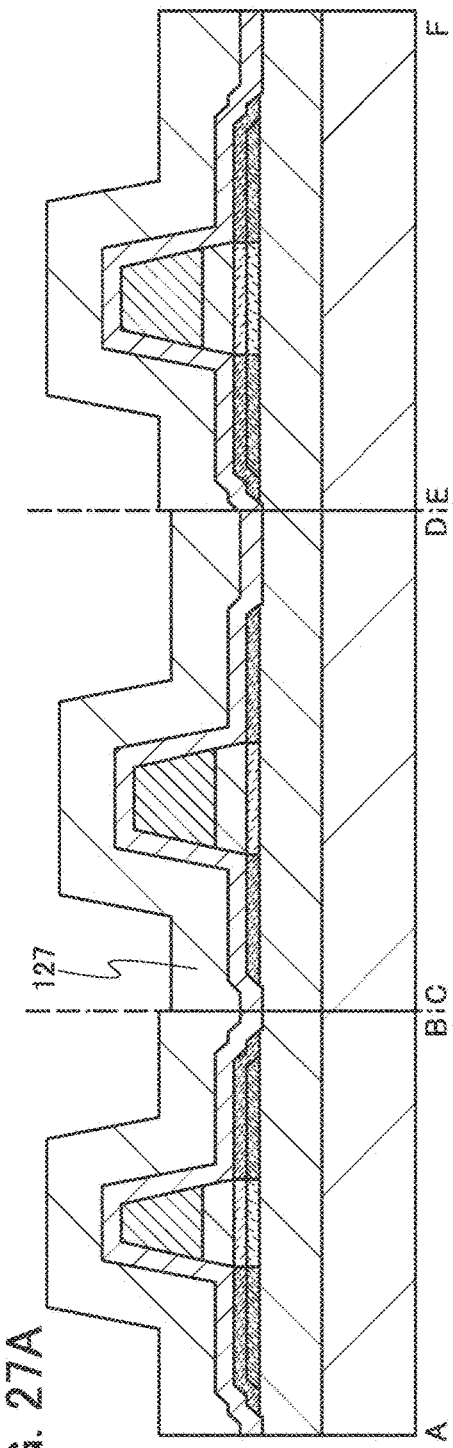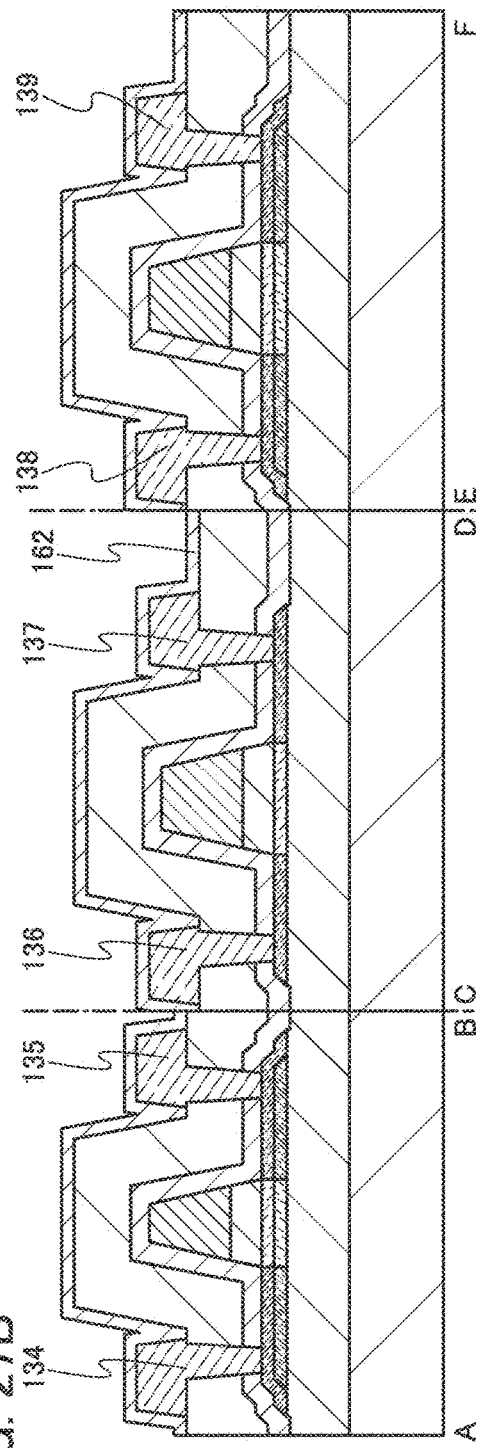

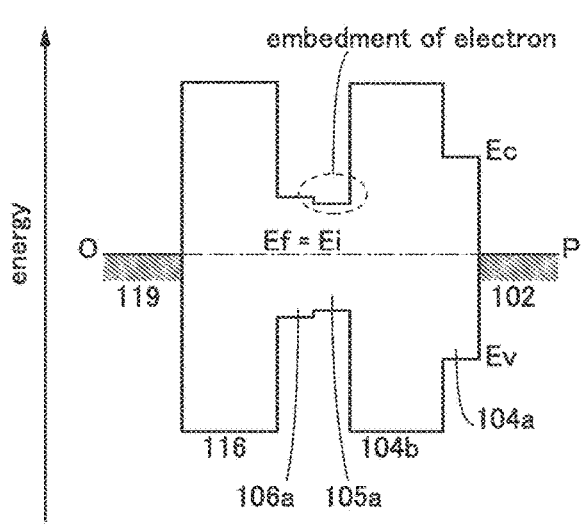
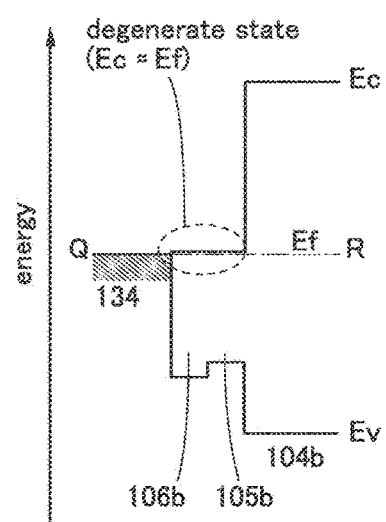
FIG. 28A
FIG. 28B

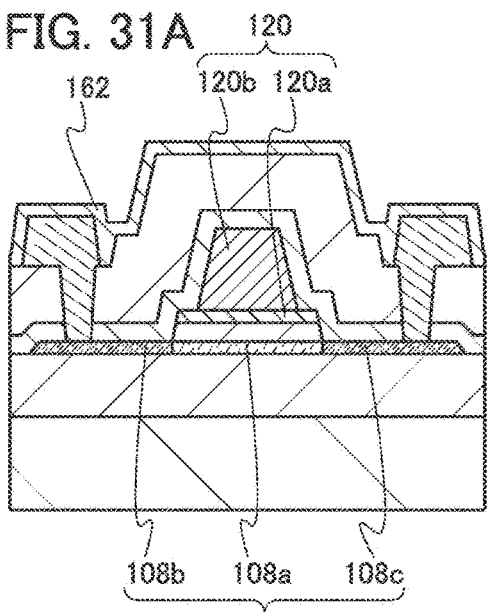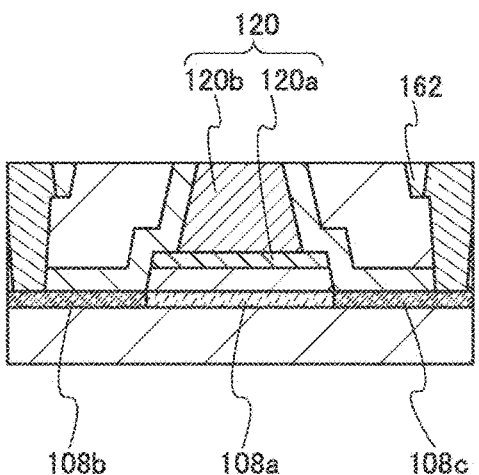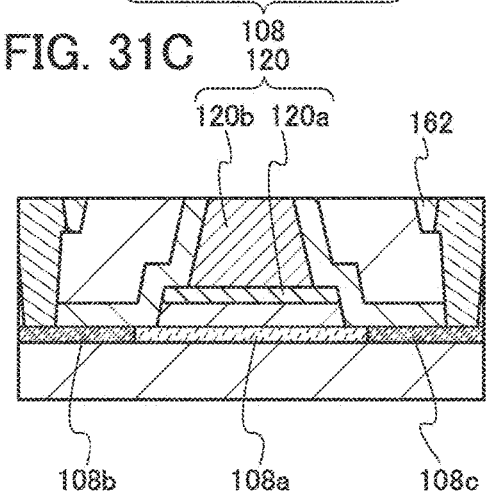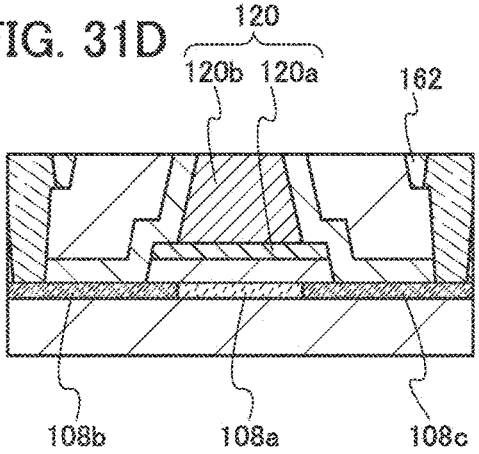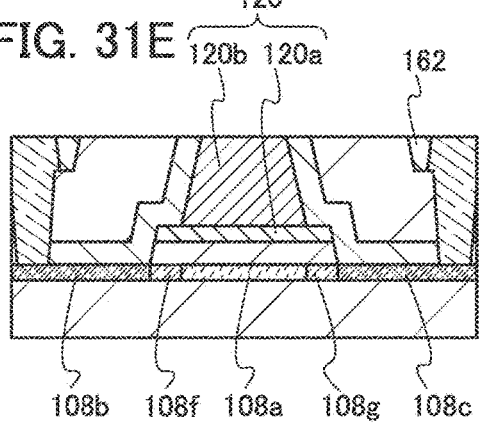

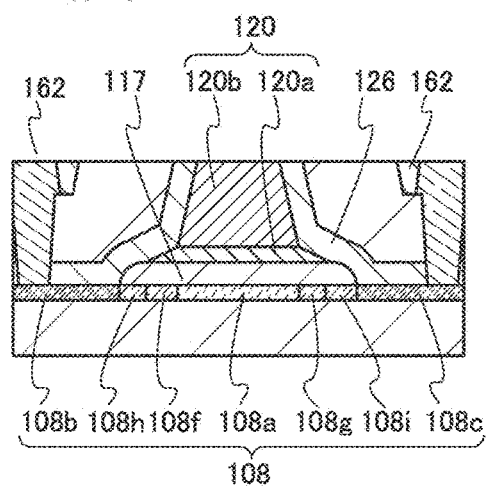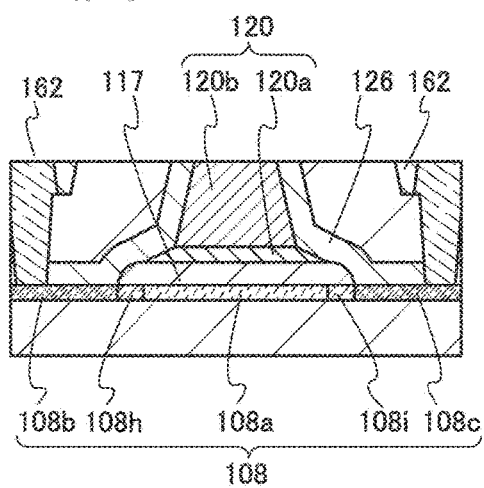

FIG. 36A  Initial state ($V_O H$)
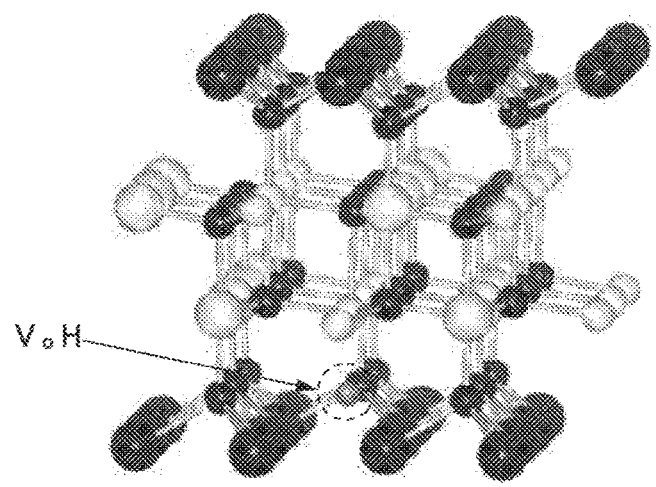
FIG. 36B  Final state ($V_O$, H-O)
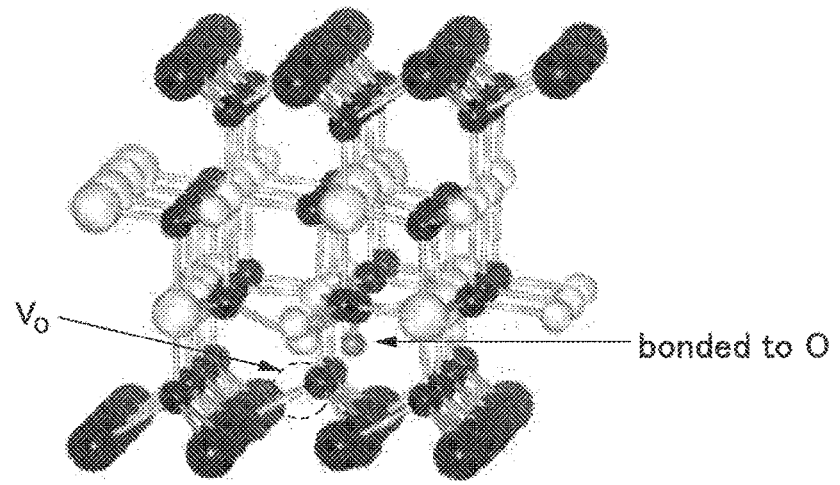

FIG. 38A Initial state ($V_OH$)
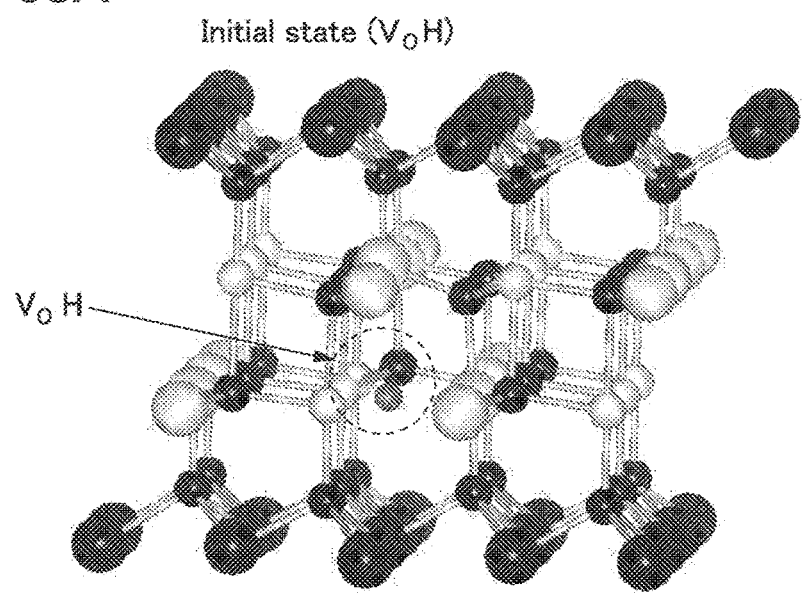
$V_OH$
FIG. 38B Final state ($V_O$, H–O)
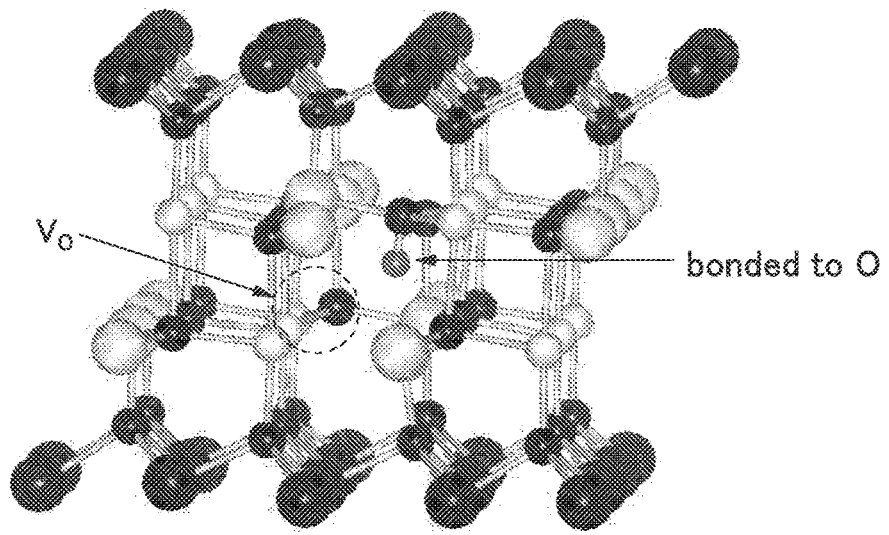
$V_O$
bonded to O Peak attributed to substrate Sample irradiated with electron beam parallel to sample surface Sample irradiated with electron beam perpendicular to sample surface

SEMICONDUCTOR DEVICE

BACKGROUND OF THE INVENTION

1. Field of the Invention

One embodiment of the present invention relates to a semiconductor device including an oxide semiconductor and a display device including the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor using a semiconductor thin film formed over a substrate having an insulating surface (also referred to as thin film transistor (TFT)). The transistor is used in a wide range of electronic devices such as an integrated circuit (IC) or an image display device (display device). A semiconductor material typified by silicon is widely known as a material for a semiconductor thin film that can be used for a transistor. As another material, an oxide semiconductor has been attracting attention.

For example, Patent Document 1 discloses a technique in which a transistor is manufactured using an amorphous oxide containing In, Zn, Ga, Sn, and the like as an oxide semiconductor.

REFERENCE

Patent Document

[Patent Document 1] Japanese Published Patent Application No. 2006-165529

SUMMARY OF THE INVENTION

As a transistor including an oxide semiconductor film, an inverted staggered transistor (also referred to as a transistor having a bottom-gate structure), a planar transistor (also referred to as a transistor having a top-gate structure), and the like are given. In the case where a transistor including an oxide semiconductor film is used for a display device, an inverted staggered transistor is used more often than a planar transistor because a manufacturing process thereof is relatively simple and manufacturing cost thereof can be kept low. However, signal delay or the like is increased by parasitic capacitance that exists between a gate electrode and source and drain electrodes of an inverted staggered transistor and accordingly image quality of a display device degrades, which has posed a problem, as an increase in screen size of a display device proceeds, or a display device is provided with a higher resolution image (for example, a high-resolution display device typified by 4k×2k pixels (3840 pixels in the horizontal direction and 2160 pixels in the perpendicular direction) or 8k×4k pixels (7680 pixels in the horizontal direction and 4320 pixels in the perpendicular direction)). Furthermore, as another problem, the occupation area of an inverted staggered transistor is larger than that of a planar transistor. Thus, with regard to a planar transistor including an oxide semiconductor film, development of a transistor which has a structure with stable semiconductor characteristics and high reliability and which is formed by a simple manufacturing process is desired.

In view of the foregoing problems, one embodiment of the present invention is to provide a novel semiconductor device including an oxide semiconductor, particularly to provide a planar type semiconductor device including an oxide semiconductor. Furthermore, an object is to provide a semiconductor device including an oxide semiconductor in which on-state current is high, provide a semiconductor device including an oxide semiconductor in which ofd state current is low, provide a semiconductor device including an oxide semiconductor which occupies a small area, provide a semiconductor device including an oxide semiconductor which has stable electrical characteristics, provide a semiconductor device including an oxide semiconductor which has high reliability, provide a novel semiconductor device, or provide a novel display device.

Note that the description of the above object does not disturb the existence of other objects. In one embodiment of the present invention, there is no need to achieve all the objects. Objects other than the above objects will be apparent from and can be derived from the description of the specification and the like.

One embodiment of the present invention is a semiconductor device including a first transistor provided in a driver circuit portion and a second transistor provided in a pixel portion; the first transistor and the second transistor have different structures. Furthermore, the first transistor and the second transistor are transistors having a top-gate structure. In an oxide semiconductor film of each of the transistors, an impurity element is contained in regions which do not overlap with a gate electrode. The regions of the oxide semiconductor film which contain the impurity element function as low-resistance regions. Furthermore, the regions of the oxide semiconductor film which contain the impurity element are in contact with a film containing hydrogen. In addition, conductive films functioning as a source electrode and a drain electrode which are in contact with the regions containing the impurity element through openings in the film containing hydrogen may be provided.

One embodiment of the present invention is a semiconductor device including a first transistor provided in a driver circuit portion and a second transistor and a third transistor provided in a pixel portion; at least the second transistor and the third transistor have different structures. Furthermore, the first transistor, the second transistor, and the third transistor are transistors having a top-gate structure. In an oxide semiconductor film of each of the transistors, an impurity element is contained in regions which do not overlap with a gate electrode. Furthermore, the regions of the oxide semiconductor film which contain the impurity element are in contact with a film containing hydrogen. In addition, conductive films functioning as a source electrode and a drain electrode which are in contact with the regions containing the impurity element through openings in the film containing hydrogen may be provided.

Note that the first transistor provided in the driver circuit portion may include two gate electrodes overlapping with each other with the oxide semiconductor film provided therebetween.

Note that the first transistor provided in the driver circuit portion and the third transistor provided in the pixel portion may each include two gate electrodes overlapping with each other with the oxide semiconductor film provided therebetween.

Furthermore, the first transistor provided in the driver circuit portion may include the oxide semiconductor film in which a first film and a second film are stacked, and the second transistor provided in the pixel portion may include the oxide semiconductor film which differs from the first film in the atomic ratio of metal elements. Furthermore, in the oxide semiconductor film included in the second transistor, the atomic ratio of metal elements may be the same as the atomic ratio of metal elements of the second film included in the oxide semiconductor film of the first transistor.

Furthermore, the third transistor provided in the pixel portion may include the oxide semiconductor film in which a first film and a second film are stacked, and the second transistor provided in the pixel portion may include the oxide semiconductor film which differs from the first film in the atomic ratio of metal elements. Furthermore, in the oxide semiconductor film included in the second transistor, the atomic ratio of metal elements may be the same as the atomic ratio of metal elements of the second film included in the oxide semiconductor film of the third transistor.

Furthermore, the first transistor provided in the driver circuit portion and the third transistor provided in the pixel portion may each include the oxide semiconductor film in which a first film and a second film are stacked, and the first film and the second film may have different atomic ratios of metal elements.

As the impurity element, hydrogen, boron, carbon, nitrogen, fluorine, aluminum, silicon, phosphorus, chlorine, or a rare gas element is given.

When containing hydrogen and at least one of a rare gas element, boron, carbon, nitrogen, fluorine, aluminum, silicon, phosphorus, and chlorine as an impurity element, the oxide semiconductor film has higher conductivity. Thus, when regions containing the impurity element are provided in a region which does not overlap with the gate electrode in the oxide semiconductor film and the regions containing the impurity element are in contact with the source electrode and the drain electrode, the parasitic resistance and parasitic capacitance of the transistor can be reduced, and the transistor having high on-state current is obtained.

One embodiment of the present invention can provide a novel semiconductor device including an oxide semiconductor. In particular, a planar type semiconductor device including an oxide semiconductor can be provided. Alternatively, a semiconductor device including an oxide semiconductor in which on-state current is high can be provided, a semiconductor device including an oxide semiconductor in which off-state current is low can be provided, a semiconductor device including an oxide semiconductor which occupies a small area can be provided, a semiconductor device including an oxide semiconductor which has stable electrical characteristics can be provided, a semiconductor device including an oxide semiconductor which has high reliability can be provided, a novel semiconductor device can be provided, or a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 4A to 4C are cross-sectional views illustrating one embodiment of a method for manufacturing a semiconductor device.

FIGS. 7A and 7B are top views illustrating one embodiment of a semiconductor device.

FIG. 17 is a cross-sectional view illustrating one embodiment of a semiconductor device.

FIGS. 18A to 18C are top views illustrating one embodiment of a semiconductor device.

FIG. 19 is a cross-sectional view illustrating one embodiment of a semiconductor device.

FIGS. 24A and 24B are cross-sectional views illustrating one embodiment of a method for manufacturing a semiconductor device.

FIGS. 25A and 25B are cross-sectional views illustrating one embodiment of a method for manufacturing a semiconductor device.

FIGS. 26A and 26B are cross-sectional views illustrating one embodiment of a method for manufacturing a semiconductor device.

FIGS. 27A and 27B are cross-sectional views illustrating one embodiment of a method for manufacturing a semiconductor device.

FIGS. 28A and 28B show band diagrams of a transistor of one embodiment of the present invention.

FIGS. 31A to 31E are cross-sectional views each illustrating a structure of a transistor.

FIGS. 32A and 32B are cross-sectional views each illustrating a structure of a transistor.

FIGS. 36A and 36B show an initial state and a final state, respectively.

FIGS. 38A and 38B show an initial state and a final state, respectively.

DETAILED DESCRIPTION OF THE INVENTION

Figures 1A, 1B:
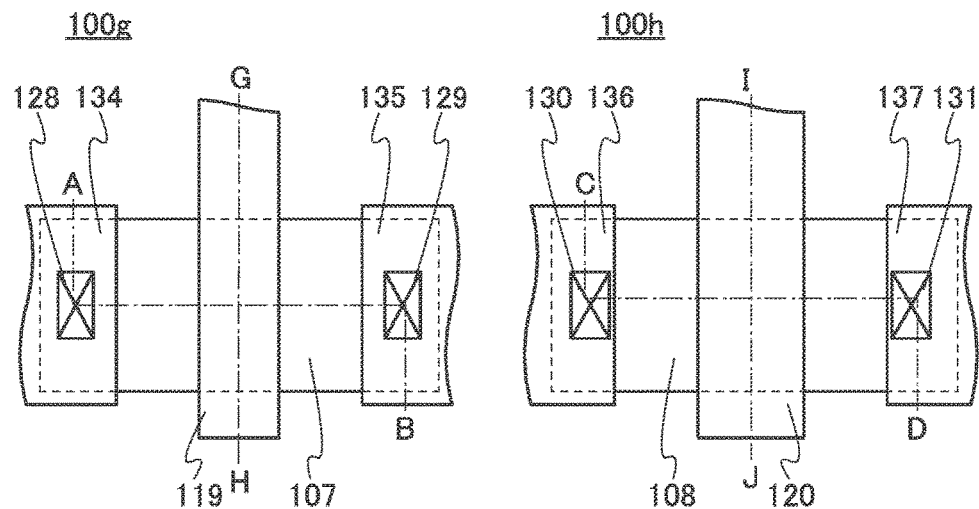
FIGS. 1A and 1B are top views illustrating one embodiment of a semiconductor device.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components.

Note that the term such as "over" or "below" in this specification and the like does not necessarily mean that a component is placed "directly on" or "directly under" another component. For example, the expression "a gate electrode over a gate insulating film" can mean the case where there is an additional component between the gate insulating film and the gate electrode.

In addition, in this specification and the like, the term such as an "electrode" or a "wiring" does not limit a function of a component. For example, an "electrode" is used as part of a "wiring" in some cases, and vice versa. Further, the to m "electrode" or "wiring" can also mean a combination of a plurality of "electrodes" and "wirings" formed in an integrated manner.

Functions of a "source" and a "drain" are sometimes replaced with each other when a transistor of opposite polarity is used or when the direction of flow of current is changed in circuit operation, for example. Therefore, the terms "source" and "drain" can be used to denote the drain and the source, respectively, in this specification and the like.

Note that in this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Embodiment 1

In this embodiment, one embodiment of a semiconductor device and a method for manufacturing the semiconductor device will be described with reference to FIGS. 1A and 1B, FIGS. 2A and 2B, FIGS. 3A and 3B, FIGS. 4A to 4C, FIGS. 5A to 5C, FIGS. 6A and 6B, FIGS. 7A and 7B, FIGS. 8A and 8B, FIGS. 9A and 9B, and FIGS. 10A and 10B.

<Structure 1 of Semiconductor Device>

In FIGS. 1A and 1B and FIGS. 2A and 2B, transistors each having a top-gate structure are shown as examples of transistors included in a semiconductor device. Here, a display device is described as an example of the semiconductor device. Furthermore, structures of transistors provided in a driver circuit portion and a pixel portion of the display device are described. In this embodiment, the transistor provided in the driver circuit portion differs from the transistor provided in the pixel portion in the structure of an oxide semiconductor film.

Figure 2A:
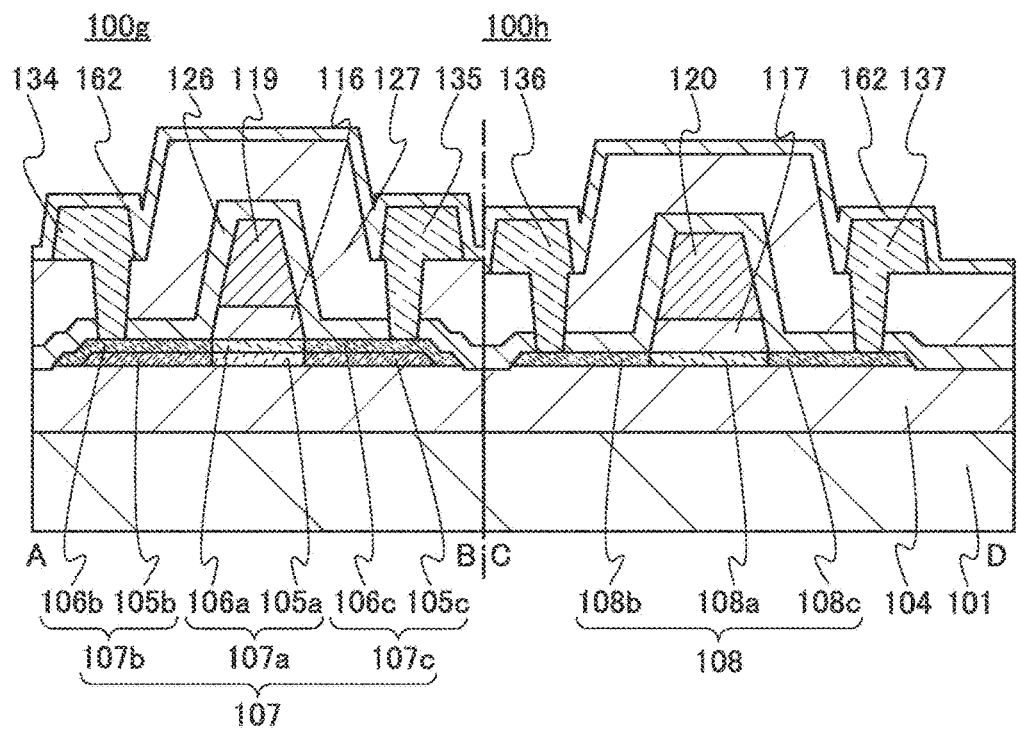
FIGS. 2A and 2B are cross-sectional views illustrating one embodiment of a semiconductor device.
Figure 2B:
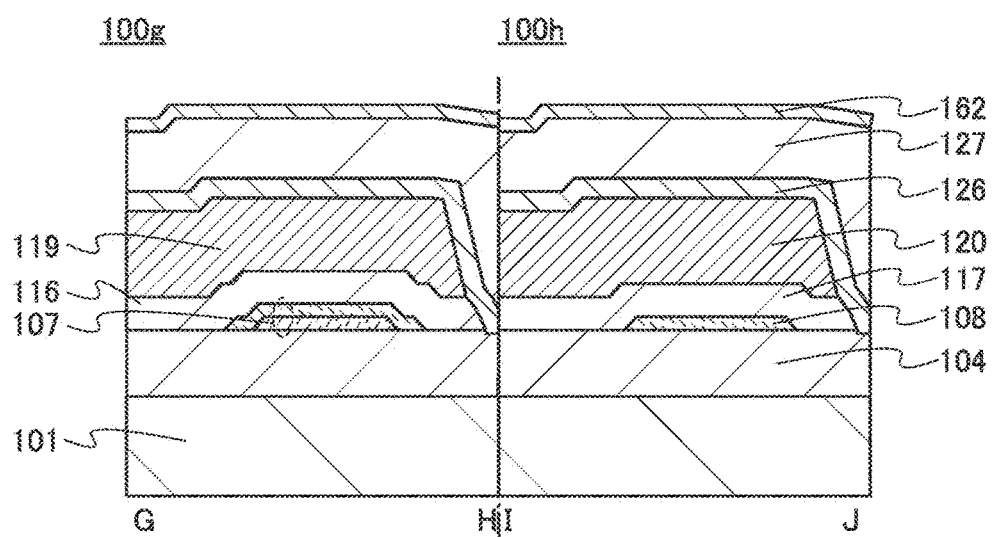

FIGS. 1A and 1B are top views of a transistor 100g provided in a driver circuit portion and a transistor 100h provided in a pixel portion. FIGS. 2A and 2B are cross-sectional views of the transistors 100g and 100h. FIG. 1A is the top view of the transistor 100g, and FIG. 1B is the top view of the transistor 100h. FIG. 2A shows cross-sectional views along the dashed-dotted line A-B in FIG. 1A and the dashed-dotted line C-D in FIG. 1B. FIG. 2B shows cross-sectional views along the dashed-dotted line G-H in FIG. 1A and the dashed-dotted line I-J in FIG. 1B. Note that in FIGS. 1A and 1B, a substrate 101, an insulating film 104, an insulating film 126, an insulating film 127, and the like are not illustrated for simplicity. FIG. 2A shows cross-sectional views of the transistors 100g and 100h in a channel length direction, and FIG. 2B shows cross-sectional views of the transistors 100g and 100h in a channel width direction.

In a manner similar to that of the transistors 100g and 100h, some components are not illustrated in some cases in top views of transistors described below. Furthermore, the direction of the dashed-dotted line A-B and the direction of the dashed-dotted line C-D may be called a channel length direction, and the direction of the dashed-dotted line G-H and the direction of the dashed-dotted line I-J may be called a channel width direction.

The transistor 100g shown in FIGS. 2A and 2B includes a multilayer film 107 over the insulating film 104 formed over the substrate 101; an insulating film 116 in contact with the multilayer film 107; and a conductive film 119 overlapping with the multilayer film 107 with the insulating film 116 provided therebetween. The conductive film 119 functions as a gate electrode. The insulating film 116 functions as a gate insulating film. The multilayer film 107 includes a channel region 107a and low-resistance regions 107b and 107c. The channel region 107a includes a channel region 105a in contact with the insulating film 104 and a channel region 106a in contact with the channel region 105a. The low-resistance region 107b includes a low-resistance region 105b in contact with the insulating film 104 and a low-resistance region 106b in contact with the low-resistance region 105b. The low-resistance region 107c includes a low-resistance region 105c in contact with the insulating film 104 and a low-resistance region 106c in contact with the low-resistance region 105c. Note that although not shown in FIGS. 2A and 2B, an oxide semiconductor film including the channel region 105a, the low-resistance region 105b, and the low-resistance region 105c is referred to as an oxide semiconductor film 105, and an oxide semiconductor film including the channel region 106a, the low-resistance region 106b, and the low-resistance region 106c is referred to as an oxide semiconductor film 106. That is, the multilayer film 107 is a stack including the oxide semiconductor film 105 and the oxide semiconductor film 106.

Note that in a top surface shape, an edge portion of the oxide semiconductor film 106 is positioned outside an edge portion of the oxide semiconductor film 105. That is, the oxide semiconductor film 106 covers a top surface and a side surface of the oxide semiconductor film 105.

In the transistor 100g, the insulating film 126 in contact with the low-resistance regions 107b and 107c is provided. Furthermore, the insulating film 127 may be provided over the insulating film 126. In addition, conductive films 134 and 135 which are in contact with the low-resistance regions 107b and 107c of the multilayer film 107 through openings 128 and 129 in the insulating films 126 and 127 are provided.

The transistor 100h includes an oxide semiconductor film 108 over the insulating film 104 formed over the substrate 101; an insulating film 117 in contact with the oxide semiconductor film 108; and a conductive film 120 overlapping with the oxide semiconductor film 108 with the insulating film 117 provided therebetween.

The conductive film 120 functions as a gate electrode. The insulating film 117 functions as a gate insulating film.

The oxide semiconductor film 108 includes a channel region 108a overlapping with the conductive film 120 and low-resistance regions 108b and 108c between which the channel region 108a is positioned.

In the transistor 100h, the insulating film 126 in contact with the low-resistance regions 108b and 108c is provided. Furthermore, the insulating film 127 may be provided over the insulating film 126. In addition, conductive films 136 and 137 which are in contact with the low-resistance regions 108b and 108c of the oxide semiconductor film 108 through openings 130 and 131 in the insulating films 126 and 127 are provided.

Note that a nitride insulating film 162 is preferably provided to cover the conductive films 134, 135, 136, and 137, The nitride insulating film 162 can prevent diffusion of impurities from the outside.

In the transistors 100g and 100h, the oxide semiconductor film 105 included in the multilayer film 107 and the oxide semiconductor film 108 have different compositions, whereas the oxide semiconductor film 106 included in the multilayer film 107 and the oxide semiconductor film 108 have the same composition. That is, the oxide semiconductor film 105 is formed in a step different from the step of forming the oxide semiconductor film 108, and, in addition, the oxide semiconductor film 106 and the oxide semiconductor film 108 are formed in the same step.

A channel of the transistor 100g is formed in the oxide semiconductor film 105. Accordingly, the oxide semiconductor film 105 has a larger thickness than the oxide semiconductor film 106.

The thickness of the oxide semiconductor film 105 is greater than or equal to 3 nm and less than or equal to 200 nm, greater than or equal to 10 nm and less than or equal to 50 nm, or greater than or equal to 20 nm and less than or equal to 35 nm. The thickness of each of the oxide semiconductor films 106 and 108 is greater than or equal to 3 nm and less than or equal to 200 nm, greater than or equal to 3 nm and less than or equal to 100 nm, greater than or equal to 10 nm and less than or equal to 100 run, or greater than or equal to 30 nm and less than or equal to 50 nm.

The oxide semiconductor films 105, 106, and 108 are each formed using a metal oxide containing at least In, and typically formed using an In—Ga oxide, an In-M-Zn oxide (M is Mg, Al, Ti, Ga, Y, Zr, La, Ce, Nd, or Hf), or the like. The oxide semiconductor film 105 has a higher indium content than the oxide semiconductor film 106; therefore, a buried channel can be formed in the transistor 100g. Thus, variations in the threshold voltage of the transistor 100g can be reduced and channel resistance can be lowered. The details are described in <Band Structure> below.

In the oxide semiconductor film 105, the proportion of n atoms is higher than that of M (M is Mg, Al, Ti, Ga, Y, Zr, La, Ce, Nd, or Hf) atoms. In the case where the oxide semiconductor film 105 contains an 1n-M-Zn oxide (M is Mg, Al, Ti, Ga, Y, Zr, La, Ce, Nd, or HO, and a target having the atomic ratio of the metal elements of In:M:Zn $x_1:y_1:z_1$ is used for forming the oxide semiconductor film 105, $x_1/y_1$ is preferably greater than 1 and less than or equal to 6. Typical examples of the atomic ratio of the metal elements of the target are In:M:Zn=2:1:1.5, In:M:Zn=2:1:23, In:M:Zn=2:1:3, In:M:Zn=3:1:2, In:M:Zn=3:1:3, and In:M:Zn=3:1:4.

In the oxide semiconductor films 106 and 108, the proportion of In atoms is lower than or equal to that of M (M is Mg, Al, Ti, Ga, Y, Zr, La, Ce, Nd, or Hf) atoms. In the case where the oxide semiconductor films 106 and 108 contain an In-M-Zn oxide (M is Mg, Al, Ti, Ga, Y, Zr, La, Ce, Nd, or Hf), and a target having the atomic ratio of the metal elements of In:M:Zn=$x_2$:$y_2$:$z_2$ is used for forming the oxide semiconductor films 106 and 108, $x_2/y_2$ is preferably greater than or equal to 1/6 and less than or equal to 1, and $z_2/y_2$ is preferably greater than or equal to 1/3 and less than or equal to 6, further preferably greater than or equal to 1 and less than or equal to 6. Note that when $z_2/y_2$ is greater than or equal to 1 and less than or equal to 6, c-axis aligned crystalline oxide semiconductor (CAAC-OS) films are easily formed as the oxide semiconductor films 106 and 108. Typical examples of the atomic ratio of the metal elements of the target are In:M:Zn=1:1:1, In:M:Zn=1:1:1.2, In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=In:M:Zn=1:4:8, In:M:Zn=1:5:5, In:M:Zn=1:5:6, In:M:Zn=1:5:7, In:M:Zn=1:5:8, and In:M:Zn=1:6:8.

The transistor 100g has high field-effect mobility because a channel is formed in the oxide semiconductor film 105 in which the proportion of In atoms is higher than that of M (M is Mg, Al, Ti, Ga, Y, Zr, La, Ce, Nd, or HO atoms. Typically, the transistor has a field-effect mobility of greater than 10 $cm^2/V \cdot s$ and less than 60 $cm^2/V \cdot s$, preferably greater than or equal to 15 $cm^2/V \cdot s$ and less than 50 $cm^2 N \cdot s$. However, the off-state current of the transistor is increased due to light irradiation. Therefore, by providing a light-blocking film in the driver circuit portion, a transistor with high field-effect mobility and low off-state current is obtained. Consequently, a driver circuit portion capable of high-speed operation can be formed.

In the transistor 100h, a channel is formed in the oxide semiconductor film in which the proportion of In atoms is lower than or equal to that of M (M is Mg, Al, Ti, Ga, Y, Zr, La, Ce, Nd, or Hf) atoms. Thus, even when the oxide semiconductor film is irradiated with light, the amount of increase in off-state current is small. Therefore, by providing the transistor including the oxide semiconductor film in which the proportion of In atoms is lower than or equal to that of M (M is Mg, Al, Ti, Ga, Y, Zr, La, Ce, Nd, or Hf) atoms in the pixel portion, the pixel portion that hardly deteriorates due to light irradiation and provides high display quality can be obtained.

Furthermore, in the display device, the transistor included in the driver circuit portion and the transistor included in the pixel portion may have different channel lengths.

Typically, the channel length of the transistor 100g included in the driver circuit portion can be less than 2.5 μm, or greater than or equal to 1.45 μm and less than or equal to 2.2 μm. The channel length of the transistor 100h included in the pixel portion can be greater than or equal to 2.5 μm, or greater than or equal to 2.5 μm and less than or equal to 20 μm.

When the channel length of the transistor 100g included in the driver circuit portion is less than 2.5 μm, preferably greater than or equal to 1.45 μm and less than or equal to 2.2 μm, as compared with the transistor 100h included in the pixel portion, the field-effect mobility can be increased, and the amount of on-state current can be increased. Consequently, a driver circuit portion capable of high-speed operation can be formed.

In the multilayer film 107, an element which forms an oxygen vacancy is included in a region which does not overlap with the conductive film 119. In the oxide semiconductor film 108, an element which forms an oxygen vacancy is included in a region which does not overlap with the conductive film 120. Hereinafter, elements which form oxygen vacancies in an oxide semiconductor film by being added thereto are described as impurity elements. Typical examples of impurity elements are hydrogen, boron, carbon, nitrogen, fluorine, aluminum, silicon, phosphorus, chlorine, and rare gas elements. Typical examples of rare gas elements are helium, neon, argon, krypton, and xenon.

The insulating film 126 is a film containing hydrogen, and a nitride insulating film is a typical example thereof. Examples of a nitride insulating film include a silicon nitride film and an aluminum nitride film. The insulating film 126 is in contact with the multilayer film 107 and the oxide semiconductor film 108. Therefore, hydrogen contained in the insulating film 126 is diffused into the multilayer film 107 and the oxide semiconductor film 108. As a result, much hydrogen is contained in a region in contact with the insulating film 126 in the multilayer film 107 and the oxide semiconductor film 108.

When the impurity element is added to the oxide semiconductor, a bond between a metal element and oxygen in the oxide semiconductor is cut, whereby an oxygen vacancy is formed. When hydrogen is added to an oxide semiconductor in which an oxygen vacancy is formed by addition of an impurity element, hydrogen enters an oxygen vacant site and forms a donor level in the vicinity of the conduction band; thus, the conductivity of the oxide semiconductor is increased. Consequently, an oxide conductor can be formed. Accordingly, the oxide conductor has a light-transmitting property. Here, an oxide conductor refers to an oxide semiconductor having become a conductor.

The oxide conductor is a degenerate semiconductor and it is suggested that the conduction band edge equals to or substantially equals to the Fermi level. For that reason, an ohmic contact is made between an oxide conductor film and conductive films functioning as a source electrode and a drain electrode; thus, contact resistance between the oxide conductor film and the conductive films functioning as a source electrode and a drain electrode can be reduced.

In other words, the low-resistance regions 107b, 107c, 108b, and 108c function as source regions and drain regions.

In the case where the conductive films 134, 135, 136, and 137 are formed using a conductive material which is easily bonded to oxygen, such as tungsten, titanium, aluminum, copper, molybdenum, chromium, tantalum, an alloy of any of these, or the like, oxygen contained in the oxide semiconductor films is bonded to the conductive material contained in the conductive films 134, 135, 136, and 137, and an oxygen vacancy is formed in the multilayer film 107 and the oxide semiconductor film 108. Furthermore, in some cases, part of constituent elements of the conductive material that forms the conductive films 134, 135, 136, and 137 is mixed into the multilayer film 107 and the oxide semiconductor film 108. As a result, the low-resistance regions 107b, 107c, 108b, and 108c in contact with the conductive films 134, 135, 136, and 137 have higher conductivity and function as source regions and drain regions.

In the case where the impurity element is a rare gas element and the multilayer film 107 and the oxide semiconductor film 108 are formed by a sputtering method, the low-resistance regions 107b, 107c, 108b, and 108c each contain a rare gas element. In addition, the rare gas element concentrations of the low-resistance regions 107b, 107c, 108b, and 108c are higher than those of the channel regions 107a and 108a. The reasons are as follows: in the case where the multilayer film 107 and the oxide semiconductor film 108 are formed by a sputtering method, a rare gas is used as a sputtering gas, so that the multilayer film 107 and the oxide semiconductor film 108 contain the rare gas; and a rare gas is intentionally added to the low-resistance regions 107b, 107c, 108b, and 108c in order to form oxygen vacancies in the low-resistance regions 107b, 107c, 108b, and 108c. Note that a rare gas element different from that added to the channel regions 107a and 108a may be added to the low-resistance regions 107b, 107c, 108b, and 108c.

Since the low-resistance regions 107b and 107c are in contact with the insulating film 126, the concentration of hydrogen in the low-resistance regions 107b and 107c is higher than the concentration of hydrogen in the channel region 107a. In addition, since the low-resistance regions 108b and 108c are in contact with the insulating film 126, the concentration of hydrogen in the low-resistance regions 108b and 108c is higher than the concentration of hydrogen in the channel region 108a.

In the low-resistance regions 107b, 107c, 108b, and 108c, the concentrations of hydrogen which are measured by secondary ion mass spectrometry (SIMS) can be higher than or equal to $8 \times 10^{19}$ atoms/cm$^3$, higher than or equal to $1 \times 10^{20}$ atoms/cm$^3$, or higher than or equal to $5 \times 10^{20}$ atoms/cm$^3$. Note that in the channel regions 107a and 108a, the concentrations of hydrogen which are measured by SIMS can be lower than or equal to $5 \times 10^{19}$ atoms/cm$^3$, lower than or equal to $1 \times 10^{19}$ atoms/cm$^3$, lower than or equal to $5 \times 10^{18}$ atoms/cm$^3$, lower than or equal to $1 \times 10^{18}$ atoms/cm$^3$, lower than or equal to $5 \times 10^{17}$ atoms/cm$^3$, or lower than or equal to $1 \times 10^{16}$ atoms/cm$^3$.

The low-resistance regions 107b, 107c, 108b, and 108c have higher hydrogen concentrations than the channel regions 107a and 108a and have more oxygen vacancies than the channel regions 107a and 108a because of addition of rare gas elements. Therefore, the low-resistance regions 107b, 107c, 108b, and 108c have higher conductivity and function as source regions and drain regions. The resistivity of the low-resistance regions 107b, 107c, 108b, and 108c can be typically greater than or equal to $1 \times 10^{-3}$ Ωcm and less than $1 \times 10^4$ Ωcm, or greater than or equal to $1 \times 10^{-3}$ Ωcm and less than $1 \times 10^{-1}$ Ωcm.

Note that in the low-resistance regions 107b, 107c, 108b, and 108c, when the amount of hydrogen is smaller than or equal to the amount of oxygen vacancy, hydrogen is easily captured by the oxygen vacancy and is not easily diffused into the channel regions 107a and 108a. As a result, normally-off transistors can be manufactured.

Furthermore, in the case where the amount of oxygen vacancy is larger than the amount of hydrogen in the low-resistance regions 107b, 107c, 108b, and 108c, the carrier density of the low-resistance regions 107b, 107c, 108b, and 108c can be controlled by controlling the amount of hydrogen. Alternatively, in the case where the amount of hydrogen is larger than the amount of oxygen vacancy in the low-resistance regions 107b, 107c, 108b, and 108e, the carrier density of the low-resistance regions 107b, 107c, 108b, and 108c can be controlled by controlling the amount of oxygen vacancy. Note that when the carrier density of the low-resistance regions 107b, 107c, 108b, and 108c is greater than or equal to $5 \times 10^{18}$/cm$^3$, greater than or equal to $1 \times 10^{19}$/cm$^3$, or greater than or equal to $1 \times 10^{20}$/cm$^3$, in the transistors, the resistance between the channel region 107a and the conductive films 134 and 135 functioning as source and drain electrodes and between the channel region 108a and the conductive films 136 and 137 functioning as source and drain electrodes is small and high on-state current can be obtained.

In the transistors 100g and 100h described in this embodiment, the low-resistance regions 107b and 107c are provided between the channel region 107a and the conductive films 134 and 135 functioning as source and drain electrodes, and the low-resistance regions 108b and 108c are provided between the channel region 108a and the conductive turns 136 and 137 functioning as source and drain electrodes; therefore, the transistors have small parasitic resistance.

Furthermore, in the transistor 100g, the conductive film 119 does not overlap with the conductive films 134 and 135; therefore, parasitic capacitance between the conductive film 119 and each of the conductive films 134 and 135 can be reduced. In the transistor 100h, the conductive film 120 does not overlap with the conductive films 136 and 137; therefore, parasitic capacitance between the conductive film 120 and each of the conductive films 136 and 137 can be reduced. As a result, in the case where a large-area substrate is used as the substrate 101, signal delay in the conductive films 119, 120, 134, 135, 136, and 137 can be reduced.

Consequently, the transistors 100g and 100h have high on-state current and high field-effect mobility.

In the transistor 100g, the impurity element is added to the multilayer film 107 using the conductive film 119 as a mask. In the transistor 100h, the impurity element is added to the oxide semiconductor film 108 using the conductive film 120 as a mask. That is, the low-resistance regions can be formed in a self-aligned manner.

The transistor 100g in the driver circuit portion has high on-state current and high field-effect mobility. Therefore, a display device in which the area occupied by a driver circuit portion is small can be manufactured.

By using the transistor with high field-effect mobility, a demultiplexer circuit can be formed in a signal line driver circuit which is an example of the driver circuit portion. A demultiplexer circuit distributes one input signal to a plurality of outputs; thus, using the demultiplexer circuit can reduce the number of input terminals for input signals. For example, when one pixel includes a red sub-pixel, a green sub-pixel, and a blue sub-pixel and a demultiplexer circuit corresponding to each pixel is provided, an input signal can be distributed by the demultiplexer circuit to be input to each sub-pixel. Consequently, the number of input terminals can be reduced to ⅓.

The transistor 100h having high on-state current is provided in the pixel portion; thus, signal delay in wirings can be reduced and display unevenness can be suppressed even in a large-sized display device or a high-resolution display device in which the number of wirings is increased.

As described above, when a driver circuit portion is formed using a transistor capable of high-speed operation and a pixel portion is formed using a transistor with small parasitic capacitance and small parasitic resistance, a high-resolution display device capable of double-frame rate driving can be manufactured.

The structure shown in FIGS. 1A and 1B is described in detail below.

As the substrate 101, any of a variety of substrates can be used without particular limitation. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate are a barium borosilicate glass substrate, an aluminoborosilicate glass substrate, and a soda lime glass substrate. Examples of a flexible substrate, an attachment film, a base material film, or the like are as follows: plastic typified by polyethylene terephthalate (PET), polyethylene naphthalate (PEN), and polyether sulfone (PES); a synthetic resin such as acrylic; polypropylene; polyvinyl fluoride; polyvinyl chloride; polyester; polyamide; polyimide; aramid; epoxy; an inorganic vapor deposition film; and paper. Specifically, when a transistor is formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

A flexible substrate may be used as the substrate 101, and the transistors may be provided directly on the flexible substrate. Alternatively, a separation layer may be provided between the substrate 101 and each of the transistors. The separation layer can be used when part or the whole of a semiconductor device formed over the separation layer is separated from the substrate 101 and transferred onto another substrate. In such a case, the transistors can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistors are transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, a transistor with excellent properties or a transistor with low power consumption can be formed, a device with high durability or high heat resistance can be provided, or reduction in weight or thickness can be achieved.

The insulating film 104 can be formed with a single layer or stacked layers using an oxide insulating film or a nitride insulating film. Note that at least regions of the insulating film 104 which are in contact with the multilayer film 107 and the oxide semiconductor film 108 are preferably formed using an oxide insulating film, in order to improve characteristics of the interface with the multilayer film 107 and the oxide semiconductor film 108. When the insulating film 104 is formed using an oxide insulating film from which oxygen is released by heating, oxygen contained in the insulating film 104 can be moved to the multilayer film 107 and the oxide semiconductor film 108 by heat treatment. A region of the insulating film 104 which is in contact with the substrate 101 is preferably forming using a nitride insulating film, in which case elements contained in the substrate 101 can be prevented from moving to the multilayer film 107 and the oxide semiconductor film 108.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and the interface state density at the interface between the insulating film 104 and each of the multilayer film 107 and the oxide semiconductor film 108 and oxygen vacancies contained in the channel region 107a in the multilayer film 107 and the channel region 108a in the oxide semiconductor film 108 can be reduced.

The insulating film 104 may be formed with a single layer or stacked layers using one or more of silicon oxide, silicon oxynitride, silicon nitride oxide, silicon nitride, aluminum oxide, hafnium oxide, gallium oxide, a Ga—Zn oxide, and the like.

Here, the insulating film 104 is formed by stacking insulating films 104a and 104b. When a nitride insulating film is used as the insulating film 104a, diffusion of elements contained in the substrate 101 can be prevented. When an oxide insulating film is used as the insulating film 104b, the interface state density at the interface between the insulating film 104 and each of the multilayer film 107 and the oxide semiconductor film 108 can be reduced, for example.

When silicon or carbon that is one of elements belonging to Group 14 is contained in the multilayer film 107 and the oxide semiconductor film 108, oxygen vacancies are increased in the multilayer film 107 and the oxide semiconductor film 108, and the multilayer film 107 and the oxide semiconductor film 108 become n-type films. Thus, the concentrations of silicon or carbon (the concentration measured by SIMS) in the multilayer film 107 and the oxide semiconductor film 108, in particular, the channel regions 107a and 108a, can be set to lower than or equal to $2\times10^{18}$ atoms/cm$^3$, or lower than or equal to $2\times10^{17}$ atoms/cm$^3$. As a result, the transistors each have positive threshold voltage (normally-off characteristics).

Furthermore, the concentrations of alkali metal or alkaline earth metal which are measured by SIMS in the multilayer film 107 and the oxide semiconductor film 108, in particular, the channel regions 107a and 108a, can be lower than or equal to $1\times10^{18}$ atoms/cm$^3$, or lower than or equal to $2\times10^{16}$ atoms/cm$^3$. Alkali metal and alkaline earth metal might generate carriers when bonded to an oxide semiconductor, in which case the off-state current of the transistors might be increased. Therefore, it is preferable to reduce the concentrations of alkali metal or alkaline earth metal in the channel regions 107a and 108a. As a result, the transistors each have positive threshold voltage (normally-off characteristics).

Furthermore, when nitrogen is contained in the multilayer film 107 and the oxide semiconductor film 108, in particular, the channel regions 107a and 108a, electrons serving as carriers are generated, carrier density is increased, and the multilayer film 107 and the oxide semiconductor film 108 become n-type films in some cases. Thus, a transistor including an oxide semiconductor film which contains nitrogen is likely to have normally-on characteristics. Therefore, nitrogen is preferably reduced as much as possible in the oxide semiconductor films, in particular, the channel regions 107a and 108a. The concentrations of nitrogen which are measured by SIMS can be set to, for example, lower than or equal to $5\times10^{18}$ atoms/cm$^3$.

By reducing the impurity elements in the multilayer film 107 and the oxide semiconductor film 108, in particular, the channel regions 107a and 108a, the carrier density of the oxide semiconductor films can be lowered. In the multilayer film 107 and the oxide semiconductor film 108, in particular, the channel regions 107a and 108a, carrier density can be set to $1\times10^{17}$/cm$^3$ or less, $1\times10^{15}$/cm$^3$ or less, $1\times10^{13}$/cm$^3$ or less, $8\times10^{11}$/cm$^3$ or less, or $1\times10^{11}$/cm$^3$ or less, preferably less than $1\times10^{10}$/cm$^3$, and $1\times10^{-9}$/cm$^3$ or more.

Oxide semiconductor films each having a low impurity concentration and a low density of defect states can be used for the multilayer film 107 and the oxide semiconductor film 108, in which case the transistors can have more excellent electrical characteristics. Here, the state in which impurity concentration is low and density of defect states is low (the amount of oxygen vacancy is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has low density of trap states in some cases. Furthermore, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

The oxide semiconductor films 105 and 106 included in the multilayer film 107 and the oxide semiconductor film 108 may each have a non-single-crystal structure, for example. The non-single-crystal structure includes a CAAC-OS which is described later, a polycrystalline structure, a microcrystalline structure which is described later, or an amorphous structure, for example. Among the non-single crystal structure, the amorphous structure has the highest density of defect states, whereas CAAC-OS has the lowest density of defect states.

Note that the oxide semiconductor films 105 and 106 included in the multilayer film 107 and the oxide semiconductor film 108 may be mixed films including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure of two or more of a region having an amorphous structure, a region having a microcrystalline structure, a region having a polycrystalline structure, a CAAC-OS region, and a region having a single-crystal structure in some cases.

Note that in the multilayer film 107, the channel region 107a and the low-resistance regions 107b and 107c might differ in crystallinity. In the oxide semiconductor film 108, the channel region 108a and the low-resistance regions 108b and 108c might differ in crystallinity. These cases are due to damage to the low-resistance regions 107b, 107c, 108b and 108c, which lowers their crystallinity, when the impurity element is added to the low-resistance regions 107b, 107c, 108b, and 108c.

The insulating films 116 and 117 can be formed with a single layer or stacked layers using an oxide insulating film or a nitride insulating film. Note that at least regions of the insulating films 116 and 117 which are in contact with the multilayer film 107 and the oxide semiconductor film 108, respectively, are preferably formed using an oxide insulating film, in order to improve characteristics of the interface with the multilayer film 107 and the oxide semiconductor film 108. The insulating films 116 and 117 may be formed with a single layer or stacked layers using one or more of silicon oxide, silicon oxynitride, silicon nitride oxide, silicon nitride, aluminum oxide, hafnium oxide, gallium oxide, a Ga—Zn oxide, and the like.

Furthermore, it is possible to prevent outward diffusion of oxygen from the multilayer film 107 and the oxide semiconductor film 108 and entry of hydrogen, water, or the like into the multilayer film 107 and the oxide semiconductor film 108 from the outside by providing an insulating film having a blocking effect against oxygen, hydrogen, water, and the like as each of the insulating films 116 and 117. As the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The insulating films 116 and 117 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistors can be reduced.

When the insulating films 116 and 117 are formed using an oxide insulating film from which oxygen is released by heating, oxygen contained in the insulating films 116 and 117 can be moved to the multilayer film 107 and the oxide semiconductor film 108, respectively, by heat treatment.

The thickness of each of the insulating films 116 and 117 can be greater than or equal to 5 nm and less than or equal to 400 nm, greater than or equal to 5 nm and less than or equal to 300 nm, or greater than or equal to 10 nm and less than or equal to 250 nm.

The conductive films 119 and 120 can be formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Furthermore, one or more metal elements selected from manganese and zirconium may be used. Furthermore, the conductive films 119 and 120 may have a single-layer structure or a stacked-layer structure including two or more layers. For example, any of the following can be used: a single-layer structure of an aluminum film containing silicon; a single-layer structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Furthermore, an alloy film or a nitride film which contains aluminum and one or more elements selected from titanium, tantalum, tungsten, molybdenum, chromium, neodymium, and scandium may be used.

Alternatively, the conductive films 119 and 120 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide including silicon oxide. It is also possible to have a stacked-layer structure formed using the above light-transmitting conductive material and the above metal element.

The thickness of each of the conductive films 119 and 120 can be greater than or equal to 30 μm and less than or equal to 500 nm, or greater than or equal to 100 nm and less than or equal to 400 nm.

The conductive films 134, 135, 136, and 137 function as source electrodes and drain electrodes. The conductive films 134, 135, 136, and 137 can be formed using any of the materials and structures for the conductive films 119 and 120, as appropriate.

The insulating film 127 can be formed with a single layer or stacked layers using an oxide insulating film or a nitride insulating film. When the insulating film 127 is formed using an oxide insulating film from which oxygen is released by heating, oxygen contained in the insulating film 127 can be moved to the multilayer film 107 and the oxide semiconductor film 108 by heat treatment.

The insulating film 127 may be formed with a single layer or stacked layers using one or more of silicon oxide, silicon oxynitride, silicon nitride oxide, silicon nitride, aluminum oxide, hafnium oxide, gallium oxide, a Ga—Zn oxide, and the like.

The thickness of the insulating film 127 can be greater than or equal to 30 nm and less than or equal to 500 nm, or greater than or equal to 100 nm and less than or equal to 400 nm.

<Structure 2 of Semiconductor Device>

Figure 3A:
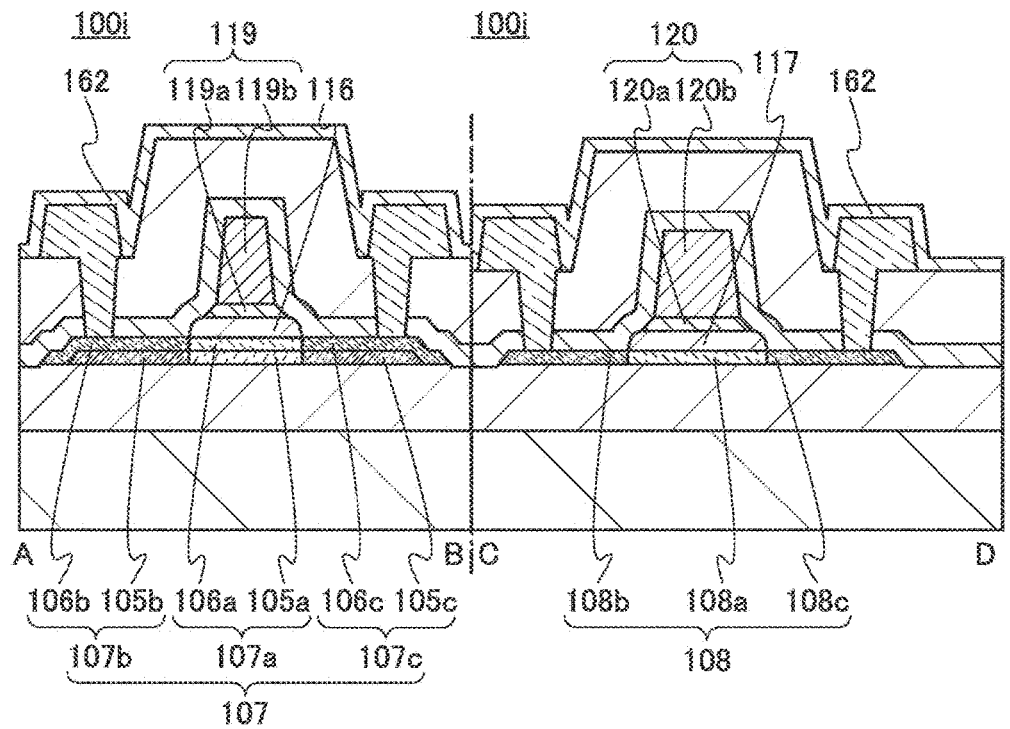
FIGS. 3A and 3B are cross-sectional views illustrating one embodiment of a semiconductor device.
Figure 3B:
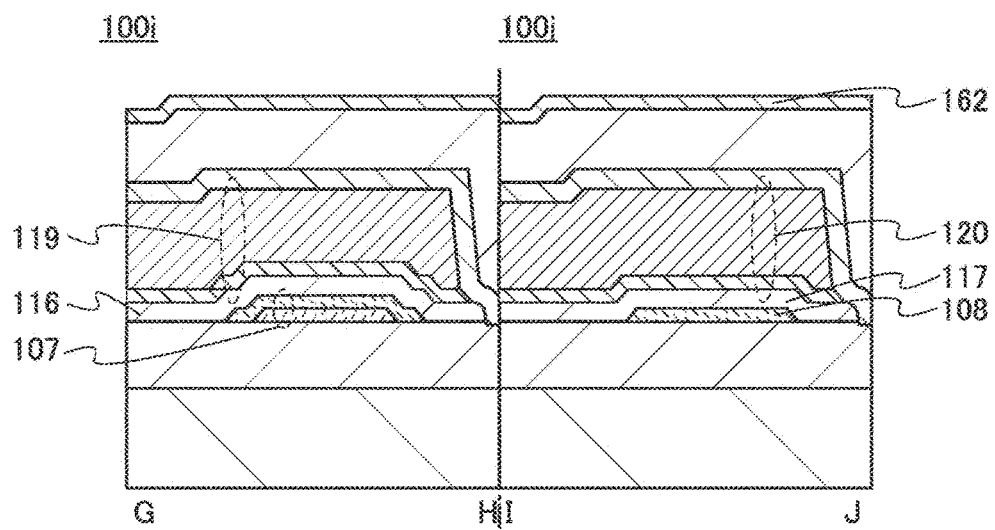

Next, another structure of the semiconductor device is described with reference to FIGS. 3A and 3B. Here, in a transistor 100i formed in a driver circuit portion and a transistor 100j formed in a pixel portion, the conductive films 119 and 120 functioning as gate electrodes each have a stacked-layer structure. FIG. 3A shows cross-sectional views of the transistors 100i and 100j in the channel length direction, and FIG. 3B shows cross-sectional views of the transistors 100i and 100j in the channel width direction.

The conductive film 119 includes a conductive film 119a in contact with the insulating film 116 and a conductive film 119b in contact with the conductive film 119a. The end portion of the conductive film 119a is positioned on an outer side than the end portion of the conductive film 119b. In other words, the conductive film 119a has such a shape that the end portion extends beyond the end portion of the conductive film 119b.

The end portion of the insulating film 116 is positioned on an outer side than the end portion of the conductive film 119a. In other words, the insulating film 116 has such a shape that the end portion extends beyond the end portion of the conductive film 119a. Furthermore, a side surface of the insulating film 116 may be curved.

The conductive film 120 includes a conductive film 120a in contact with the insulating film 117 and a conductive film 120b in contact with the conductive film 120a. The end portion of the conductive film 120a is positioned on an outer side than the end portion of the conductive film 120b. In other words, the conductive film 120a has such a shape that the end portion extends beyond the end portion of the conductive film 120b.

The end portion of the insulating film 117 is positioned on an outer side than the end portion of the conductive film 120a. In other words, the insulating film 117 has such a shape that the end portion extends beyond the end portion of the conductive film 120a. Furthermore, a side surface of the insulating film 117 may be curved.

The conductive films 119a and 120a can be formed using titanium, tantalum, molybdenum, tungsten, an alloy of any of these, titanium nitride, tantalum nitride, molybdenum nitride, tungsten nitride, or the like. Alternatively, the conductive films 119a and 120a can be formed using a Cu—X alloy (X is Mn, Ni, Cr, Fe, Co, Mo, Ta, or Ti) or the like.

The conductive films 119b and 120b are formed using a low-resistance material. The conductive films 119b and 120b can be formed using copper, aluminum, gold, silver, tungsten, or the like, an alloy containing any of these, a compound containing any of these as a main component, or the like.

In the case where the Cu—X alloy (X is Mn, Ni, Cr, Fe, Co, Mo, Ta, or Ti) is used for the conductive films 119a and 120a, in a region of each of the conductive films 119a and 120a which is in contact with an insulating film, a covering film is formed by heat treatment in some cases. The covering film includes a compound containing X. Examples of the compound containing X include an oxide of X and a nitride of X. When the covering film is formed on surfaces of the conductive films 119a and 120a, the covering film functions as a blocking film, and Cu in the Cu—X alloy film can be prevented from entering the oxide semiconductor films.

Note that when the concentrations of copper in the channel regions in the multilayer film 107 and the oxide semiconductor film 108 are lower than or equal to $1 \times 10^{18}$ atoms/cm$^3$, electron trap state density at the interface between the multilayer film 107 and the insulating film 116 functioning as a gate insulating film and the interface between the oxide semiconductor film 108 and the insulating film 117 functioning as a gate insulating film can be reduced. As a result, transistors each having an excellent subthreshold swing value (S value) can be manufactured.

When the conductive films 119 and 120 and the insulating films 116 and 117 having the shapes shown in FIGS. 3A and 3B are provided in the transistors 100i and 100j, the electric field of the drain region of each of the transistors can be relaxed. Thus, deterioration of the transistor due to the electric field of the drain region, such as a shift of the threshold voltage of the transistor, can be inhibited.

<Structure 3 of Semiconductor Device>

Figure 8A:
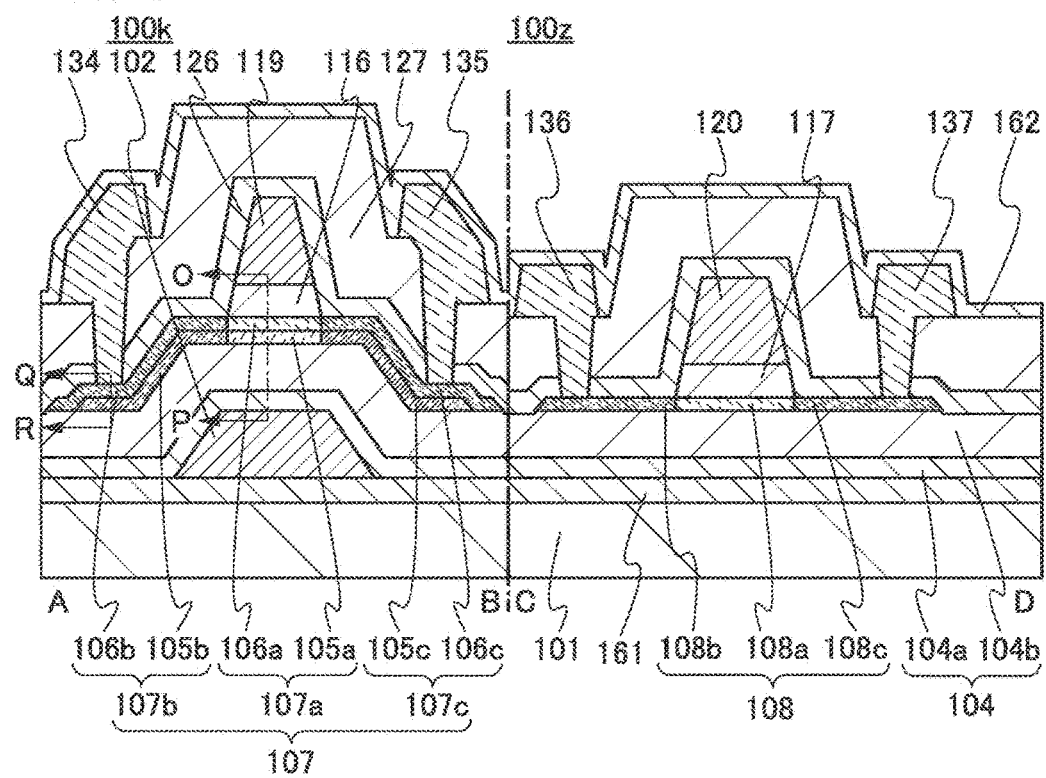
FIGS. 8A and 8B are cross-sectional views illustrating one embodiment of a semiconductor device.
Figure 8B:
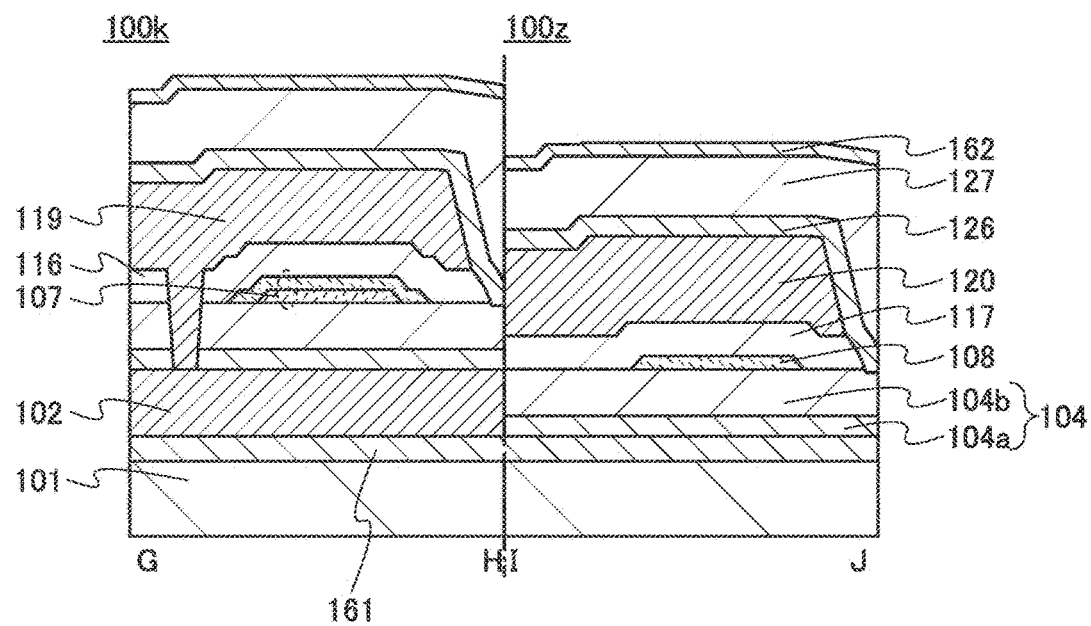

Next, another structure of the semiconductor device is described with reference to FIGS. 7A and 7B and FIGS. 8A and 8B. Here, a transistor 100k formed in a driver circuit portion has a dual-gate structure. FIG. 7A is the top view of the transistor 100k, and FIG. 7B is the top view of the transistor 100z. FIG. 8A shows cross-sectional views along the dashed-dotted line A-B in FIG. 7A and the dashed-dotted line C-D in FIG. 7B. FIG. 8B shows cross-sectional views along the dashed-dotted line G-H in FIG. 7A and the dashed-dotted line I-J in FIG. 7B.

The transistor 100k shown in FIGS. 8A and 8B includes a conductive film 102 over the substrate 101, the insulating film 104 over the substrate 101 and the conductive film 102, the multilayer film 107 over the insulating film 104, the insulating film 116 in contact with the multilayer film 107, and the conductive film 119 overlapping with the multilayer film 107 with the insulating film 116 provided therebetween. The structure of the multilayer film 107 is similar to that of the multilayer film 107 described in <Structure 1 of semiconductor device> and therefore is not described in detail here.

The conductive films 102 and 119 function as gate electrodes. That is, the transistor 100k is a transistor having a dual-gate structure. The insulating films 104 and 116 function as gate insulating films.

Note that, although not shown, the conductive film 102 may overlap with an entire region of the multilayer film 107.

A nitride insulating film 161 is preferably provided over the substrate 101. Examples of the nitride insulating film 161 include a silicon nitride film and an aluminum nitride film. Covering the conductive film 102 with the nitride insulating film 161 and the insulating film 104a makes it possible to prevent diffusion of metal elements contained in the conductive film 102.

In the transistor 100k, different potentials are supplied to the conductive film 102 and the conductive film 119 which are not connected to each other; thus, the threshold voltage of the transistor 100k can be controlled. Alternatively, as shown in FIG. 8B, by supplying the same potential to the conductive film 102 and the conductive film 119 which are connected to each other, variations in the initial characteristics can be reduced, and degradation of the transistor due to the −GBT (negative gate bias-temperature) stress test and a change in the rising voltage of the on-state current at different drain voltages can be suppressed. Furthermore, when the conductive film 102 and the conductive film 119 are connected to each other as shown in FIG. 8B, electric fields of the conductive films 102 and 119 affect a top surface and a side surface of the multilayer film 107, so that carriers flow in the entire multilayer film 107. In other words, a region where carriers flow becomes larger in the film thickness direction, so that the amount of carrier movement is increased. As a result, the on-state current and field-effect mobility of the transistor 100k are increased. When the channel length of the transistor is less than 2.5 μm, preferably greater than or equal to 1.45 μm and less than or equal to 2.2 μm, the on-state current can be further increased and the field-effect mobility can be increased. Owing to the high on-state current, the transistor 100k can have a small plane area. Consequently, a display device with a narrow bezel in which the area occupied by a driver circuit portion is small can be manufactured.

The transistor 100z can have a structure similar to that of the transistor 100h described in <Structure 1 of semiconductor device> and therefore is not described in detail here.

In the display device described in this embodiment, the transistor in the driver circuit portion and the transistor in the pixel portion have different structures. The transistor included in the driver circuit portion has a dual-gate structure. That is, the field-effect mobility of the transistor included in the driver circuit portion is higher than that of the transistor included in the pixel portion. Consequently, a driver circuit portion capable of high-speed operation can be formed. Furthermore, when a driver circuit portion is formed using a transistor capable of high-speed operation and a pixel portion is formed using a transistor with small parasitic capacitance and small parasitic resistance, a high-resolution display device capable of double-frame rate driving can be manufactured.

<Structure 4 of Semiconductor Device>

Figure 9A:
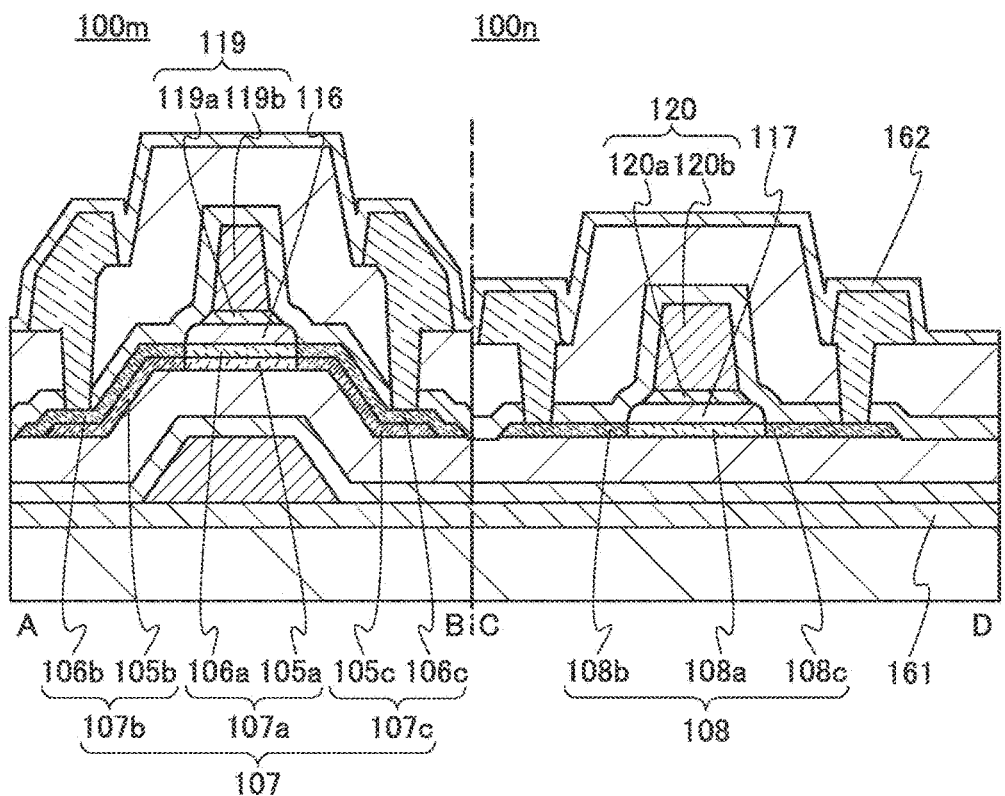
FIGS. 9A and 9B are cross-sectional views illustrating one embodiment of a semiconductor device.

Next, another structure of the semiconductor device is described with reference to FIGS. 9A and 9B, Here, in a transistor 100m formed in a driver circuit portion and a transistor 100n formed in a pixel portion, the conductive films 119 and 120 functioning as gate electrodes each have a stacked-layer structure. FIG. 9A shows cross-sectional views of the transistors 100m and 100n in the channel length direction, and FIG. 9B shows cross-sectional views of the transistors 100m and 100n in the channel width direction.

The conductive films 119 and 120 have stacked-layer structures similar to those of the conductive films 119 and 120 described in <Structure 2 of semiconductor device> in this embodiment.

The insulating films 116 and 117 have structures similar to those of the insulating films 116 and 117 described in <Structure 2 of semiconductor device> in this embodiment.

Figure 9B:
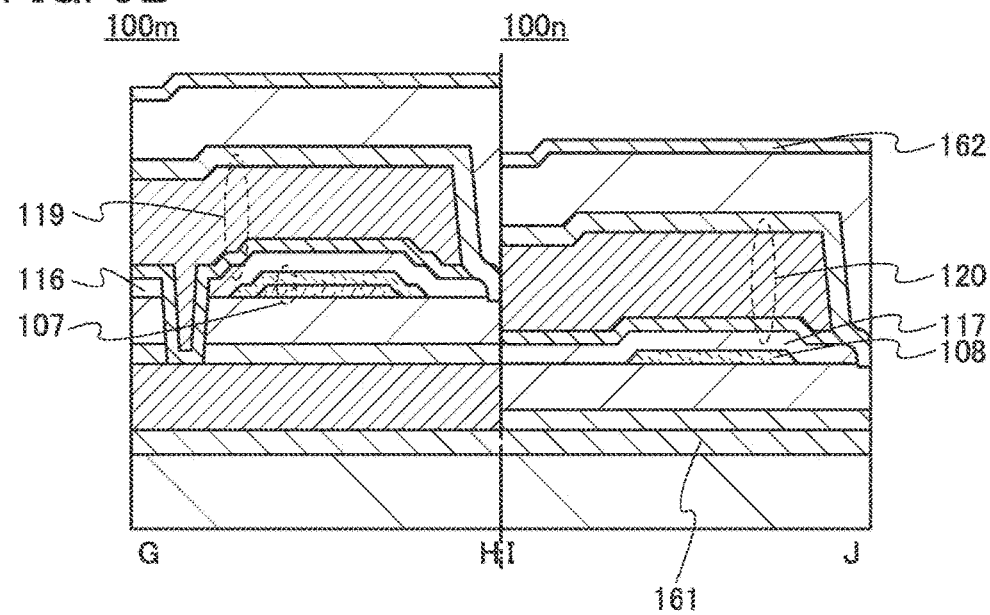

When the conductive films 119 and 120 and the insulating films 116 and 117 having the shapes shown in FIGS. 9A and 9B are provided in the transistors 100m and 100n, the electric field of the drain region of each of the transistors can be relaxed. Thus, deterioration of the transistor due to the electric field of the drain region, such as a shift of the threshold voltage of the transistor, can be inhibited.

<Structure 5 of Semiconductor Device>

Figure 10A:
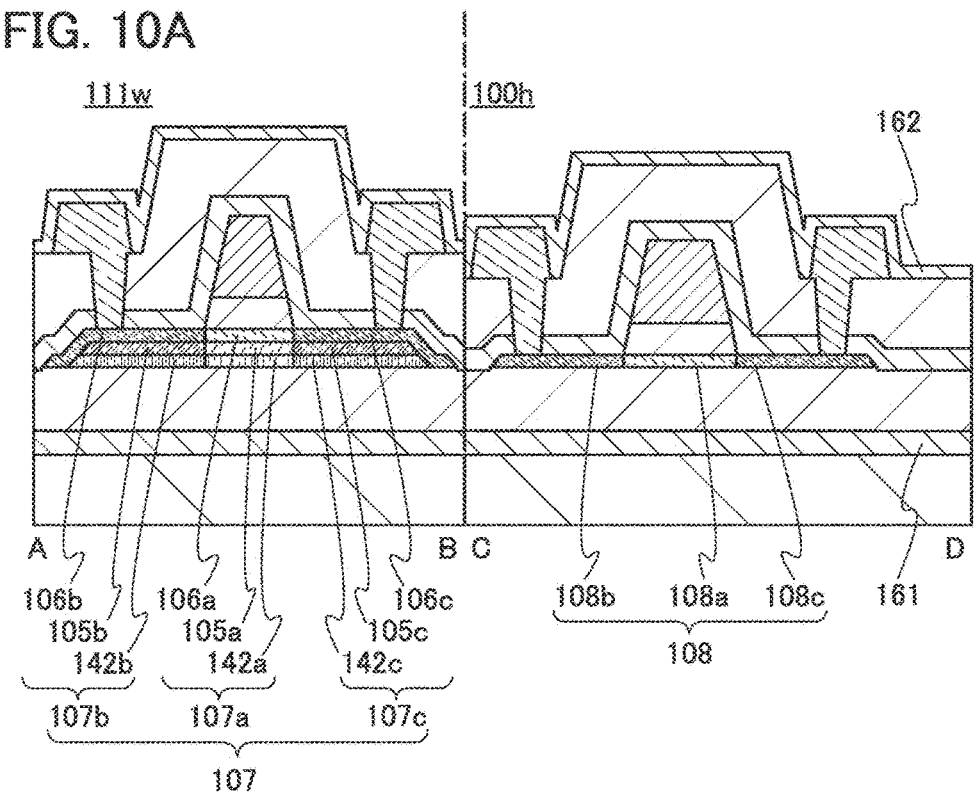
FIGS. 10A and 10B are cross-sectional views each illustrating one embodiment of a semiconductor device.

Next, another structure of the semiconductor device is described with reference to FIGS. 10A and 10B. Here, transistors 111w and 111x formed in a driver circuit portion and a transistor 111y formed in a pixel portion each include a multilayer film. FIG. 10A shows cross-sectional views of the transistors 111w and 100h in the channel length direction, and FIG. 10B shows cross-sectional views of the transistors 111x and 111y in the channel length direction.

The multilayer film 107 included in the transistor 111w in FIG. 10A includes the channel region 107a and the low-resistance regions 107b and 107c. The channel region 107a includes a channel region 142a in contact with the insulating film 104, the channel region 105a in contact with the channel region 142a, and the channel region 106a in contact with the channel region 105a. The low-resistance region 107b includes a low-resistance region 142b in contact with the insulating film 104, the low-resistance region 105b in contact with the low-resistance region 142b, and the low-resistance region 106b in contact with the low-resistance region 105b. The low-resistance region 107c includes a low-resistance region 142c in contact with the insulating film 104, the low-resistance region 105c in contact with the low-resistance region 142c, and the low-resistance region 106c in contact with the low-resistance region 105c. Note that although not shown in FIGS. 10A and 10B, an oxide semiconductor film including the channel region 142a, the low-resistance region 142b, and the low-resistance region 142c is referred to as an oxide semiconductor film 142. That is, in the multilayer film 107, the oxide semiconductor film 142, the oxide semiconductor film 105, and the oxide semiconductor film 106 are stacked in this order.

Figure 10B:
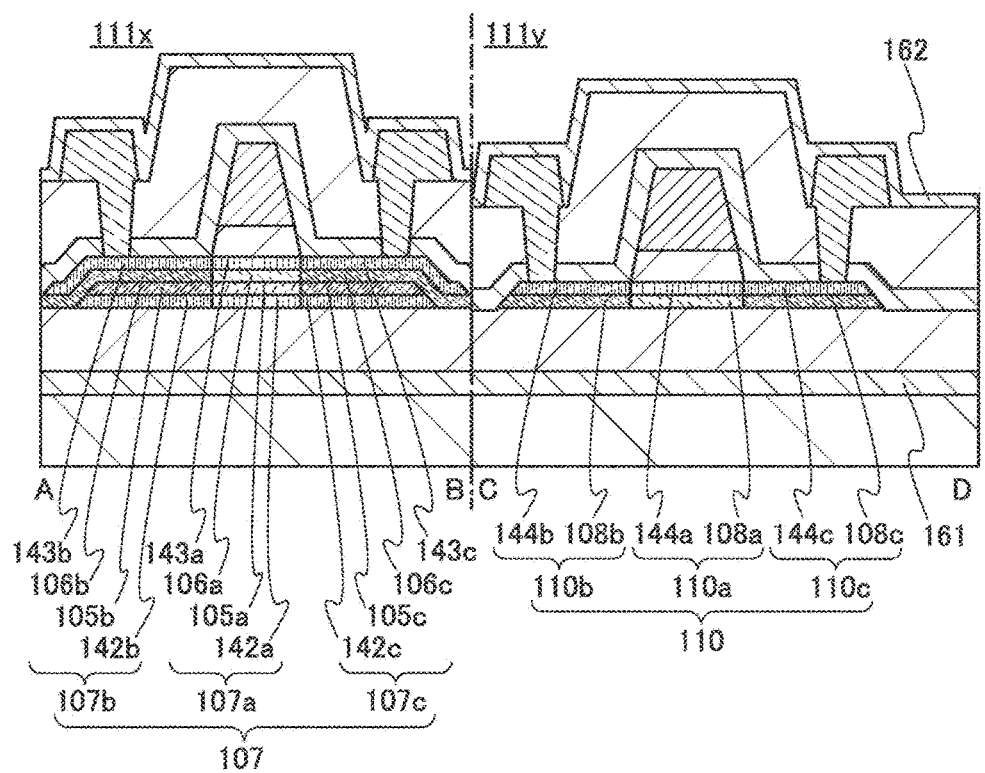

The multilayer film 107 included in the transistor 111x in FIG. 10B includes the channel region 107a and the low-resistance regions 107b and 107c. The channel region 107a includes the channel region 142a in contact with the insulating film 104, the channel region 105a in contact with the channel region 142a, the channel region 106a in contact with the channel region 105a, and a channel region 143a in contact with the channel region 106a. The low-resistance region 107b includes the low-resistance region 142b in contact with the insulating film 104, the low-resistance region 105b in contact with the low-resistance region 142b, the low-resistance region 106b in contact with the low-resistance region 105b, and a low-resistance region 143b in contact with the low-resistance region 106b. The low-resistance region 107c includes the low-resistance region 142c in contact with the insulating film 104, the low-resistance region 105c in contact with the low-resistance region 142c, the low-resistance region 106c in contact with the low-resistance region 105c, and a low-resistance region 143c in contact with the low-resistance region 106c. Note that although not shown in FIGS. 10A and 10B, an oxide semiconductor film including the channel region 143a, the low-resistance region 143b, and the low-resistance region 143c is referred to as an oxide semiconductor film 143. That is, in the multilayer film 107, the oxide semiconductor film 142, the oxide semiconductor film 105, the oxide semiconductor film 106, and the oxide semiconductor film 143 are stacked in this order.

A multilayer film 110 included in the transistor 111y in FIG. 10B includes a channel region 110a and low-resistance regions 110b and 110c. The channel region 110a includes the channel region 108a in contact with the insulating film 104 and a channel region 144a in contact with the channel region 108a. The low-resistance region 110b includes the low-resistance region 108b in contact with the insulating film 104 and a low-resistance region 144b in contact with the low-resistance region 108b. The low-resistance region 110c includes the low-resistance region 108c in contact with the insulating film 104 and a low-resistance region 144c in contact with the low-resistance region 108c. Note that although not shown in FIGS. 10A and 10B, an oxide semiconductor film including the channel region 144a, the low-resistance region 144b, and the low-resistance region 144c is referred to as an oxide semiconductor film 144. That is, in the multilayer film 110, the oxide semiconductor film 108 and the oxide semiconductor film 144 are stacked in this order.

The oxide semiconductor films 142, 143, and 144 each preferably have a larger energy gap, a lower electron affinity, and a higher insulating property than the oxide semiconductor films 105, 106, and 108. In addition, the oxide semiconductor films 142, 143, and 144 each preferably have a lower indium content than the oxide semiconductor films 105, 106, and 108. The oxide semiconductor films 142, 143, and 144 preferably have a function of blocking external impurity. In such an oxide semiconductor film, the proportion of In atoms is lower than that of M (M is Mg, Al, Ti, Ga, Y, Zr, La, Ce, Nd, or HO atoms. In the case where the oxide semiconductor films 142, 143, and 144 contain an In-M-Zn oxide (M is Mg, Al, Ti, Ga, Y, Zr, La, Ce, Nd, or HO, and a target having the atomic ratio of the metal elements of In:M:Zn=$x_3$:$y_3$:$z_3$ is used for forming the oxide semiconductor films 142, 143, and 144, $x_3/y_3$ is preferably greater than or equal to 1/6 and less than 1; $z_3/y_3$ is preferably greater than or equal to 1/3 and less than or equal to 6, further preferably greater than or equal to 1 and less than or equal to 6. Note that when $z_3/y_3$ is greater than or equal to 1 and less than or equal to 6, CAAC-OS films are easily formed as the oxide semiconductor films 142, 143, and 144. Typical examples of the atomic ratio of the metal elements of the target are In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

In the transistor 111w shown in FIG. 10A, the oxide semiconductor film 142 has a larger energy gap and a lower electron affinity than the oxide semiconductor film 105; therefore, a channel is formed in the oxide semiconductor film 105. That is, a buried channel structure is obtained. The oxide semiconductor film 106 and the oxide semiconductor film 142 contain one or more kinds of metal elements that form the oxide semiconductor film 105. Therefore, an interface state is not easily formed at the interface between the oxide semiconductor film 105 and the oxide semiconductor film 106 and at the interface between the oxide semiconductor film 105 and the oxide semiconductor film 142. Thus, providing the oxide semiconductor film 106 and the oxide semiconductor film 142 makes it possible to reduce variations or changes in electrical characteristics of the transistor, such as threshold voltage.

Similarly, in the transistor 111x shown in FIG. 10B, the oxide semiconductor films 142 and 143 each have a larger energy gap and a lower electron affinity than the oxide semiconductor films 105 and 106; therefore, a channel is formed in the oxide semiconductor film 105. That is, a buried channel structure is obtained. The multilayer film 107 includes the oxide semiconductor films 142 and 143. Therefore, an interface state is not easily formed at the interface between the oxide semiconductor film 142 and the oxide semiconductor film 105, at the interface between the oxide semiconductor film 105 and the oxide semiconductor film 106, and at the interface between the oxide semiconductor film 106 and the oxide semiconductor film 143. Consequently, variations or changes in electrical characteristics of the transistor, such as threshold voltage, can be reduced.

Similarly, in the transistor 111y shown in FIG. 10B, the multilayer film 110 includes the oxide semiconductor film 144; therefore, an interface state is not easily formed at the interface between the oxide semiconductor film 144 and the oxide semiconductor film 108. Consequently, variations or changes in electrical characteristics of the transistor, such as threshold voltage, can be reduced.

<Band Structure>

Next, band structures along given cross sections of the transistor 100k in FIGS. 8A and 8B, which is a typical example of a transistor of this embodiment, are described.

A band structure in the O—P cross section including the channel regions of the transistor 100k in FIG. 8A is illustrated in FIG. 28A. The channel region 106a has a slightly larger energy gap than the channel region 105a. The insulating film 104a, the insulating film 104b, and the insulating film 116 each have a sufficiently larger energy gap than the channel region 106a and the channel region 105a. Furthermore, the Fermi levels (denoted by Ef) of the channel region 106a, the channel region 105a, the insulating film 104a, the insulating film 104b, and the insulating film 116 are assumed to be equal to the intrinsic Fermi levels thereof (denoted by Ei). Furthermore, work functions of the conductive film 102 and the conductive film 119 are assumed to be equal to the Fenui levels.

When a gate voltage is set to be higher than or equal to the threshold voltage of the transistor, an electron flows preferentially in the channel region 105a owing to the difference between the energies of the conduction band minimums of the channel region 106a and the channel region 105a. That is, it is probable that an electron is embedded in the channel region 105a. Note that the energy at the conduction band minimum is denoted by Ec, and the energy at the valence band maximum is denoted by Ev.

Accordingly, in the transistor of one embodiment of the present invention, the embedment of an electron reduces the influence of interface scattering. Therefore, the channel resistance of the transistor of one embodiment of the present invention is low.

Next, FIG. 28B shows a band structure in the Q-R cross section including the source region or the drain region of the transistor 100k in FIG. 8A. Note that the low-resistance regions 105b, 105c, 106b, and 106c are assumed to be in a degenerate state. That is, in each of the low-resistance regions 105b, 105c, 106b, and 106c, the Fermi level Ef is assumed to be approximately the same as the energy Ec of the conduction band minimum. Furthermore, in the low-resistance region 105b, the energy of the conduction band minimum is assumed to be approximately the same as the Fermi level of the channel region 105a. Furthermore, in the low-resistance region 106b, the energy of the conduction band minimum is assumed to be approximately the same as the Fermi level of the channel region 106a. The same applies to the low-resistance region 105c and the low-resistance region 106c.

At this time, an ohmic contact is made between the conductive film 134 and the low-resistance region 106b because an energy barrier therebetween is sufficiently low. Furthermore, an ohmic contact is made between the low-resistance region 106b and the low-resistance region 105b. Similarly, an ohmic contact is made between the conductive film 135 and the low-resistance region 106c because an energy barrier therebetween is sufficiently low. Furthermore, an ohmic contact is made between the low-resistance region 106c and the low-resistance region 105c. Therefore, electron transfer is conducted smoothly between the conductive films 134 and 135 and the channel regions 106a and 105a.

As described above, the transistor of one embodiment of the present invention is a transistor in which the channel resistance is low and electron transfer between the channel region and the source and the drain electrodes is conducted smoothly. That is, the transistor has excellent switching characteristics.

<Method 1 for Manufacturing Semiconductor Device>

Next, a method for manufacturing the transistors 100g and 100h illustrated in FIGS. 1A and 1B and FIGS. 2A and 2B will be described with reference to FIGS. 4A to 4C, FIGS. 5A to 5C, and FIGS. 6A and 6B.

The films included in the transistors 100g and 100h (i.e., the insulating film, the oxide semiconductor film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

As illustrated in FIG. 4A, the insulating film 104 is formed over the substrate 101. Next, the oxide semiconductor film 105 is formed over the insulating film 104 in the driver circuit portion.

The insulating film 104 can be formed by a sputtering method, a CVD method, an evaporation method, a pulsed laser deposition (PLD) method, a printing method, a coating method, or the like, as appropriate. The insulating film 104 can be formed in the following manner: an insulating film is formed over the substrate 101, and then oxygen is added to the insulating film. Examples of the oxygen that is added to the insulating film include an oxygen radical, an oxygen atom, an oxygen atomic ion, an oxygen molecular ion, and the like. As a method for adding the oxygen, an ion doping method, an ion implantation method, plasma treatment, or the like can be given. Alternatively, after a film which suppresses release of oxygen is formed over the insulating film, oxygen may be added to the insulating film through the film.

As the insulating film 104, a silicon oxide film or a silicon oxynitride film from which oxygen can be released by heat treatment can be formed under the following conditions: the substrate placed in a treatment chamber of the plasma CVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, or greater than or equal to 0.25 W/cm$^2$ and less than or equal to 0.35 W/cm$^2$ is supplied to an electrode provided in the treatment chamber.

Here, the insulating film 104a and the insulating film 104b may be stacked to form the insulating film 104. For example, a 100-nm-thick silicon nitride film is formed by a plasma CVD method as the insulating film 104a, and a 300-nm-thick silicon oxynitride film is formed by a plasma CVD method as the insulating film 104b.

A formation method of the oxide semiconductor film 105 is described below. An oxide semiconductor film is formed over the insulating film 104 by a sputtering method, a coating method, a pulsed laser deposition method, a laser ablation method, a thermal CVD method, or the like. Then, after a mask is formed over the oxide semiconductor film by a lithography process, the oxide semiconductor film is partly etched using the mask. Thus, the oxide semiconductor film 105 can be formed as illustrated in FIG. 4A. After that, the mask is removed. Note that heat treatment may be performed after the oxide semiconductor film 105 is formed by etching part of the oxide semiconductor film.

Alternatively, by using a printing method for forming the oxide semiconductor film 105, the oxide semiconductor film 105 subjected to element isolation can be formed directly.

As a power supply device for generating plasma in the case of forming the oxide semiconductor film by a sputtering method, an RF power supply device, an AC power supply device, a DC power supply device, or the like can be used as appropriate. Note that a CAAC-OS film can be formed using an AC power supply device or a DC power supply device. In forming the oxide semiconductor film, a sputtering method using an AC power supply device or a DC power supply device is preferable to a sputtering method using an RF power supply device because the oxide semiconductor film can be uniform in film thickness, film composition, or crystallinity.

As a sputtering gas, a rare gas (typically argon), an oxygen gas, or a mixed gas of a rare gas and oxygen is used as appropriate. In the case of using the mixed gas of a rare gas and oxygen, the proportion of oxygen to a rare gas is preferably increased.

The oxide semiconductor film 105 is formed using an In-M-Zn oxide (M is Mg, Al, Ti, Ga, Y, Zr, La, Ce, Nd, or Hf) target. When the atomic ratio of the metal elements of the target is $In:M:Zn=x_1:y_1:z_1$, $x_1/y_1$ is greater than 1 and less than or equal to 6.

For example, in the case where the oxide semiconductor film is formed by a sputtering method at a substrate temperature higher than or equal to 150° C. and lower than or equal to 750° C., higher than or equal to 150° C. and lower than or equal to 450° C., or higher than or equal to 200° C. and lower than or equal to 350° C., a CAAC-OS film can be formed. In the case where the substrate temperature is higher than or equal to 25° C. and lower than 150° C., a microcrystalline oxide semiconductor film can be formed.

For the deposition of the CAAC-OS film to be described later, the following conditions are preferably used.

By suppressing entry of impurities during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, or −100° C. or lower is used.

Furthermore, it is preferable that the proportion of oxygen in the deposition gas be increased and the power be optimized in order to reduce plasma damage at the deposition. The proportion of oxygen in the deposition gas is 30 vol. % or higher, or 100 vol. %.

Furthermore, after the oxide semiconductor film is formed, heat treatment may be performed so that the oxide semiconductor film is subjected to dehydrogenation or dehydration. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

The heat treatment is performed under an inert gas atmosphere containing nitrogen or a rare gas such as helium, neon, argon, xenon, or krypton. Alternatively, the heat treatment may be performed under an inert gas atmosphere first, and then under an oxygen atmosphere. It is preferable that the above inert gas atmosphere and the above oxygen atmosphere do not contain hydrogen, water, and the like. The treatment time is from 3 minutes to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration in the oxide semiconductor film which is measured by SIMS can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

For example, in the case where an oxide semiconductor film, e.g., an InGaZnO$_X$ (X>0) film is formed using a deposition apparatus employing ALD, an In(CH$_3$)$_3$ gas and an O$_3$ gas are sequentially introduced more than once to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, instead of a Zn(CH$_3$)$_2$ gas, a Zn(C$_2$H$_5$)$_2$ gas may be used.

Here, a 35-nm-thick oxide semiconductor film is formed by a sputtering method, Next, a mask is formed over the oxide semiconductor film, and part of the oxide semiconductor film is selectively etched. In this manner, the oxide semiconductor film 105 is formed. As the oxide semiconductor film 105, an In—Ga—Zn oxide film (In:Ga:Zn=3:1:2) is formed.

Next, as shown in FIG. 4B, the oxide semiconductor film 106 is formed over the oxide semiconductor film 105 in the driver circuit portion, and the oxide semiconductor film 108 is formed in the pixel portion. Thus, the multilayer film 107 in which the oxide semiconductor film 105 and the oxide semiconductor film 106 are stacked in this order is formed.

Note that in this step, the oxide semiconductor film 106 is formed to cover a top surface and a side surface of the oxide semiconductor film 105, to prevent the oxide semiconductor film 105 from being etched in a later step of forming conductive films functioning as a source electrode and a drain electrode. This is preferable because variations in the length of the oxide semiconductor film 105 in the channel width direction of the transistor can be reduced.

Here, a 20-nm-thick oxide semiconductor film is formed by a sputtering method. Next, a mask is formed over the oxide semiconductor film, and part of the oxide semiconductor film is selectively etched. In this manner, the oxide semiconductor films 106 and 108 are formed. As the oxide semiconductor films 106 and 108, In—Ga—Zn oxide films (In:Ga:Zn=1:1:1.2) are formed.

Next, oxygen contained in the insulating film 104 is moved to the oxide semiconductor films by heat treatment. Note that the heat treatment may be performed at a time that is after the formation of the oxide semiconductor film to be the oxide semiconductor films 106 and 108 and before the etching of the oxide semiconductor film for forming the oxide semiconductor films 106 and 108.

When the heat treatment is performed at a temperature higher than 350° C. and lower than or equal to 650° C., or higher than or equal to 450° C. and lower than or equal to 600° C., it is possible to obtain an oxide semiconductor film whose proportion of CAAC, which is described later, is greater than or equal to 60% and less than 100%, greater than or equal to 80% and less than 100%, greater than or equal to 90% and less than 100%, or greater than or equal to 95% and less than or equal to 98%. Furthermore, it is possible to obtain an oxide semiconductor film having a low content of hydrogen, water, and the like. That is, an oxide semiconductor film with a low impurity concentration and a low density of defect states can be formed.

Next, as shown in FIG. 4C, an insulating film 115 is formed over the insulating film 104, the multilayer film 107, and the oxide semiconductor film 108. Then, the conductive films 119 and 120 are formed over the insulating film 115.

In the case where the conductive films 119 and 120 are forming using, for example, a low-resistance material, entry of the low-resistance material into the oxide semiconductor films leads to poor electrical characteristics of the transistors. In this embodiment, the insulating film 115 is formed before the conductive films 119 and 120 are formed; thus, the channel region in each of the oxide semiconductor films 105 and 108 is not in contact with the conductive films 119 and 120. Therefore, the variation in the electrical characteristics, typically threshold voltage, of the transistors can be suppressed.

As the insulating film 115, a silicon oxide film or a silicon oxynitride film can be formed by a CVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film with few defects can be formed as the insulating film 115 by a CVD method under the conditions where the ratio of an oxidizing gas to a deposition gas is higher than 20 times and lower than 100 times, or higher than or equal to 40 times and lower than or equal to 80 times and the pressure in a treatment chamber is lower than 100 Pa, or lower than or equal to 50 Pa.

A silicon oxide film or a silicon oxynitride film which is dense can be formed as the insulating film 115 under the following conditions: the substrate placed in a treatment chamber of a plasma CVD apparatus that is vacuum-evacuated is held at a temperature higher than or equal to 280° C. and lower than or equal to 400° C., the pressure in the treatment chamber is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

The insulating film 115 can be formed by a plasma CVD method using a microwave. The microwave refers to a wave in the frequency range of 300 MHz to 300 GHz. In the case of a microwave, electron temperature is low and electron energy is low. Furthermore, in supplied power, the proportion of power used for acceleration of electrons is low, and therefore, power can be used for dissociation and ionization of more molecules. Thus, plasma with high density (high-density plasma) can be excited. Therefore, a deposition surface and a deposit are less damaged by plasma, and the insulating film 115 with few defects can be formed.

Alternatively, the insulating film 115 can be formed by a CVD method using an organosilane gas. As the organosilane gas, any of the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like. The insulating film 115 having high coverage can be formed by a CVD method using an organosilane gas.

In the case where a gallium oxide film is formed as the insulating film 115, an MOCVD method can be used.

In the case where a hafnium oxide film is formed as the insulating film 115 by a thermal CVD method such as an MOCVD method or an ALD method, two kinds of gases, i.e., ozone ($O_3$) as an oxidizer and a source gas which is obtained by vaporizing a liquid containing a solvent and a hafnium precursor compound (a hafnium alkoxide solution, which is typified by tetrakis(dimethylamide)hafnium (TDMAH)), are used. Note that the chemical formula of tetrakis (dimethylamide)hafnium is $Hf[N(CH_3)_2]_4$. Examples of another material liquid include tetrakis(ethylmethylamide) hafnium.

In the case where an aluminum oxide film is formed as the insulating film 115 by a thermal CVD method such as an MOCVD method or an ALD method, two kinds of gases, i.e., $H_2O$ as an oxidizer and a source gas which is obtained by vaporizing a liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate). Note that the ALD method enables the insulating film 115 to have excellent coverage and small thickness.

In the case where a silicon oxide film is formed as the insulating film 115 by a thermal CVD method such as an MOCVD method or an ALD method, hexachlorodisilane is adsorbed on a deposition surface, chlorine contained in adsorbate is removed, and radicals of an oxidizing gas (e.g., $O_2$ or dinitrogen monoxide) are supplied to react with the adsorbate.

Here, a 100-nm-thick silicon oxynitride film is formed by a plasma CVD method as the insulating film 115.

The conductive films 119 and 120 are formed as follows: a conductive film is formed by a sputtering method, a vacuum evaporation method, a pulsed laser deposition (PLD) method, a thermal CVD method, or the like, a mask is formed over the conductive film by a lithography process, and then etching treatment is performed.

Alternatively, a tungsten film can be formed as the conductive film with a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Here, masks 122 and 123 are formed over the conductive film by a lithography process and then the conductive film is etched, whereby the conductive films 119 and 120 are formed.

Note that the conductive films 119 and 120 may be formed by an electrolytic plating method, a printing method, an inkjet method, or the like instead of the above formation method.

Figure 5A:
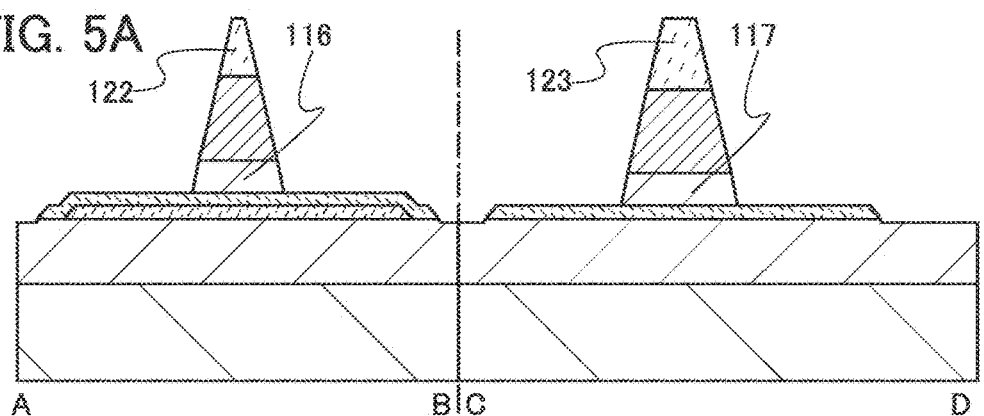
FIGS. 5A to 5C are cross-sectional views illustrating one embodiment of a method for manufacturing a semiconductor device.

Then, as shown in FIG. 5A, the insulating film 115 is etched with the masks 122 and 123 left, so that the insulating films 116 and 117 are formed.

Figure 5B:
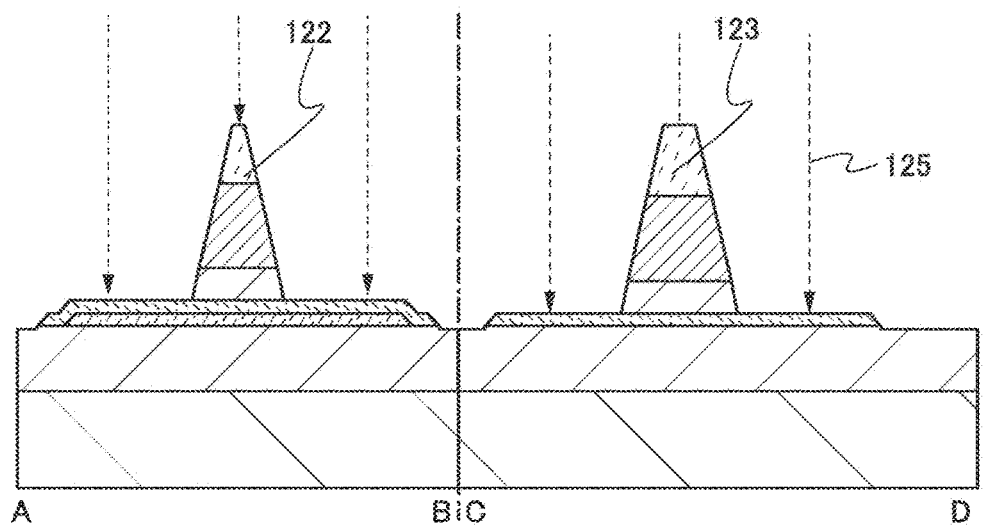

Next, as shown in FIG. 5B, an impurity element 125 is added to the multilayer film 107 and the oxide semiconductor film 108 with the masks 122 and 123 left. As a result, the impurity element is added to regions which are not covered with the masks 122 and 123 in the multilayer film 107 and the oxide semiconductor film 108. Note that by the addition of the impurity element 125, an oxygen vacancy is formed in the multilayer film 107 and the oxide semiconductor film 108.

Alternatively, after the masks 122 and 123 are removed, a film (typically, a nitride insulating film, an oxide insulating film, or the like) with a thickness such that the impurity element 125 can be added to the oxide semiconductor films may be formed and the impurity element 125 may be added to the oxide semiconductor films. The thickness such that the impurity element 125 can be added to the oxide semiconductor films is greater than or equal to 0.1 nm and less than or equal to 50 nm, or greater than or equal to 1 nm and less than or equal to 10 nm.

As a method for adding the impurity element 125, an ion doping method, an ion implantation method, plasma treatment, or the like can be given. In the case of plasma treatment, plasma is generated in a gas atmosphere containing an impurity element to be added and plasma treatment is performed, whereby the impurity element can be added. A dry etching apparatus, a plasma CVD apparatus, a high-density plasma CVD apparatus, or the like can be used to generate the plasma. In the case of plasma treatment, the substrate 101 may be set to a parallel plate electrode on the cathode side and an RF power may be supplied so that a bias is applied to the substrate 101 side. As the RF power, for example, power density can be greater than or equal to 0.1 W/cm$^2$ and less than or equal to 2 W/cm$^2$. Consequently, the amount of impurity elements added to the multilayer film 107 and the oxide semiconductor film 108 can be increased and more oxygen vacancies can be formed in the multilayer film 107 and the oxide semiconductor film 108.

Note that, as a source gas of the impurity element 125, one or more of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, one or more of $B_2H_6$, $PH_3$, $N_2$, $NH_3$, $AlH_3$, $MCl_3$, $F_2$, HF, and $H_2$ which are diluted with a rare gas can be used. By adding the impurity element 125 to the multilayer film 107 and the oxide semiconductor film 108 using one or more of $B_2H_6$, $PH_3$, $N_2$, $NH_3$, $AlH_3$, $AlCl_3$, $F_2$, HF, and $H_2$ which are diluted with a rare gas, the rare gas and one or more of hydrogen, boron, carbon, nitrogen, fluorine, aluminum, silicon, phosphorus, and chlorine can be added at a time to the multilayer film 107 and the oxide semiconductor film 108.

Alternatively, after a rare gas is added to the multilayer film 107 and the oxide semiconductor film 108, one or more of $B_2H_6$, $PH_3$, $CH_4$, $N_2$, $NH_3$, $AlH_3$, $AlCl_3$, $Si_2H_6$, $F_2$, HF, and $H_2$ may be added to the multilayer film 107 and the oxide semiconductor film 108.

Further alternatively, after one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ are added to the multilayer film 107 and the oxide semiconductor film 108, a rare gas may be added to the multilayer film 107 and the oxide semiconductor film 108.

The addition of the impurity element 125 is controlled by appropriately setting the implantation conditions such as the acceleration voltage and the dose. For example, in the case where argon is added by an ion implantation method, the acceleration voltage is set to 10 kV and the dose is set to greater than or equal to $1\times10^{13}$ ions/cm$^2$ and less than or equal to $1\times10^{16}$ ions/cm$^2$, e.g., $1\times10^{14}$ ions/cm$^2$. In the case where a phosphorus ion is added by an ion implantation method, the acceleration voltage is set to 30 kV and the dose is set to greater than or equal to $1\times10^{13}$ ions/cm$^2$ and less than or equal to $5\times10^{16}$ ions/cm$^2$, e.g., $1\times10^{15}$ ions/cm$^2$.

As a result, the low-resistance regions 107b and 107c can be formed in the multilayer film 107. In addition, the low-resistance regions 108b and 108c can be formed in the oxide semiconductor film 108. After that, the masks 122 and 123 are removed.

Note that when the impurity element 125 is added with the conductive films 119 and 120 exposed, part of the conductive films 119 and 120 are separated and attached to side surfaces of the insulating films 116 and 117, This results in an increase in the leakage current of the transistors. Hence, the impurity element 125 is added to the multilayer film 107 and the oxide semiconductor film 108 with the conductive films 119 and 120 covered with the masks 122 and 123; thus, it is possible to prevent attachment of part of the conductive films 119 and 120 to the side surfaces of the insulating films 116 and 117.

After that, heat treatment may be performed to further increase the conductivity of the regions to which the impurity element 125 is added. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

Figure 5C:
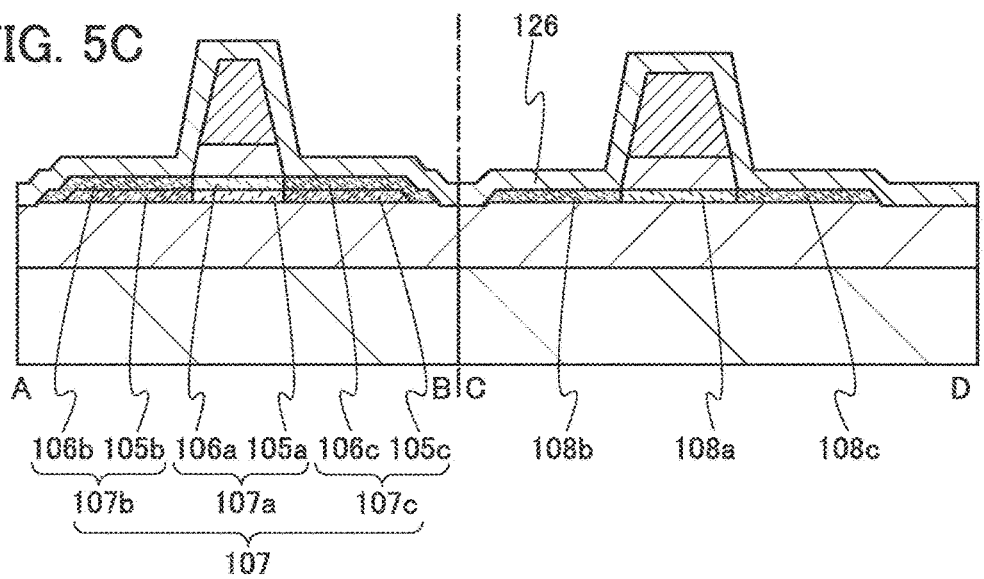

Next, as shown in FIG. 5C, the insulating film 126 is formed over the insulating film 104, the multilayer film 107, the oxide semiconductor film 108, the insulating films 116 and 117, and the conductive films 119 and 120.

As a method for forming the insulating film 126, a sputtering method, a CVD method, a vacuum evaporation method, a pulsed laser deposition (PLD) method, or the like is given. Note that a silicon nitride film containing hydrogen can be formed by a plasma CVD method using silane and ammonia as a source gas or using silane and nitrogen as a source gas. Furthermore, by using a plasma CVD method, the multilayer film 107 and the oxide semiconductor film 108 can be damaged, and oxygen vacancy can be formed in the multilayer film 107 and the oxide semiconductor film 108.

Since hydrogen is contained in the insulating film 126, when the insulating film 126 is in contact with the regions to which the impurity element is added in the multilayer film 107 and the oxide semiconductor film 108, hydrogen contained in the insulating film 126 moves to the regions to which the impurity element is added in the multilayer film 107 and the oxide semiconductor film 108. Since oxygen vacancy is included in the regions to which the impurity element is added, the low-resistance regions can be formed in the multilayer film 107 and the oxide semiconductor film 108.

Alternatively, an aluminum film or an aluminum oxide film is formed instead of the insulating film 126 and then heat treatment is performed, whereby oxygen contained in the multilayer film 107 and the oxide semiconductor film 108 reacts with the aluminum film or the aluminum oxide film. Thus, an aluminum oxide film is formed as the insulating film 126, and an oxygen vacancy is formed in the low-resistance regions 107b, 107c, 108b, and 108c in the multilayer film 107 and the oxide semiconductor film 108. As a result, the conductivity of the low-resistance regions 107b, 107e, 108b, and 108c can be further increased.

Here, a 100-nm-thick silicon nitride film is formed as the insulating film 126 by a plasma CVD method.

After that, heat treatment may be performed to further increase the conductivity of the low-resistance regions 107b, 107c, 108b, and 108c. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

Figure 6A:
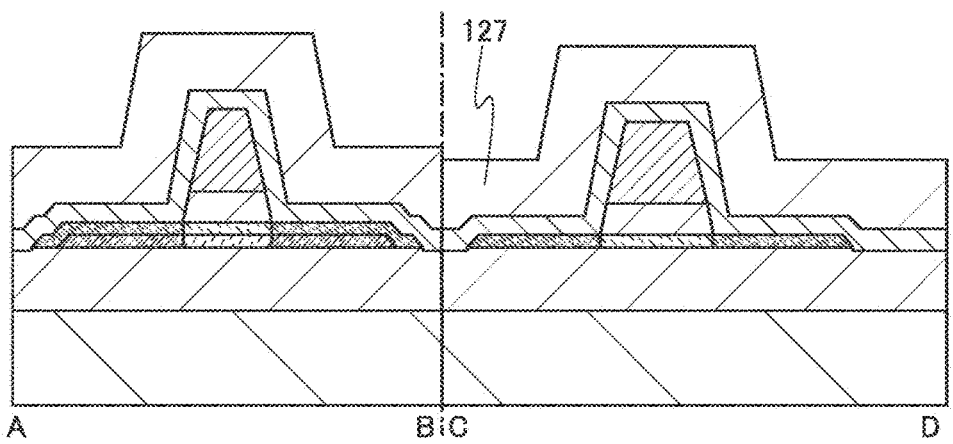
FIGS. 6A and 6B are cross-sectional views illustrating one embodiment of a method for manufacturing a semiconductor device.
Figure 6B:
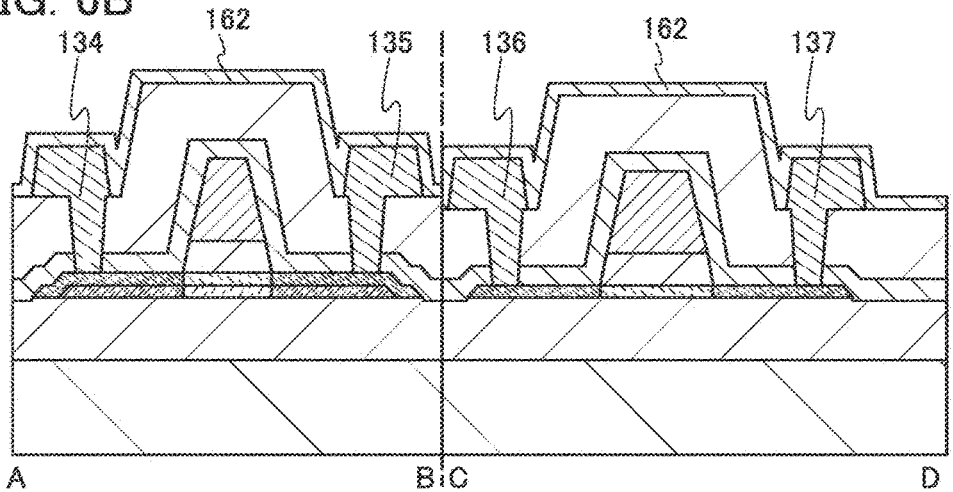

Next, the insulating film 127 may be formed as illustrated in FIG. 6A. The insulating film 127 can reduce the parasitic capacitance between the conductive film 119 and the conductive films 134 and 135 formed later and between the conductive film 120 and the conductive films 136 and 137 formed later.

Next, openings 128, 129, 130, and 131 are formed in the insulating films 126 and 127 to expose parts of the low-resistance regions, and then the conductive films 134, 135, 136, and 137 are formed. In addition, the nitride insulating film 162 is preferably formed (see FIG. 6B).

The conductive films 134, 135, 136, and 137 can be formed by a method similar to the formation method of the conductive films 119 and 120 as appropriate. The nitride insulating film 162 can be formed by a sputtering method, a CVD method, or the like as appropriate.

Through the above-described process, the transistors 100g and 100h can be manufactured.

<Method 2 for Manufacturing Semiconductor Device>

Next, a method for manufacturing the transistors 100k and 100z illustrated in FIGS. 8A and 8B is described.

The insulating film 161 is formed over the substrate 101 in the driver circuit portion, and the conductive film 102 is formed over the insulating film 161, The conductive film 102 can be formed by the formation method of the conductive films 119 and 120 as appropriate.

Then, the insulating film 104a and the insulating film 104b are stacked to form the insulating film 104 over the insulating film 161 and the conductive film 102.

After that, the multilayer film 107 and the oxide semiconductor film 108 are formed through the steps of FIGS. 4A and 4B.

Next, as shown in FIG. 4C, the insulating film 115 is formed, and then the insulating film 115 is partly etched, so that an opening 113 shown in FIG. 7A is formed.

Then, the conductive films 119 and 120 shown in FIG. 4C are formed, and then steps similar to those in FIGS. 5A to 5C and FIGS. 6A and 6B are performed. In this manner, the transistors 100k and 100z can be manufactured.

In the transistor described in this embodiment, the conductive films functioning as a source electrode and a drain electrode do not overlap with the conductive film functioning as a gate electrode, and thus, parasitic capacitance can be reduced and on-state current is high. Furthermore, in the transistor described in this embodiment, the low-resistance region can be formed stably; therefore, on-state current is higher and variation in the electrical characteristics of the transistor is more reduced than in a conventional transistor.

The structures, methods, and the like described in this embodiment can be used as appropriate in combination with any of the structures, methods, and the like described in the other embodiments.

Embodiment 2

In this embodiment, one embodiment of a semiconductor device and a manufacturing method thereof will be described with reference to FIGS. 11A to 11C, FIG. 12, FIG. 13, FIG. 14, FIG. 15, FIG. 16, FIG. 17, FIGS. 18A to 18C, FIG. 19, FIG. 20, FIGS. 21A to 21C, FIG. 22, FIG. 23, FIGS. 24A and 24B, FIGS. 25A and 25B, FIGS. 26A and 26B, and FIGS. 27A and 27B.

<Structure 1 of Semiconductor Device>

In FIGS. 11A to 11C, FIG. 12, and FIG. 13, transistors each having a top-gate structure are shown as examples of transistors included in a semiconductor device. Here, a display device is described as an example of the semiconductor device. Furthermore, structures of transistors provided in a driver circuit portion and a pixel portion of the display device are described.

Figure 11A:
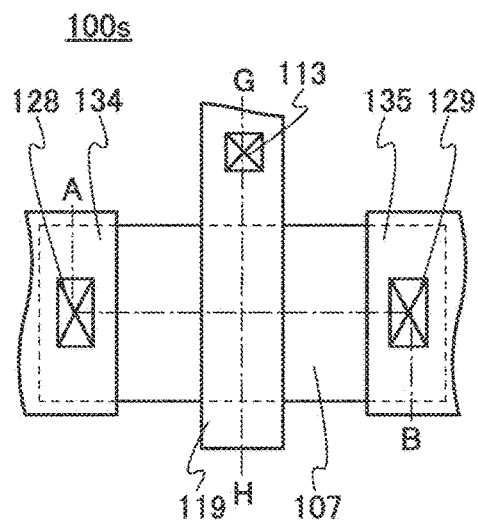
FIGS. 11A to 11C are top views illustrating one embodiment of a semiconductor device.
Figure 11B:
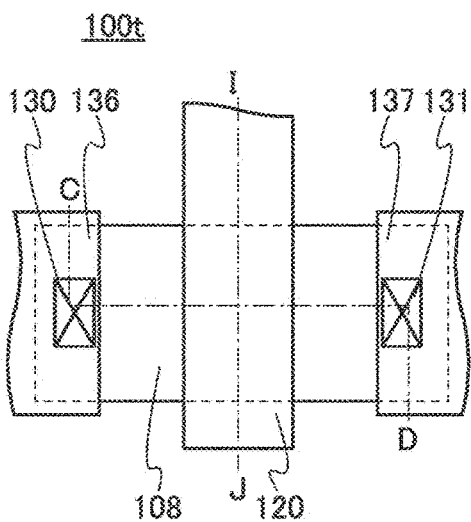
Figure 11C:
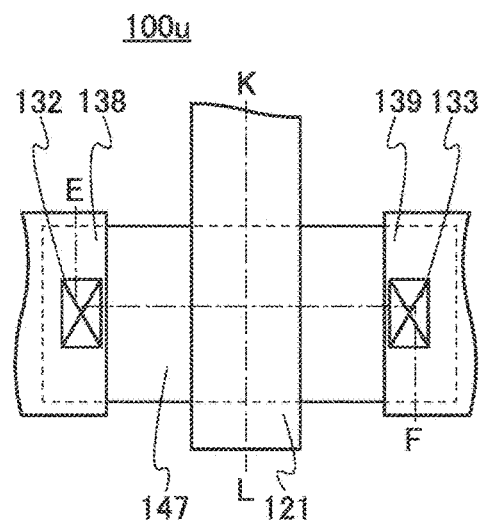
Figure 12:
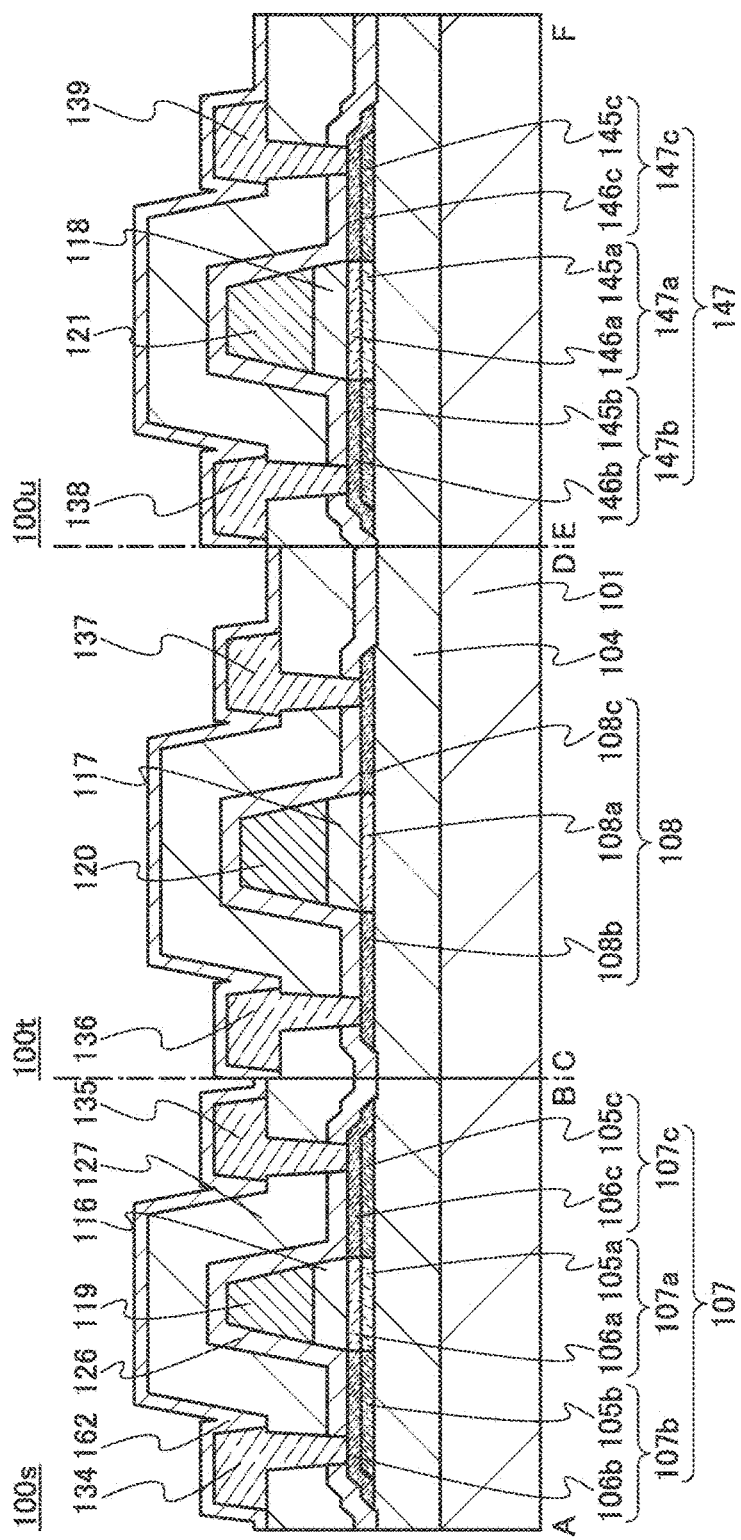
FIG. 12 is a cross-sectional view illustrating one embodiment of a semiconductor device.
Figure 13:
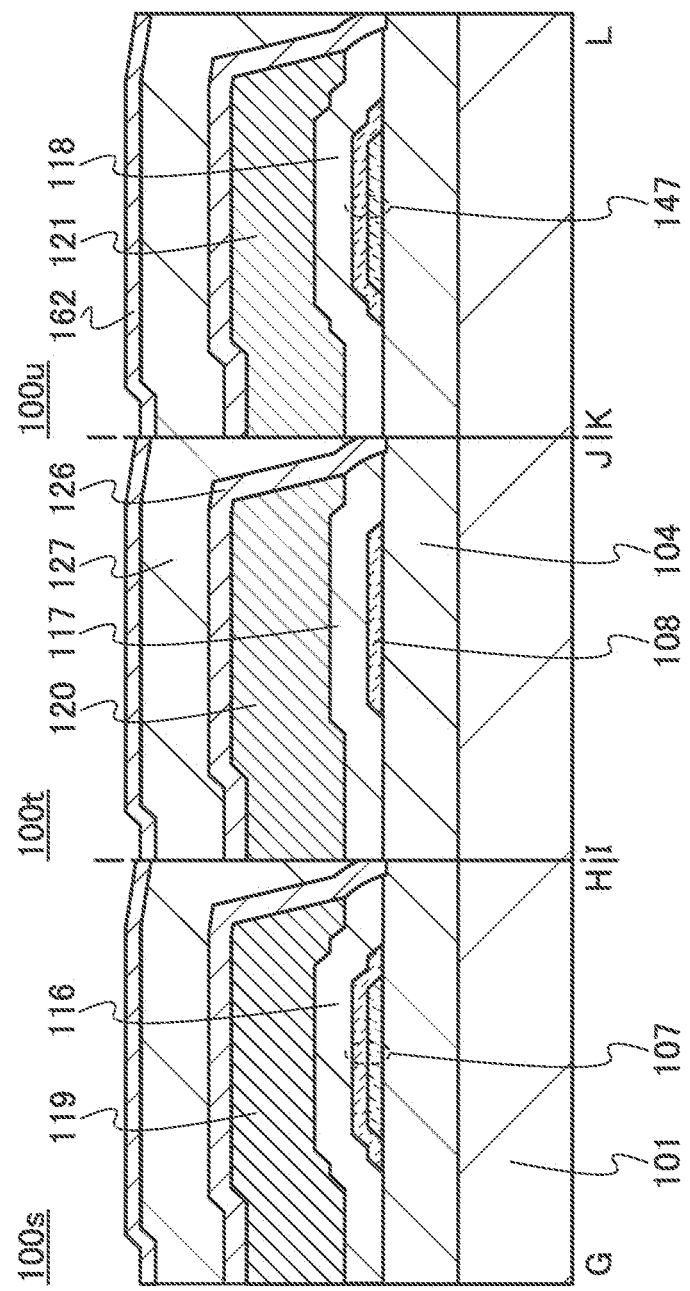
FIG. 13 is a cross-sectional view illustrating one embodiment of a semiconductor device.

FIGS. 11A to 11C are top views of a transistor 100s provided in a driver circuit portion and transistors 100t and 100u provided in a pixel portion. FIG. 12 and FIG. 13 show cross-sectional views of the transistors 100s, 100t, and 100u. FIG. 11A, FIG. 11B, and FIG. 11C are top views of the transistor 100s, the transistor 100t, and the transistor 100u, respectively. FIG. 12 shows cross-sectional views along the dashed-dotted line A-B in FIG. 11A, the dashed-dotted line C-D in FIG. 11B, and the dashed-dotted line E-F in FIG. 11C. FIG. 13 shows cross-sectional views along the dashed-dotted line G-H in FIG. 11A, the dashed-dotted line I-J in FIG. 11B, and the dashed-dotted line K-L in FIG. 11C.

The transistor 100s shown in FIG. 12 and FIG. 13 includes the insulating film 104 over the substrate 101, the multilayer film 107 over the insulating film 104, the insulating film 116 in contact with the multilayer film 107, and the conductive film 119 overlapping with the multilayer film 107 with the insulating film 116 provided therebetween. The transistor 100s has the same structure as the transistor 100g described in Embodiment 1; therefore, the description of the transistor 100g in Embodiment 1 can be referred to for detailed description of the transistor 100s.

The transistor 100t includes the oxide semiconductor film 108 over the insulating film 104 formed over the substrate 101; the insulating film 117 in contact with the oxide semiconductor film 108; and the conductive film 120 overlapping with the oxide semiconductor film 108 with the insulating film 117 provided therebetween. The transistor 100t has the same structure as the transistor 100h described in Embodiment 1; therefore, the description of the transistor 100h in Embodiment 1 can be referred to for detailed description of the transistor 100t.

The transistor 100u includes a multilayer film 147 over the insulating film 104 formed over the substrate 101; an insulating film 118 in contact with the multilayer film 147; and a conductive film 121 overlapping with the multilayer film 147 with the insulating film 118 provided therebetween. The transistor 100u has the same structure as the transistor 100s.

The conductive film 121 functions as a gate electrode. The insulating film 118 functions as a gate insulating film.

The multilayer film 147 includes a channel region 147a overlapping with the conductive film 121 and low-resistance regions 147b and 147c between which the channel region 147a is positioned. The channel region 147a includes a channel region 145a in contact with the insulating film 104 and a channel region 146a in contact with the channel region 145a. The low-resistance region 147b includes a low-resistance region 145b in contact with the insulating film 104 and a low-resistance region 146b in contact with the low-resistance region 145b. The low-resistance region 147c includes a low-resistance region 145c in contact with the insulating film 104 and a low-resistance region 146c in contact with the low-resistance region 145c. Note that although not shown in FIG. 12, an oxide semiconductor film including the channel region 145a, the low-resistance region 145b, and the low-resistance region 145c is referred to as an oxide semiconductor film 145, and an oxide semiconductor film including the channel region 146a, the low-resistance region 146b, and the low-resistance region 146c is referred to as an oxide semiconductor film 146. That is, the multilayer film 147 is a stack including the oxide semiconductor film 145 and the oxide semiconductor film 146.

Note that in a top surface shape, an edge portion of the oxide semiconductor film 146 is positioned outside an edge portion of the oxide semiconductor film 145. That is, the oxide semiconductor film 146 covers a top surface and a side surface of the oxide semiconductor film 145.

In the transistor 100u, the insulating film 126 in contact with the low-resistance regions 147b and 147c is provided. Furthermore, the insulating film 127 may be provided over the insulating film 126. In addition, conductive films 138 and 139 which are in contact with the low-resistance regions 147b and 147c of the multilayer film 147 through openings 132 and 133 in the insulating films 126 and 127 are provided.

In the multilayer film 147, an element which forms an oxygen vacancy is included in a region which does not overlap with the conductive film 121. As the element which forms an oxygen vacancy, any of the impurity elements given in Embodiment 1 can be used.

The insulating film 126 is a film containing hydrogen, and a nitride insulating film is a typical example thereof. Examples of a nitride insulating film include a silicon nitride film and an aluminum nitride film. The insulating film 126 is in contact with the multilayer film 147. Therefore, hydrogen contained in the insulating film 126 is diffused into the multilayer film 147. As a result, much hydrogen is contained in a region in contact with the insulating film 126 in the multilayer film 147.

When the impurity element is added to the oxide semiconductor, a bond between a metal element and oxygen in the oxide semiconductor is cut, whereby an oxygen vacancy is formed. When hydrogen is added to an oxide semiconductor in which an oxygen vacancy is formed by addition of an impurity element, hydrogen enters an oxygen vacant site and forms a donor level in the vicinity of the conduction band; thus, the conductivity of the oxide semiconductor is increased. Consequently, an oxide conductor can be formed. Accordingly, the oxide conductor has a light-transmitting property.

The oxide conductor is a degenerate semiconductor and it is suggested that the conduction band edge equals to or substantially equals to the Fermi level. For that reason, an ohmic contact is made between an oxide conductor film and conductive films functioning as a source electrode and a drain electrode; thus, contact resistance between the oxide conductor film and the conductive films functioning as a source electrode and a drain electrode can be reduced.

In other words, the low-resistance regions 147b and 147c function as a source region and a drain region.

In the case where the conductive films 138 and 139 are formed using a conductive material which is easily bonded to oxygen, such as tungsten, titanium, aluminum, copper, molybdenum, chromium, tantalum, an alloy of any of these, or the like, oxygen contained in the oxide semiconductor films is bonded to the conductive material contained in the conductive films 138 and 139, and an oxygen vacancy is formed in the multilayer film 147. Furthermore, in some cases, part of constituent elements of the conductive material that forms the conductive films 138 and 139 is mixed into the multilayer film 147. As a result, the low-resistance regions 147b and 147c in contact with the conductive films 138 and 139 have higher conductivity and function as a source region and a drain region.

In the case where the impurity element is a rare gas element and the multilayer film 147 is formed by a sputtering method, the low-resistance regions 147b and 147c each contain a rare gas element. In addition, the rare gas element concentrations of the low-resistance regions 147b and 147c are higher than that of the channel region 147a. The reasons are as follows: in the case where the multilayer film 147 is formed by a sputtering method, a rare gas is used as a sputtering gas, so that the multilayer film 147 contains the rare gas; and a rare gas is intentionally added to the low-resistance regions 147b and 147c in order to form oxygen vacancies in the low-resistance regions 147b and 147c. Note that a rare gas element different from that added to the channel region 147a may be added to the low-resistance regions 147b and 147c.

Since the low-resistance regions 147b and 147c are in contact with the insulating film 126, the concentration of hydrogen in the low-resistance regions 147b and 147c is higher than the concentration of hydrogen in the channel region 147a.

In the low-resistance regions 147b and 147c, the concentration of hydrogen which is measured by SIMS can be higher than or equal to $8 \times 10^{19}$ atoms/cm$^3$, higher than or equal to $1 \times 10^{20}$ atoms/cm$^3$, or higher than or equal to $5 \times 10^{20}$ atoms/cm$^3$. Note that in the channel region 147a, the concentration of hydrogen which is measured by SIMS can be lower than or equal to $5 \times 10^{19}$ atoms/cm$^3$, lower than or equal to $1 \times 10^{19}$ atoms/cm$^3$, lower than or equal to $5 \times 10^{18}$ atoms/cm$^3$, lower than or equal to $1 \times 10^{18}$ atoms/cm$^3$, lower than or equal to $5 \times 10^{17}$ atoms/cm$^3$, or lower than or equal to $1 \times 10^{16}$ atoms/cm$^3$.

The low-resistance regions 147h and 147c have higher hydrogen concentrations than the channel region 147a and have more oxygen vacancies than the channel region 147a because of addition of rare gas elements. Therefore, the low-resistance regions 147b and 147c have higher conductivity and function as a source region and a drain region. The resistivity of the low-resistance regions 147b and 147c can be typically greater than or equal to $1 \times 10^{-3}$ Ωcm and less than $1 \times 10^4$ Ωcm, or greater than or equal to $1 \times 10^{-3}$ Ωcm and less than $1 \times 10^{-1}$ Ωcm.

Note that in the low-resistance regions 147b and 147c, when the amount of hydrogen is smaller than or equal to the amount of oxygen vacancy, hydrogen is easily captured by the oxygen vacancy and is not easily diffused into the channel region 147a. As a result, a normally-off transistor can be manufactured.

Furthermore, in the case where the amount of oxygen vacancy is larger than the amount of hydrogen in the low-resistance regions 147b and 147c, the carrier density of the low-resistance regions 147b and 147c can be controlled by controlling the amount of hydrogen. Alternatively, in the case where the amount of hydrogen is larger than the amount of oxygen vacancy in the low-resistance regions 147b and 147c, the carrier density of the low-resistance regions 147b and 147c can be controlled by controlling the amount of oxygen vacancy. Note that when the carrier density of the low-resistance regions 147b and 147c is greater than or equal to $5 \times 10^{18}$/cm$^3$, greater than or equal to $1 \times 10^{19}$/cm$^3$, or greater than or equal to $1 \times 10^{20}$/cm$^3$, in the transistor, the resistance between the channel region and the conductive films 138 and 139 functioning as source and drain electrodes is small and high on-state current can be obtained.

In the transistors 100s, 100t, and 100u described in this embodiment, the low-resistance regions 107b and 107c are provided between the channel region 107a and the conductive films 134 and 135 functioning as source and drain electrodes, the low-resistance regions 108b and 108c are provided between the channel region 108a and the conductive films 136 and 137 functioning as source and drain electrodes, and the low-resistance regions 147b and 147c are provided between the channel region 147a and the conductive films 138 and 139 functioning as source and drain electrodes; therefore, the transistors have small parasitic resistance.

Furthermore, in the transistor 100s, the conductive film 119 does not overlap with the conductive films 134 and 135; therefore, parasitic capacitance between the conductive film 119 and each of the conductive films 134 and 135 can be reduced. In the transistor 100t, the conductive film 120 does not overlap with the conductive films 136 and 137; therefore, parasitic capacitance between the conductive film 120 and each of the conductive films 136 and 137 can be reduced. In the transistor 100u, the conductive film 121 does not overlap with the conductive films 138 and 139; therefore, parasitic capacitance between the conductive film 121 and each of the conductive films 138 and 139 can be reduced. As a result, in the case where a large-area substrate is used as the substrate 101, signal delay in the conductive films 119, 120, 121, 134, 135, 136, 137, 138, and 139 can be reduced.

Consequently, the transistors 100s, 100t, and 100u have high on-state current and high field-effect mobility.

In the transistor 100s, the impurity element is added to the multilayer film 107 using the conductive film 119 as a mask. In the transistor 100t, the impurity element is added to the oxide semiconductor film 108 using the conductive film 120 as a mask. In the transistor 100u, the impurity element is added to the multilayer film 147 using the conductive film 121 as a mask. That is, the low-resistance regions can be formed in a self-aligned manner.

The transistor 100s in the driver circuit portion has high on-state current and high field-effect mobility. Therefore, a display device in which the area occupied by a driver circuit portion is small can be manufactured.

By using the transistor with high field-effect mobility, a demultiplexer circuit can be formed in a signal line driver circuit which is an example of the driver circuit portion. A demultiplexer circuit distributes one input signal to a plurality of outputs; thus, using the demultiplexer circuit can reduce the number of input terminals for input signals. For example, when one pixel includes a red sub-pixel, a green sub-pixel, and a blue sub-pixel and a demultiplexer circuit corresponding to each pixel is provided, an input signal can be distributed by the demultiplexer circuit to be input to each sub-pixel. Consequently, the number of input terminals can be reduced to ⅓.

The transistors 100t and 100u having high on-state current are provided in the pixel portion; thus, signal delay in wirings can be reduced and display unevenness can be suppressed even in a large-sized display device or a high-resolution display device in which the number of wirings is increased. Note that the luminance of an EL element included in a light-emitting device is proportional to the amount of current flowing in a transistor that controls the operation of the EL element. Therefore, when a transistor with high on-state current and high field-effect mobility like the transistor 100u is used as the transistor that controls the operation of the EL element, the luminance of the EL element can be increased. Furthermore, since the transistor 100u has high on-state current, the plane area occupied by the transistor can be small, which leads to higher degree of freedom in the location of the transistor in a pixel. Accordingly, the display device can have high resolution.

As described above, when a driver circuit portion is formed using a transistor capable of high-speed operation and a pixel portion is formed using a transistor with small parasitic capacitance and small parasitic resistance, a high-resolution display device capable of double-frame rate driving can be manufactured.

The structure shown in FIG. 12 is described in detail below. Here, details of the structure of the transistor 100s are mainly described.

In the transistors 100s, the oxide semiconductor film 105 and the oxide semiconductor film 106 included in the multilayer film 107 have different compositions. In the transistors 100u, the oxide semiconductor film 145 and the oxide semiconductor film 146 included in the multilayer film 147 have different compositions. The oxide semiconductor film 105 included in the multilayer film 107 and the oxide semiconductor film 145 included in the multilayer film 147 have the same composition. Furthermore, the oxide semiconductor film 106 included in the multilayer film 107, the oxide semiconductor film 108, and the oxide semiconductor film 146 included in the multilayer film 147 have the same composition. In other words, the oxide semiconductor film 105 and the oxide semiconductor film 145 are formed at the same time, and the oxide semiconductor film 106, the oxide semiconductor film 108, and the oxide semiconductor film 146 are formed at the same time.

A channel of the transistor 100u is formed in the oxide semiconductor film 145. Accordingly, the oxide semiconductor film 145 has a larger thickness than the oxide semiconductor film 146.

The oxide semiconductor film 145 can have a desired thickness within the thickness range of the oxide semiconductor film 105.

The oxide semiconductor films 145 and 146 can be formed using the materials for the oxide semiconductor films 105, 106, and 108 as appropriate. The oxide semiconductor film 145 has a higher indium content than the oxide semiconductor film 146; therefore, a buried channel can be formed in the transistor 100u. Thus, variations in the threshold voltage of the transistor 100u can be reduced and channel resistance can be lowered.

Specifically, the oxide semiconductor film 145 can be formed using the material for the oxide semiconductor film 105 as appropriate.

Specifically, the oxide semiconductor film 146 can be formed using the material for the oxide semiconductor films 106 and 108 as appropriate.

The transistor 100u has high field-effect mobility because a channel is formed in the oxide semiconductor film 145 in which the proportion of In atoms is higher than that of Al (M is Mg, Al, Ti, Ga, Y, Zr, La, Ce, Nd, or Hf) atoms. Typically, the transistor has a field-effect mobility of greater than 10 $cm^2/V \cdot s$ and less than 60 $cm^2/V \cdot s$, preferably greater than or equal to 15 $cm^2/V \cdot s$ and less than 50 $cm^2/V \cdot s$. However, the off-state current of the transistor is increased due to light irradiation, Therefore, by providing a light-blocking film overlapping with the transistor 100u, a transistor with high field-effect mobility and low off-state current is obtained. Consequently, a transistor capable of high-speed operation can be formed.

In the multilayer film 147, it is preferable to reduce the concentrations of silicon or carbon that is one of elements belonging to Group 14, alkali metal or alkaline earth metal, nitrogen, an impurity element, and the like. Typically, when the multilayer film 147 has concentrations of silicon or carbon that is one of elements belonging to Group 14, alkali metal or alkaline earth metal, nitrogen, an impurity element, and the like that are substantially equal to those of the multilayer film 107, the transistor 100u has positive threshold voltage (normally-off characteristics).

By reducing the impurity elements in the multilayer film 147, in particular, the channel region 147a, as in the channel region 107a, the carrier density of the oxide semiconductor films can be lowered.

Oxide semiconductor films each having a low impurity concentration and a low density of defect states can be used for the multilayer film 147, in which case the transistor can have more excellent electrical characteristics. Here, the state in which impurity concentration is low and density of defect states is low (the amount of oxygen vacancy is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has low density of trap states in some cases. Furthermore, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

The oxide semiconductor films 145 and 146 can have any of the crystal structures for the oxide semiconductor films 105, 106, and 108 as appropriate.

Note that in the multilayer film 147, the channel region 147a and the low-resistance regions 147b and 147c might differ in crystallinity. These cases are due to damage to the low-resistance regions 147b and 147c, which lowers their crystallinity, when the impurity element is added to the low-resistance regions 147b and 147c.

<Structure 2 of Semiconductor Device>

Figure 14:
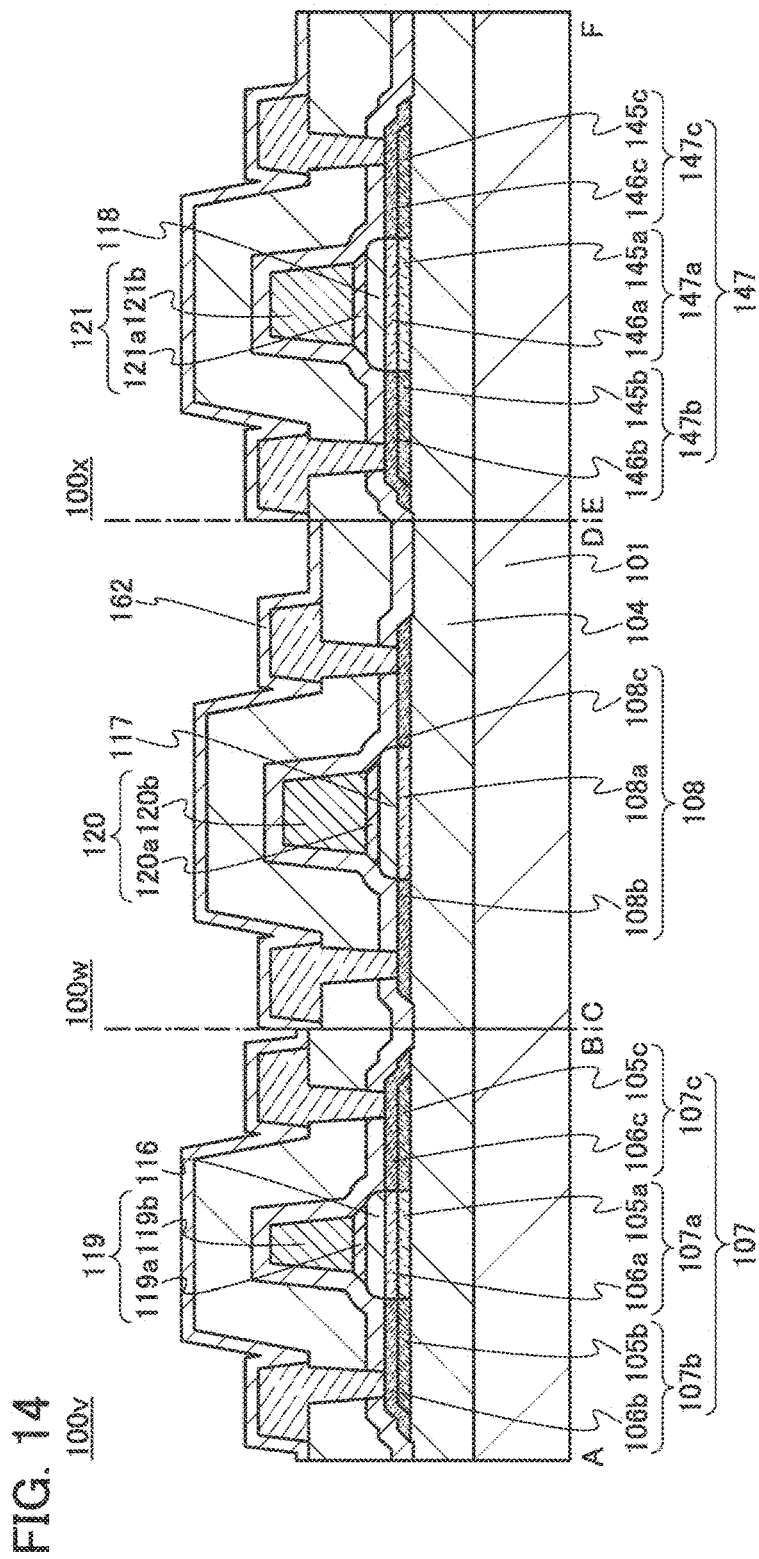
FIG. 14 is a cross-sectional view illustrating one embodiment of a semiconductor device.
Figure 15:
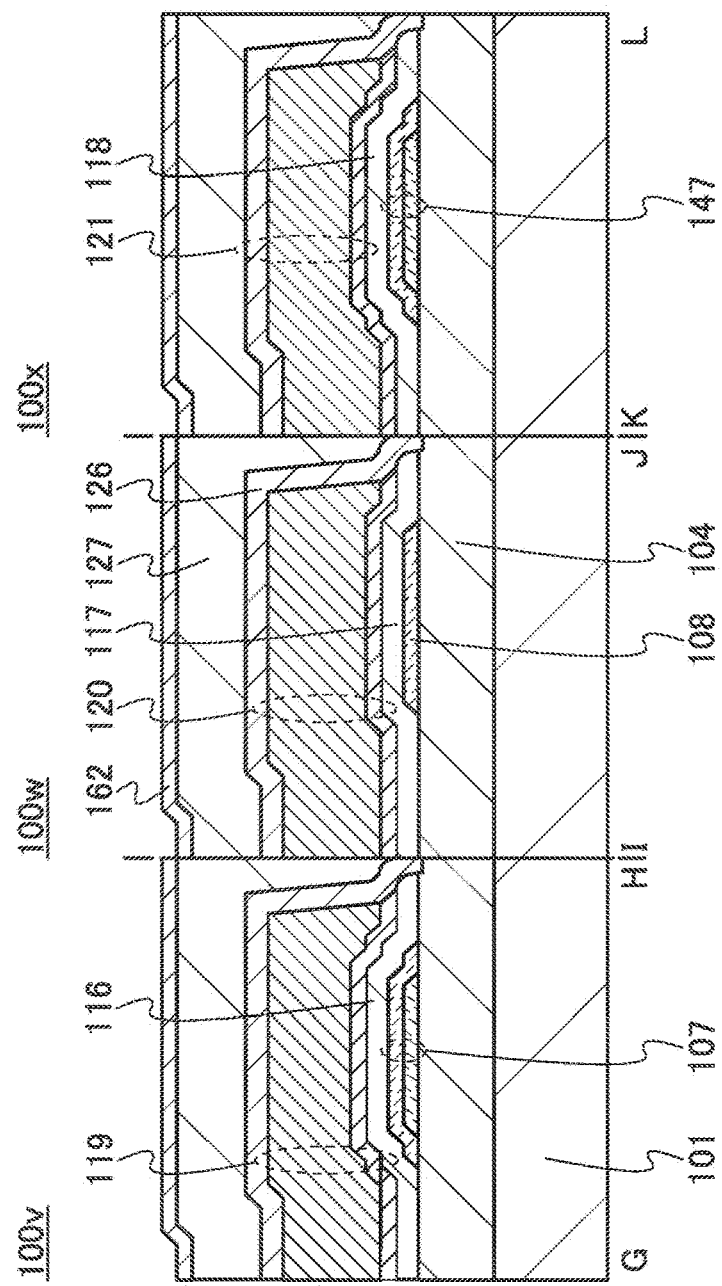
FIG. 15 is a cross-sectional view illustrating one embodiment of a semiconductor device.

Next, another structure of the semiconductor device is described with reference to FIG. 14 and FIG. 15. Here, in a transistor 100v formed in a driver circuit portion and transistors 100w and 100x formed in a pixel portion, the conductive films 119, 120, and 121 functioning as gate electrodes each have a stacked-layer structure. FIG. 14 shows cross-sectional views of the transistors 100v, 100w, and 100x in the channel length direction, and FIG. 15 shows cross-sectional views of the transistors 100v, 100w, and 100x in the channel width direction. The transistor 100v has the same structure as the transistor 100i described in Embodiment 1; therefore, the description of the transistor 100i in Embodiment 1 can be referred to for detailed description of the transistor 100v. The transistor 100w has the same structure as the transistor 100j described in Embodiment 1; therefore, the description of the transistor 100j in Embodiment 1 can be referred to for detailed description of the transistor 100w. The transistor 100x has the same structure as the transistor 100v described in this embodiment.

The conductive film 121 included in the transistor 100x includes a conductive film 121a in contact with the insulating film 118 and a conductive film 121b in contact with the conductive film 121a. The end portion of the conductive film 121a is positioned on an outer side than the end portion of the conductive film 121b. In other words, the conductive film 121a has such a shape that the end portion extends beyond the end portion of the conductive film 121b.

The end portion of the insulating film 118 is positioned on an outer side than the end portion of the conductive film 121a. In other words, the insulating film 118 has such a shape that the end portion extends beyond the end portion of the conductive film 121a. Furthermore, a side surface of the insulating film 118 may be curved.

The conductive film 121a can be formed using the material for the conductive films 119a and 120a as appropriate. The conductive film 121b can be formed using the material for the conductive films 119b and 120b as appropriate.

Note that when the concentration of copper in the channel region in the multilayer film 147 is within the range given for the multilayer film 107, a transistor having an excellent subthreshold swing value (S value) can be manufactured.

As in the transistors 100v and 100w, when the conductive film 121 and the insulating film 118 having the shapes shown in FIG. 14 and FIG. 15 are provided in the transistor 100x, the electric field of the drain region of the transistor can be relaxed. Thus, deterioration of the transistor due to the electric field of the drain region, such as a shift of the threshold voltage of the transistor, can be inhibited.

<Structure 3 of Semiconductor Device>

Figure 16:
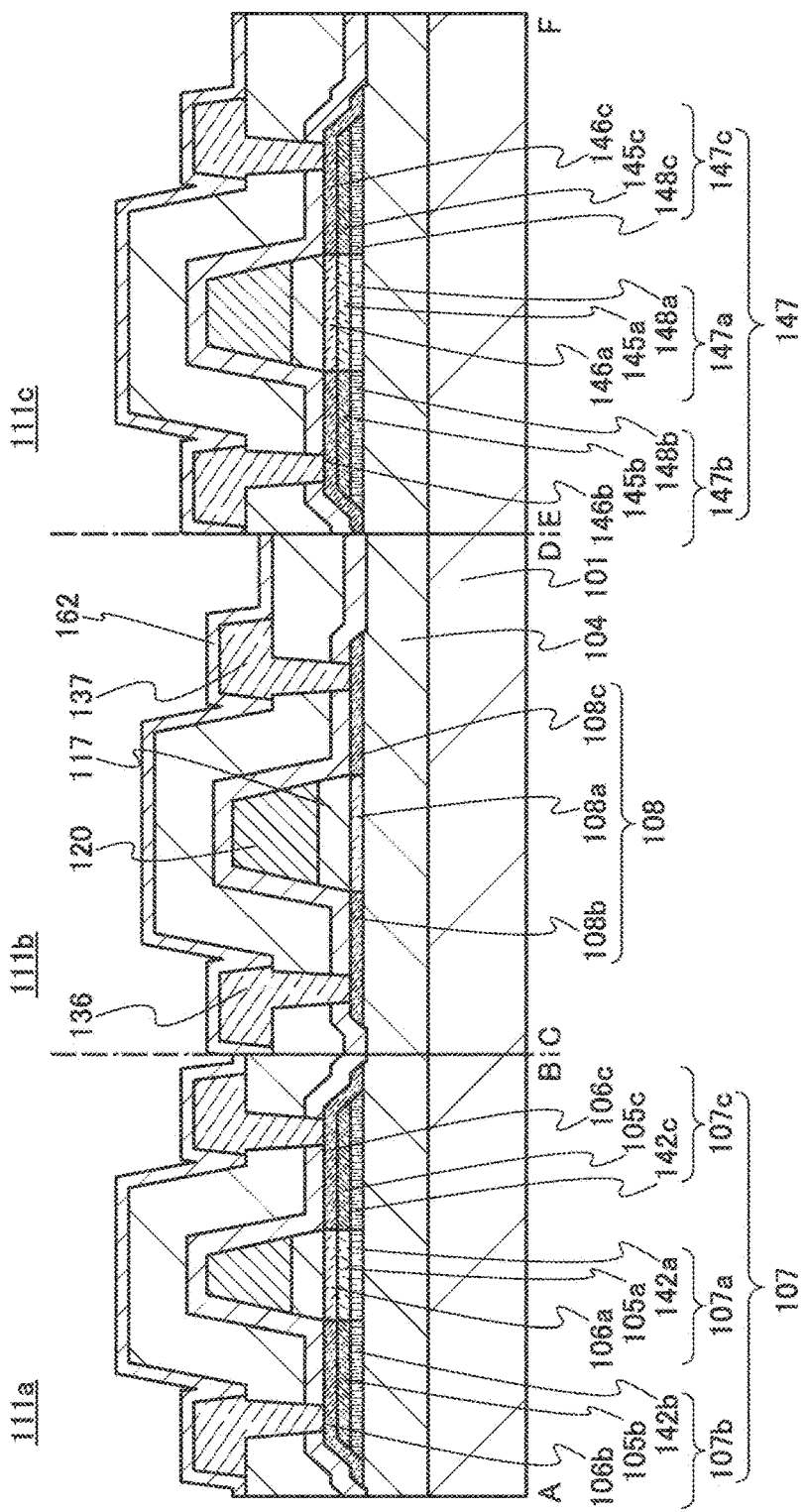
FIG. 16 is a cross-sectional view illustrating one embodiment of a semiconductor device.

Next, other structures of the semiconductor device are described with reference to FIG. 16 and FIG. 17. Here, transistors 111a and 111d formed in a driver circuit portion and transistors 111b, 111c, 111e, and 111f formed in a pixel portion each include a multilayer film. FIG. 16 shows cross-sectional views of the transistors 111a, 111b, and 111c in the channel length direction, and FIG. 17 shows cross-sectional views of the transistors 111d, 111e, and 111f in the channel length direction.

The transistor 111a has the same structure as the transistor 111w described in Embodiment 1; therefore, the description of the transistor 111w in Embodiment 1 can be referred to for detailed description of the transistor 111a. The transistor 111b has the same structure as the transistor 100h described in Embodiment 1; therefore, the description of the transistor 100h in Embodiment 1 can be referred to for detailed description of the transistor 111b. The transistor 111c has the same structure as the transistor 111a described in this embodiment; therefore, the description of the transistor 111w in Embodiment 1 can be referred to for detailed description of the transistor 111c. The transistor 111d has the same structure as the transistor 111x described in Embodiment 1; therefore, the description of the transistor 111x in Embodiment 1 can be referred to for detailed description of the transistor 111d. The transistor 111e has the same structure as the transistor 111y described in Embodiment 1; therefore, the description of the transistor 111y in Embodiment 1 can be referred to for detailed description of the transistor 111e. The transistor 111f has the same structure as the transistor 111d described in this embodiment; therefore, the description of the transistor 111x in Embodiment 1 can be referred to for detailed description of the transistor 111f.

The multilayer film 147 included in the transistor 111c in FIG. 16 includes the channel region 147a and the low-resistance regions 147b and 147c. The channel region 147a includes a channel region 148a in contact with the insulating film 104, the channel region 145a in contact with the channel region 148a, and the channel region 146a in contact with the channel region 145a. The low-resistance region 147b includes a low-resistance region 148b in contact with the insulating film 104, the low-resistance region 145b in contact with the low-resistance region 148b, and the low-resistance region 146b in contact with the low-resistance region 145b. The low-resistance region 147c includes a low-resistance region 148c in contact with the insulating film 104, the low-resistance region 145c in contact with the low-resistance region 148c, and the low-resistance region 146c in contact with the low-resistance region 145c. Note that although not shown in FIG. 16, an oxide semiconductor film including the channel region 148a, the low-resistance region 148b, and the low-resistance region 148c is referred to as an oxide semiconductor film 148. That is, in the multilayer film 147, the oxide semiconductor film 148, the oxide semiconductor film 145, and the oxide semiconductor film 146 are stacked in this order.

The multilayer film 147 included in the transistor 111f in FIG. 17 includes the channel region 147a and the low-resistance regions 147b and 147c. The channel region 147a includes the channel region 148a in contact with the insulating film 104, the channel region 145a in contact with the channel region 148a, the channel region 146a in contact with the channel region 145a, and a channel region 149a in contact with the channel region 146a. The low-resistance region 147b includes the low-resistance region 148b in contact with the insulating film 104, the low-resistance region 145b in contact with the low-resistance region 148b, the low-resistance region 146b in contact with the low-resistance region 145b, and a low-resistance region 149b in contact with the low-resistance region 146b. The low-resistance region 147c includes the low-resistance region 148c in contact with the insulating film 104, the low-resistance region 145c in contact with the low-resistance region 148c, the low-resistance region 146e in contact with the low-resistance region 145c, and a low-resistance region 149c in contact with the low-resistance region 146c. Note that although not shown in FIG. 17, an oxide semiconductor film including the channel region 149a, the low-resistance region 149b, and the low-resistance region 149c is referred to as an oxide semiconductor film 149. That is, in the multilayer film 147, the oxide semiconductor film 148, the oxide semiconductor film 145, the oxide semiconductor film 146, and the oxide semiconductor film 149 are stacked in this order.

The oxide semiconductor films 148 and 149 each preferably have a larger energy gap, a lower electron affinity, and a higher insulating property than the oxide semiconductor films 145 and 146. In addition, the oxide semiconductor films 148 and 149 each preferably have a lower indium content than the oxide semiconductor films 145 and 146. The oxide semiconductor films 148 and 149 preferably have a function of blocking external impurity. In such an oxide semiconductor film, the proportion of In atoms is lower than that of M (M is Mg, Al, Ti, Ga, Y, Zr, La, Ce, Nd, or Hf) atoms. In the case where the oxide semiconductor films 148 and 149 contain an In-M-Zn oxide (M is Mg, Al, Ti, Ga, Y, Zr, La, Ce, Nd, or Hf), and a target having the atomic ratio of the metal elements of In:M:Zn=$x_3$:$y_3$:$z_3$ is used for foaming the oxide semiconductor films 148 and 149, $x_3/y_3$ is preferably greater than or equal to ⅙ and less than 1; $z_3/y_3$ is preferably greater than or equal to ⅓ and less than or equal to 6, further preferably greater than or equal to 1 and less than or equal to 6. Note that when $z_3/y_3$ is greater than or equal to 1 and less than or equal to 6, CAAC-OS films are easily formed as the oxide semiconductor films 148 and 149.

Typical examples of the atomic ratio of the metal elements of the target are In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

In the transistor 111a shown in FIG. 16, the oxide semiconductor film 142 has a larger energy gap and a lower electron affinity than the oxide semiconductor film 105; therefore, a channel is formed in the oxide semiconductor film 105. That is, a buried channel structure is obtained. The oxide semiconductor film 106 and the oxide semiconductor film 142 contain one or more kinds of metal elements that form the oxide semiconductor film 105. Therefore, an interface state is not easily formed at the interface between the oxide semiconductor film 105 and the oxide semiconductor film 106 and at the interface between the oxide semiconductor film 105 and the oxide semiconductor film 142. Thus, providing the oxide semiconductor film 106 and the oxide semiconductor film 142 makes it possible to reduce variations or changes in electrical characteristics of the transistor, such as threshold voltage. Note that a similar effect is obtained with the transistor 111c.

Similarly, in the transistor 111d shown in FIG. 17, the oxide semiconductor films 142 and 143 each have a larger energy gap and a lower electron affinity than the oxide semiconductor films 105 and 106; therefore, a channel is formed in the oxide semiconductor film 105. That is, a buried channel structure is obtained. The multilayer film 107 includes the oxide semiconductor films 142 and 143. Therefore, an interface state is not easily formed at the interface between the oxide semiconductor film 142 and the oxide semiconductor film 105, at the interface between the oxide semiconductor film 105 and the oxide semiconductor film 106, and at the interface between the oxide semiconductor film 106 and the oxide semiconductor film 143. Consequently, variations or changes in electrical characteristics of the transistor, such as threshold voltage, can be reduced. Note that a similar effect is obtained with the transistor 111f.

Similarly, in the transistor 111e shown in FIG. 17, the multilayer film 110 includes the oxide semiconductor film 144; therefore, an interface state is not easily formed at the interface between the oxide semiconductor film 144 and the oxide semiconductor film 108, Consequently, variations or changes in electrical characteristics of the transistor, such as threshold voltage, can be reduced.

<Structure 4 of Semiconductor Device>

Figure 20:
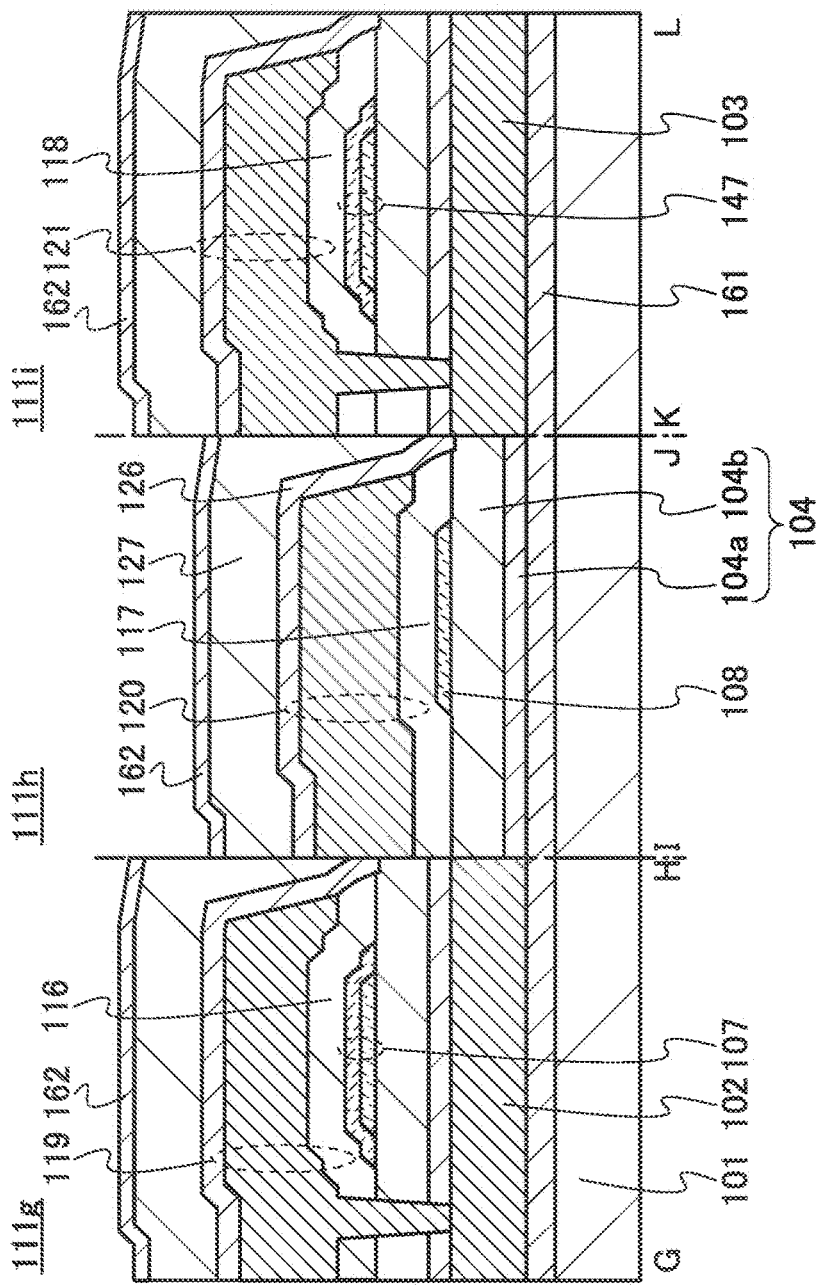
FIG. 20 is a cross-sectional view illustrating one embodiment of a semiconductor device.

Next, another structure of the semiconductor device is described with reference to FIGS. 18A to 18C, FIG. 19, and FIG. 20. Here, a transistor 111g formed in a driver circuit portion and a transistor 111i formed in a pixel portion each have a dual-gate structure. FIG. 18A, FIG. 18B, and FIG. 18C are top views of the transistor 111g, a transistor 111h, and the transistor 111i, respectively. FIG. 19 shows cross-sectional views along the dashed-dotted line A-B in FIG. 18A, the dashed-dotted line C-D in FIG. 18B, and the dashed-dotted line E-F in FIG. 18C. FIG. 20 shows cross-sectional views along the dashed-dotted line G-H in FIG. 18A, the dashed-dotted line in FIG. 18B, and the dashed-dotted line K-L in FIG. 18C.

The transistor 111g shown in FIG. 19 and FIG. 20 includes the conductive film 102 over the substrate 101, the insulating film 104 over the substrate 101 and the conductive film 102, the multilayer film 107 over the insulating film 104, the insulating film 116 in contact with the multilayer film 107, and the conductive film 119 overlapping with the multilayer film 107 with the insulating film 116 provided therebetween. The structure of the multilayer film 107 is similar to that of the multilayer film 107 described in <Structure 1 of semiconductor device> and therefore is not described in detail here.

The conductive films 102 and 119 function as gate electrodes. That is, the transistor 111g is a transistor having a dual-gate structure. The insulating films 104 and 116 function as gate insulating films.

The transistor 111h can have a structure similar to that of the transistor 100t described in <Structure 1 of semiconductor device> and therefore is not described in detail here.

The transistor 111i shown in FIG. 19 and FIG. 20 includes a conductive film 103 over the substrate 101, the insulating film 104 over the substrate 101 and the conductive film 103, the multilayer film 147 over the insulating film 104, the insulating film 118 in contact with the multilayer film 147, and the conductive film 121 overlapping with the multilayer film 147 with the insulating film 118 provided therebetween. The structure of the multilayer film 147 is similar to that of the multilayer film 147 described in <Structure 1 of semiconductor device> and therefore is not described in detail here.

The nitride insulating film 161 is preferably provided over the substrate 101. Examples of the nitride insulating film 161 include a silicon nitride film and an aluminum nitride film. Covering the conductive films 102 and 103 with the nitride insulating film 161 and the insulating film 104a makes it possible to prevent diffusion of metal elements contained in the conductive films 102 and 103.

The conductive films 103 and 121 function as gate electrodes. That is, the transistor 111i is a transistor having a dual-gate structure. The insulating films 104 and 118 function as gate insulating films.

Note that the conductive films 102 and 103 overlap with the entire multilayer film 107 and the entire multilayer film 147, respectively, in FIG. 19 and FIG. 20; however, the conductive films 102 and 103 may overlap with part of the multilayer film 107 and part of the multilayer film 147, respectively.

In the transistor 111g, different potentials are supplied to the conductive film 102 and the conductive film 119 which are not connected to each other; thus, the threshold voltage of the transistor 111g can be controlled. Alternatively, as shown in FIG. 20, by supplying the same potential to the conductive film 102 and the conductive film 119 which are connected to each other, variations in the initial characteristics can be reduced, and degradation of the transistor due to the −GBT (negative gate bias-temperature) stress test and a change in the rising voltage of the on-state current at different drain voltages can be suppressed. Furthermore, when the conductive film 102 and the conductive film 119 are connected to each other as shown in FIG. 20, electric fields of the conductive films 102 and 119 affect a top surface and a side surface of the multilayer film 107, so that carriers flow in the entire multilayer film 107. In other words, a region where carriers flow becomes larger in the film thickness direction, so that the amount of carrier movement is increased. As a result, the on-state current and field-effect mobility of the transistor 111g are increased. When the channel length of the transistor is less than 2.5 μm, preferably greater than or equal to 1.45 μm and less than or equal to 2.2 μm, the on-state current can be further increased and the field-effect mobility can be increased. Owing to the high on-state current, the transistor 111g can have a small plane area. Consequently, a display device with a narrow bezel in which the area occupied by a driver circuit portion is small can be manufactured.

Note that an effect similar to that obtained with the transistor 111g can be obtained when the conductive film 103 and the conductive film 121 are connected to each other in the transistor 111i. Thus, the plane area occupied by the transistor can be small, which leads to higher degree of freedom in the location of the transistor in a pixel. Accordingly, the display device can have high resolution.

In the display device described in this embodiment, the transistor included in the driver circuit portion has a dual-gate structure. That is, the field-effect mobility of the transistor included in the driver circuit portion is higher than that of the transistor included in the pixel portion. Consequently, a driver circuit portion capable of high-speed operation can be formed. Furthermore, when a driver circuit portion is formed using a transistor capable of high-speed operation and a pixel portion is formed using a transistor with small parasitic capacitance and small parasitic resistance, a high-resolution display device capable of double-frame rate driving can be manufactured.

<Structure 5 of Semiconductor Device>

Figure 21A:
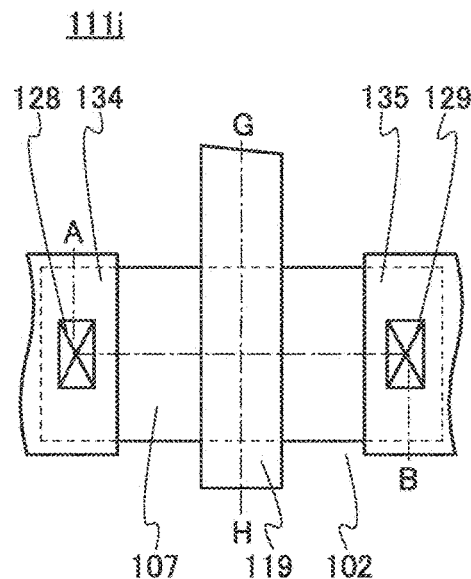
FIGS. 21A to 21C are top views illustrating one embodiment of a semiconductor device.
Figure 21B:
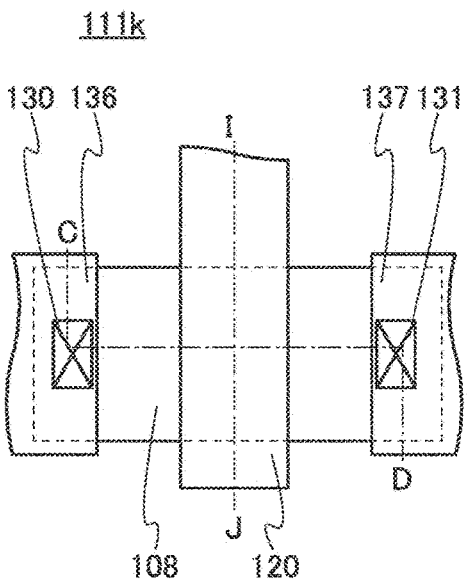
Figure 21C:
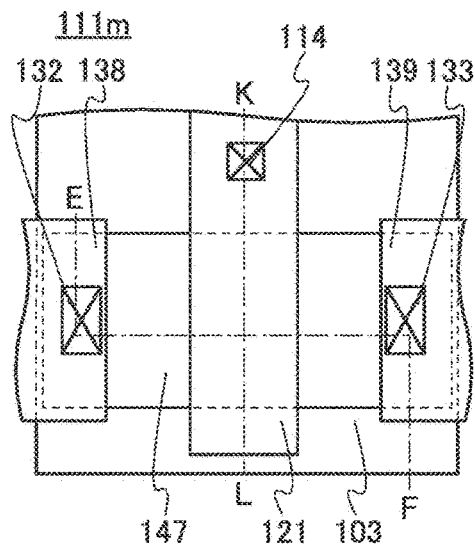
Figure 22:
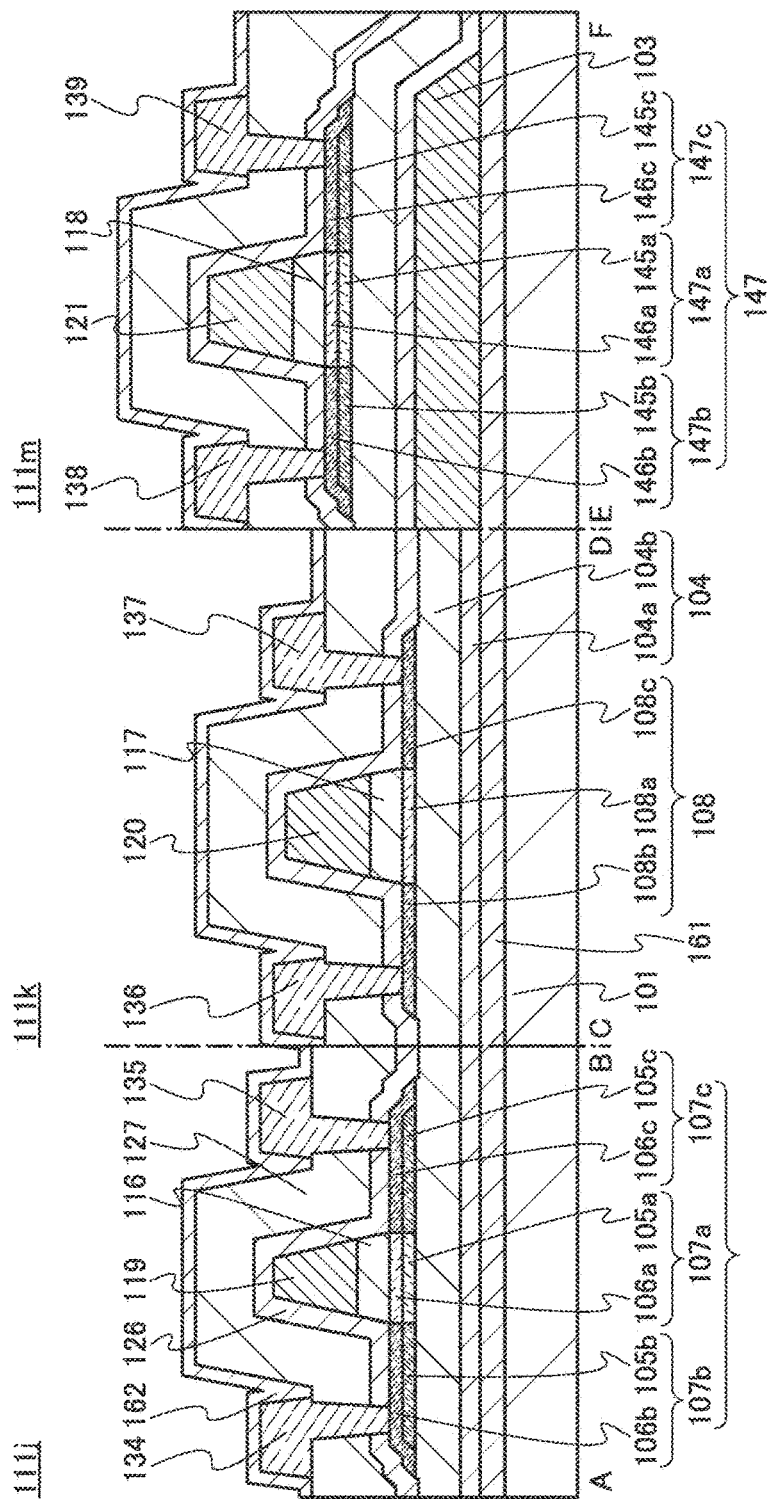
FIG. 22 is a cross-sectional view illustrating one embodiment of a semiconductor device.
Figure 23:
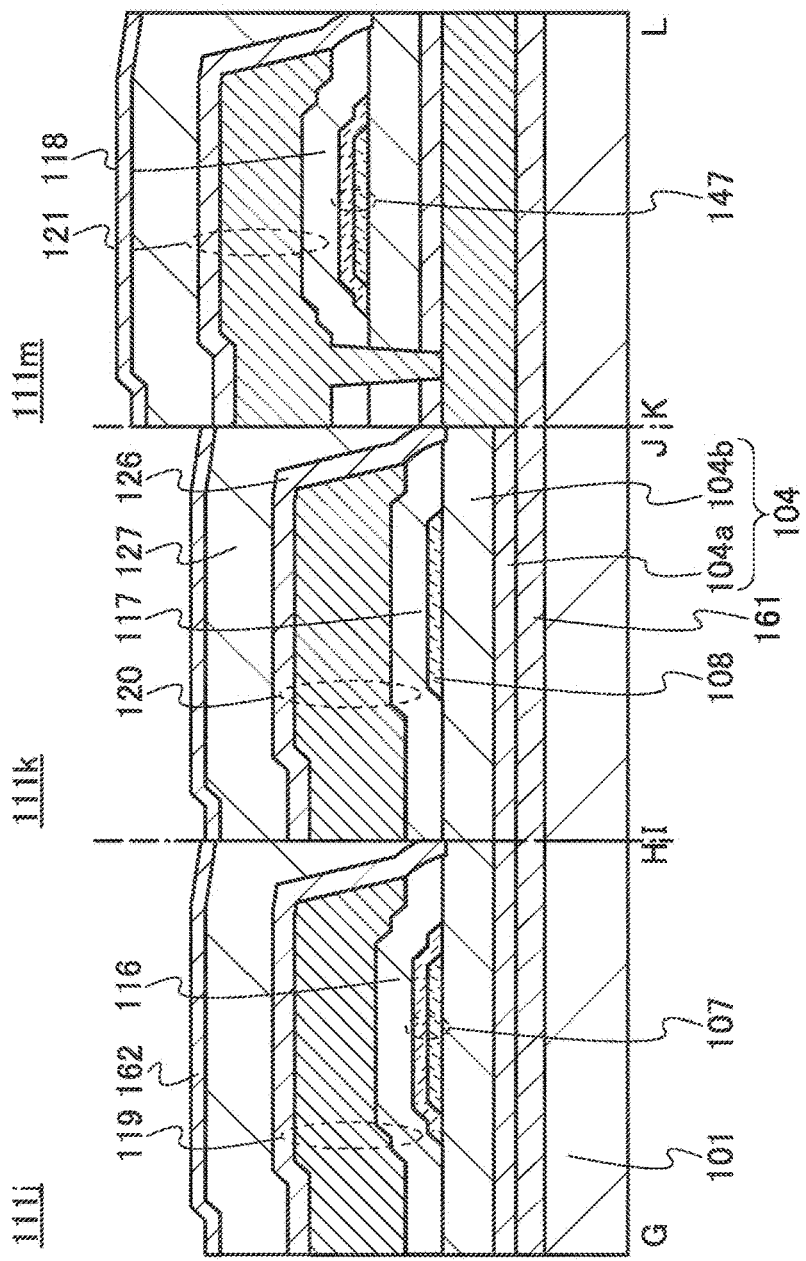
FIG. 23 is a cross-sectional view illustrating one embodiment of a semiconductor device.

Next, another structure of the semiconductor device is described with reference to FIGS. 21A to 21C, FIG. 22, and FIG. 23. Here, a transistor 111m formed in a pixel portion has a dual-gate structure. FIG. 21A, FIG. 21B, and FIG. 21C are top views of a transistor 111j, a transistor 111k, and the transistor 111m, respectively. FIG. 22 shows cross-sectional views along the dashed-dotted line A-B in FIG. 21A, the dashed-dotted line C-D in FIG. 21B, and the dashed-dotted line E-F in FIG. 21C. FIG. 23 shows cross-sectional views along the dashed-dotted line G-H in FIG. 21A, the dashed-dotted line in FIG. 21B, and the dashed-dotted line K-L in FIG. 21C.

The transistor 111j in FIG. 22 and FIG. 23 has a single-gate structure like the transistor 100s described in <Structure 1 of semiconductor device> and therefore is not described in detail here.

The transistor 111k in FIG. 22 and FIG. 23 has the same structure as the transistor 100t described in <Structure 1 of semiconductor device> and therefore is not described in detail here.

The transistor 111m in FIG. 22 and FIG. 23 has a dual-gate structure like the transistor 111i described in <Structure 4 of semiconductor device> and therefore is not described in detail here.

In the display device described in this embodiment, the transistor (e.g., the transistors 111i and 111m) provided in the pixel portion includes the conductive films 103 and 121 which block entry of light to the multilayer film 147. Thus, the transistor (e.g., the transistors 111i and 111m) has high field-effect mobility and low off-state current. Therefore, the plane area occupied by the transistor can be small, which leads to higher degree of freedom in the location of the transistor in a pixel, and deterioration of image quality can be suppressed. Accordingly, the display device can have high image quality and high resolution. Furthermore, when the pixel portion is formed using a transistor with small parasitic capacitance and small parasitic resistance, a high-resolution display device capable of double-frame rate driving can be manufactured.

<Method 1 for manufacturing semiconductor device>

Next, a method for manufacturing the transistors 100s, 100t, and 100u illustrated in FIGS. 11A to 11C, FIG. 12, and FIG. 13 will be described with reference to FIGS. 24A and 24B, FIGS. 25A and 25B, FIGS. 26A and 26B, and FIGS. 27A and 27B.

The films included in the transistors 100s, 100t, and 100u (i.e., the insulating film, the oxide semiconductor film, the conductive film, and the like) can be formed by the formation methods of the films included in the transistors described in Embodiment 1 as appropriate.

As shown in FIG. 24A, the insulating film 104 is formed over the substrate 101, in a manner similar to that in Embodiment 1. Next, the oxide semiconductor film 105 is formed over the insulating film 104 in the driver circuit portion, and the oxide semiconductor film 145 is formed over the insulating film 104 in the pixel portion.

Here, a 300-nm-thick silicon oxynitride film is formed as the insulating film 104 by a plasma CVD method.

The oxide semiconductor films 105, 106, 108, 145, and 146 can be formed in manners similar to those of the oxide semiconductor films 105, 106, and 108 described in Embodiment 1.

Furthermore, after the oxide semiconductor films are formed, heat treatment may be performed so that the oxide semiconductor films are subjected to dehydrogenation or dehydration, in a manner similar to that in Embodiment 1.

Here, a 35-nm-thick oxide semiconductor film is formed by a sputtering method. Next, a mask is formed over the oxide semiconductor film, and part of the oxide semiconductor film is selectively etched. In this manner, the oxide semiconductor films 105 and 145 are formed. As the oxide semiconductor film, an In—Ga—Zn oxide film (In:Ga:Zn=3:1:2) is formed.

Next, as shown in FIG. 24B, the oxide semiconductor film 106 is formed over the oxide semiconductor film 105 in the driver circuit portion, and the oxide semiconductor film 108 is formed and the oxide semiconductor film 146 is formed over the oxide semiconductor film 145 in the pixel portion. Thus, the multilayer film 107 in which the oxide semiconductor film 105 and the oxide semiconductor film 106 are stacked in this order is formed. In addition, the multilayer film 147 in which the oxide semiconductor film 145 and the oxide semiconductor film 146 are stacked in this order is formed.

Note that in this step, the oxide semiconductor film 106 is formed to cover a top surface and a side surface of the oxide semiconductor film 105, to prevent the oxide semiconductor film 105 from being etched in a later step of forming conductive films functioning as a source electrode and a drain electrode. In addition, the oxide semiconductor film 146 is formed to cover a top surface and a side surface of the oxide semiconductor film 145, to prevent the oxide semiconductor film 145 from being etched in a later step of forming conductive films functioning as a source electrode and a drain electrode. This is preferable because variations in the lengths of the oxide semiconductor films 105 and 145 in the channel width direction of the transistors can be reduced.

Here, a 20-nm-thick oxide semiconductor film is formed by a sputtering method, Next, a mask is formed over the oxide semiconductor film, and part of the oxide semiconductor film is selectively etched. In this manner, the oxide semiconductor films 106, 108, and 146 are formed. As the oxide semiconductor films 106, 108, and 146, In—Ga—Zn oxide films (In:Ga:Zn=1:1:1.2) are formed.

Next, oxygen contained in the insulating film 104 is moved to the oxide semiconductor films by heat treatment. Note that the heat treatment may be performed at a time that is after the formation of the oxide semiconductor film to be the oxide semiconductor films 106, 108, and 146 and before the etching of the oxide semiconductor film for fainting the oxide semiconductor films 106, 108, and 146.

When the heat treatment is performed at a temperature higher than 350° C. and lower than or equal to 650° C., or higher than or equal to 450° C. and lower than or equal to 600° C., it is possible to obtain an oxide semiconductor film whose proportion of CAAC, which is described later, is greater than or equal to 60% and less than 100%, greater than or equal to 80% and less than 100%, greater than or equal to 90% and less than 100%, or greater than or equal to 95% and less than or equal to 98%. Furthermore, it is possible to obtain an oxide semiconductor film having a low content of hydrogen, water, and the like. That is, an oxide semiconductor film with a low impurity concentration and a low density of defect states can be formed.

Next, as shown in FIG. 25A, the insulating film 115 is formed over the insulating film 104, the multilayer films 107 and 147, and the oxide semiconductor film 108, in a manner similar to that in Embodiment 1. Then, the conductive films 119, 120, and 121 are formed over the insulating film 115, in a manner similar to that in Embodiment 1.

Here, a 100-nm-thick silicon oxynitride film is formed by a plasma CVD method as the insulating film 115.

Here, masks 122, 123, and 124 are formed over the conductive film by a lithography process and then the conductive film is etched, whereby the conductive films 119, 120, and 121 are formed.

Then, as shown in FIG. 25B, the insulating film 115 is etched with the masks 122, 123, and 124 left, so that the insulating films 116, 117, and 118 are formed, in a manner similar to that in Embodiment 1.

Next, as shown in FIG. 26A, the impurity element 125 is added to the multilayer films 107 and 147 and the oxide semiconductor film 108 with the masks 122, 123, and 124 left, in a manner similar to that in Embodiment 1. As a result, the impurity element is added to regions which are not covered with the masks 122, 123, and 124 in the multilayer films 107 and 147 and the oxide semiconductor film 108. Note that by the addition of the impurity element 125, an oxygen vacancy is formed in the multilayer films 107 and 147 and the oxide semiconductor film 108.

As a result, the low-resistance regions 107b and 107c can be formed in the multilayer film 107. The low-resistance regions 108b and 108c can be formed in the oxide semiconductor film 108. In addition, the low-resistance regions 147b and 147c can be formed in the multilayer film 147. After that, the masks 122, 123, and 124 are removed.

Note that when the impurity element 125 is added with the conductive films 119, 120, and 121 exposed, part of the conductive films 119, 120, and 121 are separated and attached to side surfaces of the insulating films 116, 117, and 118. This results in an increase in the leakage current of the transistors. Hence, the impurity element 125 is added to the multilayer films 107 and 147 and the oxide semiconductor film 108 with the conductive films 119, 120, and 121 covered with the masks 122, 123, and 124; thus, it is possible to prevent attachment of part of the conductive films 119, 120, and 121 to the side surfaces of the insulating films 116, 117, and 118. Alternatively, the impurity element 125 may be added to the multilayer films 107 and 147 and the oxide semiconductor film 108 after the masks 122, 123, and 124 are removed.

After that, heat treatment may be performed to further increase the conductivity of the regions to which the impurity element 125 is added, in a manner similar to that in Embodiment 1.

Next, as shown in FIG. 27A, the insulating film 126 is formed over the insulating film 104, the multilayer films 107 and 147, the oxide semiconductor film 108, the insulating films 116, 117, and 118, and the conductive films 119, 120, and 121, in a manner similar to that in Embodiment 1.

Here, a 100-nm-thick silicon nitride film is formed as the insulating film 126 by a plasma CVD method.

After that, heat treatment may be performed to further increase the conductivity of the low-resistance regions 107b, 107c, 108b, 108c, 147b, and 147c, in a manner similar to that in Embodiment 1. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

Next, the insulating film 127 may be forming as illustrated in FIG. 27A, in a manner similar to that in Embodiment 1. The insulating film 127 can reduce the parasitic capacitance between the conductive film 119 and the conductive films 134 and 135 formed later, between the conductive film 120 and the conductive films 136 and 137 formed later, and between the conductive film 121 and the conductive films 138 and 139 formed later.

Next, in a manner similar to that in Embodiment 1, openings 128, 129, 130, 131, 132, and 133 (see FIGS. 21A to 21C) are formed in the insulating films 126 and 127 to expose parts of the low-resistance regions, and then the conductive films 134, 135, 136, 137, 138, and 139 are formed. In addition, the nitride insulating film 162 is preferably formed (see FIG. 27B).

The conductive films 134, 135, 136, 137, 138, and 139 can be formed by a method similar to the formation method of the conductive films 119 and 120 as appropriate. The nitride insulating film 162 can be formed by a sputtering method, a CVD method, or the like as appropriate.

Through the above-described process, the transistors 100s, 100t, and 100u can be manufactured.

<Method 2 for Manufacturing Semiconductor Device>

Next, a method for manufacturing the transistors 111g, 111h, and 111i illustrated in FIGS. 18A to 18C, FIG. 19, and FIG. 20 is described.

The insulating film 161 is thrilled over the substrate 101, and the conductive films 102 and 103 are formed over the insulating film 161. The conductive films 102 and 103 can be formed by the formation method of the conductive films 119 and 120 as appropriate.

Then, the insulating film 104 is formed over the insulating film 161 and the conductive films 102 and 103.

After that, the multilayer films 107 and 147 and the oxide semiconductor film 108 are formed through the steps of FIGS. 24A and 24B.

Next, as shown in FIG. 25A, the insulating film 115 is formed, and then the insulating film 115 is partly etched, so that the opening 113 shown in FIG. 18A and an opening 114 shown in FIG. 18C are formed.

Then, the conductive films 119, 120, and 121 shown in FIG. 25A are formed, and then steps similar to those in FIG. 25B, FIGS. 26A and 26B, and FIGS. 27A and 27B are performed. In this manner, the transistors 111g, 111h, and 111i can be manufactured.

In the transistor described in this embodiment, the conductive films functioning as a source electrode and a drain electrode do not overlap with the conductive film functioning as a gate electrode, and thus, parasitic capacitance can be reduced and on-state current is high. Furthermore, in the transistor described in this embodiment, the low-resistance region can be formed stably; therefore, on-state current is higher and variation in the electrical characteristics of the transistor is more reduced than in a conventional transistor.

The structures, methods, and the like described in this embodiment can be used as appropriate in combination with any of the structures, methods, and the like described in the other embodiments.

Embodiment 3

In this embodiment, modification examples of the transistors described in the above embodiments will be described with reference to FIGS. 29A to 29F, FIGS. 30A to 30F, FIGS. 31A to 31E, FIGS. 32A and 32B, and FIGS. 33A to 33D. Here, the transistor formed in the pixel portion is described as a typical example. Transistors illustrated in FIGS. 29A to 29F each include the oxide semiconductor film 108 over the insulating film 104 over the substrate 101, the insulating film 117 in contact with the oxide semiconductor film 108, and the conductive film 120 in contract with the insulating film 117 and overlapping the oxide semiconductor film 108.

The transistors each include the insulating film 126 that is in contact with the oxide semiconductor film 108 and the insulating film 127 that is in contact with the insulating film 126. The conductive films 136 and 137 that are in contact with the oxide semiconductor film 108 through openings in the insulating film 126 and the insulating film 127 are also included.

Figure 29A:
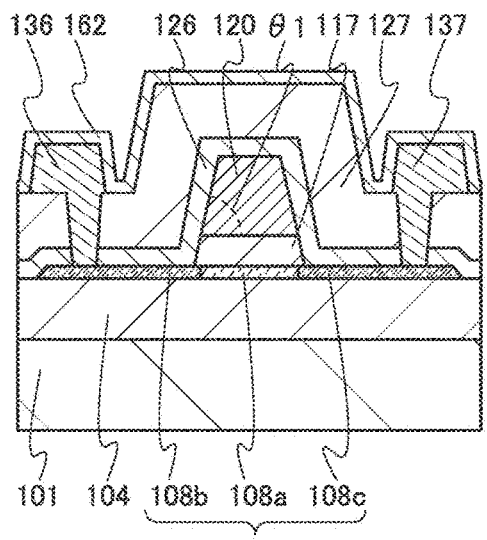
FIGS. 29A to 29F are cross-sectional views each illustrating a structure of a transistor.

In the transistor illustrated in FIG. 29A, the oxide semiconductor film 108 includes the channel region 108a formed in a region overlapping with the conductive film 120 and the low-resistance regions 108b and 108c between which the channel region 108a is provided and which contain the impurity elements. The conductive films 136 and 137 are in contact with the low-resistance regions 108b and 108c, respectively.

Figure 29B:
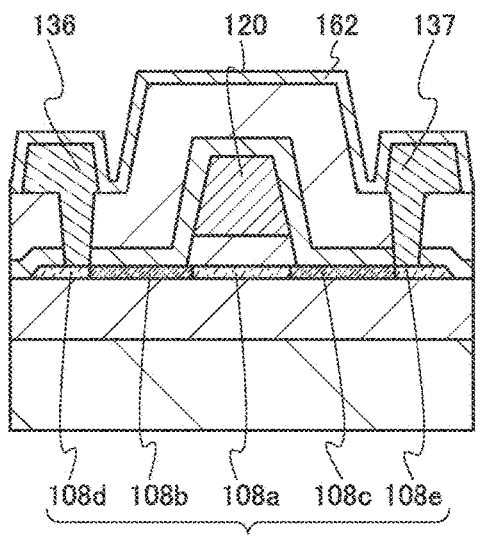

Alternatively, as in the transistor illustrated in FIG. 29B, an impurity element is not necessarily added to regions 108d and 108e of the oxide semiconductor film 108 which are in contact with the conductive films 136 and 137, respectively. In this case, regions containing the impurity elements, i.e., the low-resistance regions 108b and 108c are provided. The low-resistance region (108b or 108c) is provided between the channel region 108a and the region (108d or 108e) in contact with the conductive film (136 or 137). The regions 108d and 108e have conductivity when voltage is applied to the conductive films 136 and 137; thus, the regions 108d and 108e function as a source region and a drain region.

Note that the transistor illustrated in FIG. 29B can be formed in such a manner that the conductive films 136 and 137 are formed and then impurity elements are added to the oxide semiconductor film using the conductive film 120 and the conductive films 136 and 137 as masks.

An end portion of the conductive film 120 may have a tapered shape. That is, an angle θ1 formed between a surface where the insulating film 117 and the conductive film 120 are in contact with each other and a side surface of the conductive film 120 may be less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°. When the angle θ1 is less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°, the coverage of the side surfaces of the insulating film 117 and the conductive film 120 with the insulating film 126 can be improved.

Next, modification examples of the low-resistance regions 108b and 108c are described. FIGS. 29C to 29F are each an enlarged view of the vicinity of the oxide semiconductor film 108 illustrated in FIG. 29A. The channel length L indicates a distance between a pair of low-resistance regions.

Figure 29C:
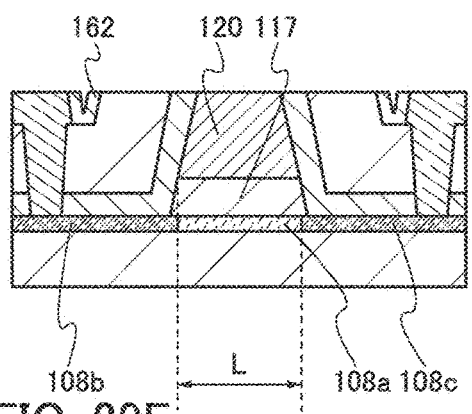

As illustrated in FIG. 29C, in a cross-sectional view in the channel length direction, the boundaries between the channel region 108a and the low-resistance regions 108b and 108c are aligned or substantially aligned with the end portions of the conductive film 120 with the insulating film 117 provided therebetween. That is, the boundaries between the channel region 108a and the low-resistance regions 108b and 108c are aligned or substantially aligned with the end portions of the conductive film 120, when seen from the above.

Figure 29D:
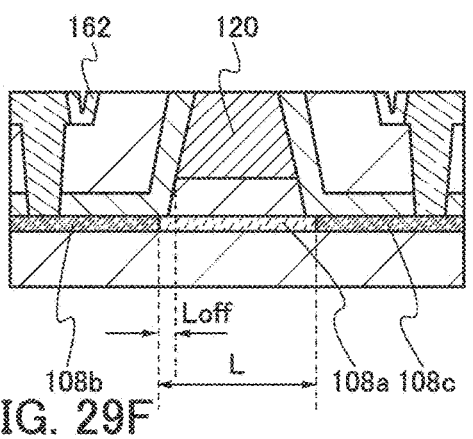

Alternatively, as illustrated in FIG. 29D, in a cross-sectional view in the channel length direction, the channel region 108a has a region that does not overlap with the end portion of the conductive film 120. The region functions as an offset region. The length of the offset region in the channel length direction is referred to as $L_{off}$. Note that in the case where a plurality of offset regions are provided, $L_{off}$ indicates the length of one offset region. $L_{off}$ is included in the channel length L. Note that $L_{off}$ is smaller than 20%, smaller than 10%, smaller than 5%, or smaller than 2% of the channel length L.

Figure 29E:
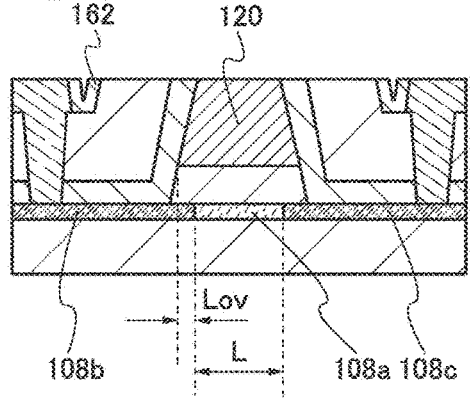

Alternatively, as illustrated in FIG. 29E, in a cross-sectional view in the channel length direction, the low-resistance regions 108b and 108c each have a region overlapping with the conductive film 120 with the insulating film 117 provided therebetween. This region functions as an overlap region. The overlap region in the channel length direction is referred to as $L_{ov}$. $L_{ov}$ is smaller than 20%, smaller than 10%, smaller than 5%, or smaller than 2% of the channel length L.

Figure 29F:
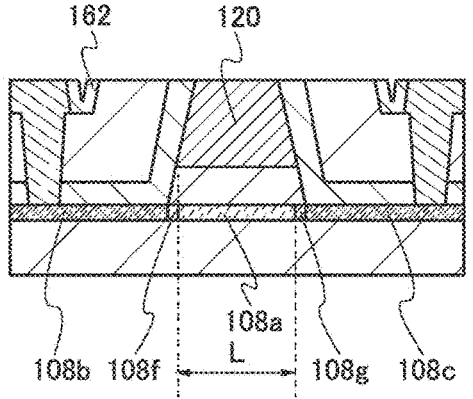

Alternatively, as illustrated in FIG. 29F, in a cross-sectional view in the channel length direction, a low-resistance region 108f between the channel region 108a and the low-resistance region 108b, and a low-resistance region 108g between the channel region 108a and the low-resistance region 108c are provided. The low-resistance regions 108f and 108g have lower impurity element concentrations and higher resistivity than the low-resistance regions 108b and 108c. Here, the low-resistance regions 108f and 108g overlap with the insulating film 117, but they may overlap with the insulating film 117 and the conductive film 120.

Note that in FIGS. 29C to 29F, the transistor illustrated in FIG. 29A is described; however, the transistor illustrated in FIG. 29B can employ any of the structures in FIGS. 29C to 29F as appropriate.

Figure 30A:
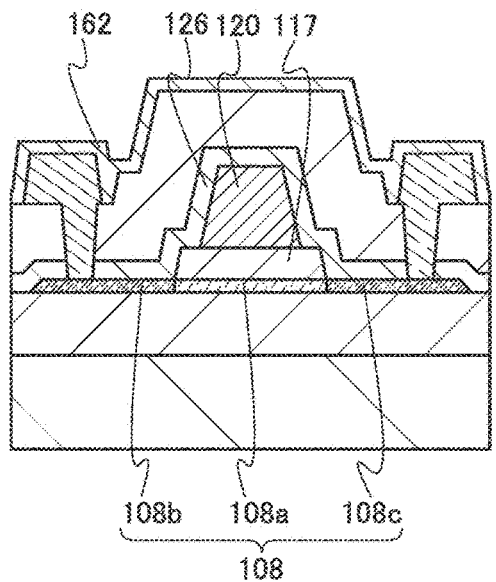
FIGS. 30A to 30F are cross-sectional views each illustrating a structure of a transistor.

In the transistor illustrated in FIG. 30A, the end portion of the insulating film 117 is positioned on an outer side than the end portion of the conductive film 120. In other words, the insulating film 117 has such a shape that the end portion extends beyond the end portion of the conductive film 120. The insulating film 126 can be distanced from the channel region 108a; thus, nitrogen, hydrogen, and the like contained in the insulating film 126 can be prevented from entering the channel region 108a.

Figure 30B:
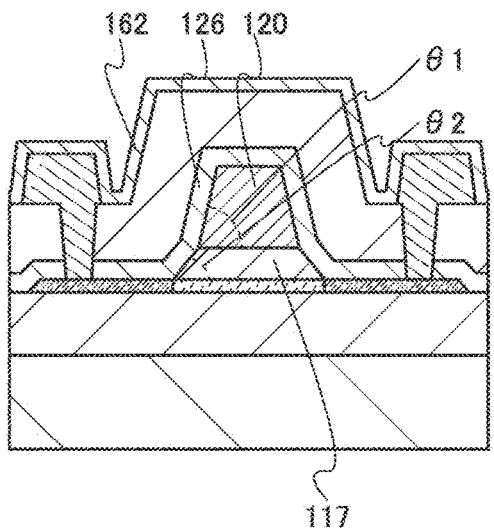

In the transistor illustrated in FIG. 30B, the insulating film 117 and the conductive film 120 each have a tapered shape, and the angles of the tapered shapes are different from each other. In other words, the angle θ1 formed between a surface where the insulating film 117 and the conductive film 120 are in contact with each other and a side surface of the conductive film 120 is different from an angle θ2 formed between a surface where the oxide semiconductor film 108 and the insulating film 117 are in contact with each other and a side surface of the insulating film 117. The angle θ2 may be less than 90°, greater than or equal to 30° and less than or equal to 85°, or greater than or equal to 45° and less than or equal to 70°. For example, when the angle θ2 is smaller than the angle θ1, the coverage with the insulating film 126 is improved. In contrast, when the angle θ2 is larger than the angle θ1, the transistor can be miniaturized.

Next, modification examples of the low-resistance regions 108b and 108c are described with reference to FIGS. 30C to 30F. FIGS. 30C to 30F are each an enlarged view of the vicinity of the oxide semiconductor film 108 illustrated in FIG. 30A.

Figure 30C:
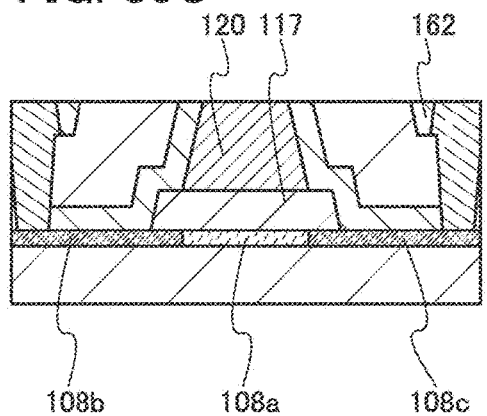

As illustrated in FIG. 30C, in a cross-sectional view in the channel length direction, the boundaries between the channel region 108a and the low-resistance regions 108b and 108c are aligned or substantially aligned with the end portions of the conductive film 120 with the insulating film 117 provided therebetween. That is, the boundaries between the channel region 108a and the low-resistance regions 108b and 108c are aligned or substantially aligned with the end portions of the conductive film 120, when seen from the above.

Figure 30D:
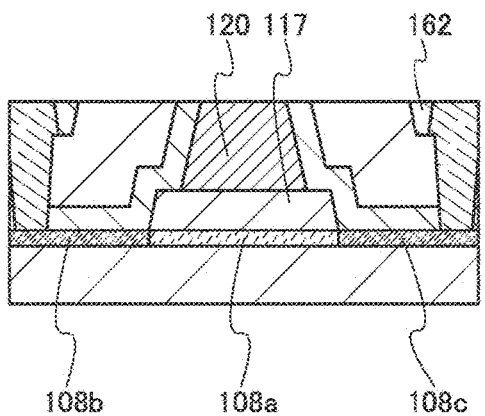

Alternatively, as illustrated in FIG. 30D, in a cross-sectional view in the channel length direction, the channel region 108a has a region that does not overlap with the conductive film 120. The region functions as an offset region. That is, when seen from the above, the end portions of the low-resistance regions 108b and 108c are aligned or substantially aligned with the end portions of the insulating film 117 and do not overlap with the end portions of the conductive film 120.

Figure 30E:
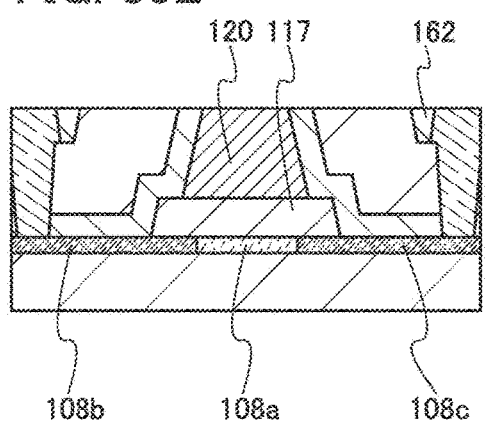

Alternatively, as illustrated in FIG. 30E, in a cross-sectional view in the channel length direction, the low-resistance regions 108b and 108c each have a region overlapping with the conductive film 120 with the insulating film 117 provided therebetween. The region is referred to as an overlap region. That is, when seen from the above, the end portions of the low-resistance regions 108b and 108c overlap with the conductive film 120.

Figure 30F:
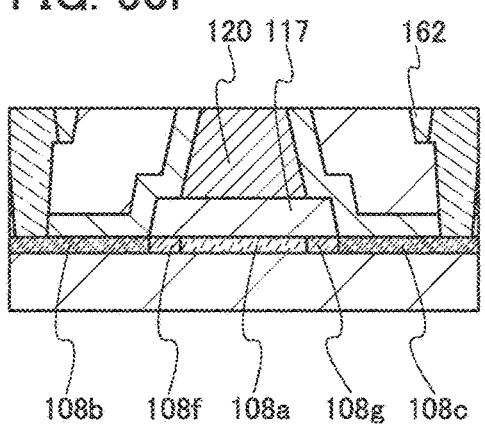

Alternatively, as illustrated in FIG. 30F, in a cross-sectional view in the channel length direction, the low-resistance region 108f between the channel region 108a and the low-resistance region 108b, and the low-resistance region 108g between the channel region 108a and the low-resistance region 108c are provided. The low-resistance regions 108f and 108g have lower impurity element concentrations and higher resistivity than the low-resistance regions 108b and 108c. Here, the low-resistance regions 108f and 108g overlap with the insulating film 117, but they may overlap with the insulating film 117 and the conductive film 120.

Note that in FIGS. 30C to 30F, the transistor illustrated in FIG. 30A is described; however, the transistor illustrated in FIG. 30B can employ any of the structures in FIGS. 30C to 30F as appropriate.

In the transistor illustrated in FIG. 31A, the conductive film 120 has a stacked-layer structure including the conductive film 120a in contact with the insulating film 117 and the conductive film 120b in contact with the conductive film 120a. The end portion of the conductive film 120a is positioned on an outer side than the end portion of the conductive film 120b. In other words, the conductive film 120a has such a shape that the end portion extends beyond the end portion of the conductive film 120b.

Next, modification examples of the low-resistance regions 108b and 108c are described. FIGS. 31B to 31E and FIGS. 32A and 32B are each an enlarged view of the vicinity of the oxide semiconductor film 108 illustrated in FIG. 31A.

As illustrated in FIG. 31B, in a cross-sectional view in the channel length direction, the boundaries between the channel region 108a and the low-resistance regions 108b and 108c are aligned or substantially aligned with the end portions of the conductive film 120a in the conductive film 120 with the insulating film 117 provided therebetween. That is, the boundaries between the channel region 108a and the low-resistance regions 108b and 108c are aligned or substantially aligned with the end portions of the conductive film 120, when seen from the above.

Alternatively, as illustrated in FIG. 31C, in a cross-sectional view in the channel length direction, the channel region 108a has a region that does not overlap with the conductive film 120. The region functions as an offset region. That is, when seen from the above, the end portions of the low-resistance regions 108b and 108c do not overlap with the end portions of the conductive film 120.

As illustrated in FIG. 31D, in a cross-sectional view in the channel length direction, the low-resistance regions 108b and 108c each have a region overlapping with the conductive film 120, specifically the conductive film 120a. The region is referred to as an overlap region. That is, when seen from the above, the end portions of the low-resistance regions 108b and 108c overlap with the conductive film 120a.

Alternatively, as illustrated in FIG. 31E, in a cross-sectional view in the channel length direction, the low-resistance region 108f between the channel region 108a and the low-resistance region 108b, and the low-resistance region 108g between the channel region 108a and the low-resistance region 108c are provided. The impurity element is added to the low-resistance regions 108f and 108g through the conductive film 120a; thus, the low-resistance regions 108f and 108g have lower concentrations of an impurity element and higher resistivity than the low-resistance regions 108b and 108c. Here, the low-resistance regions 108f and 108g overlap with the conductive film 120a, but they may overlap with the conductive film 120a and the conductive film 120b.

As illustrated in FIG. 32A, in the cross-sectional view in the channel length direction, the end portion of the conductive film 120a may be positioned on an outer side than the end portion of the conductive film 120b and the conductive film 120a may have a tapered shape. That is, an angle between a surface where the insulating film 117 and the conductive film 120a are in contact with each other and a side surface of the conductive film 120a may be less than 90°, greater than or equal to 5° and less than or equal to 45°, or greater than or equal to 5° and less than or equal to 30°.

Furthermore, the end portion of the insulating film 117 may be positioned on an outer side than the end portion of the conductive film 120a.

Furthermore, a side surface of the insulating film 117 may be curved.

The insulating film 117 may have a tapered shape. That is, an angle formed between a surface where the oxide semiconductor film 108 and the insulating film 117 are in contact with each other and a side surface of the insulating film 117 may be less than 90°, preferably greater than or equal to 30° and less than 90°.

The oxide semiconductor film 108 illustrated in FIG. 32A includes the channel region 108a, the low-resistance regions 108f and 108g between which the channel region 108a is provided, low-resistance regions 108h and 108i between which the low-resistance regions 108f and 108g are provided, and the low-resistance regions 108b and 108c between which the low-resistance regions 108h and 108i are provided. The impurity element is added to the low-resistance regions 108f, 108g, 108h, and 108i through the insulating film 117 and the conductive film 120a; thus, the low-resistance regions 108f, 108g, 108h, and 108i have lower concentrations of an impurity element and higher resistivity than the low-resistance regions 108b and 108c.

The oxide semiconductor film 108 illustrated in FIG. 32B includes the channel region 108a, the low-resistance regions 108h and 108i between which the channel region 108a is provided, and the low-resistance regions 108b and 108c between which the low-resistance regions 108h and 108i are provided. The impurity element is added to the low-resistance regions 108h and 108i through the insulating film 117; thus, the low-resistance regions 108h and 108i have lower concentrations of an impurity element and higher resistivity than the low-resistance regions 108b and 108c.

Note that in the channel length direction, the channel region 108a overlaps with the conductive film 120b, the low-resistance regions 108f and 108g overlap with the conductive film 120a projecting outside the conductive film 120b, the low-resistance regions 108h and 108i overlap with the insulating film 117 projecting outside the conductive film 120a, and the low-resistance regions 108b and 108c are positioned on outer sides than the insulating film 117.

As illustrated in FIG. 31E and FIGS. 32A and 32B, the oxide semiconductor film 108 includes the low-resistance regions 108f, 108g, 108h, and 108i having lower impurity element concentrations and higher resistivity than the low-resistance regions 108b and 108c, whereby the electric field of the drain region can be relaxed. Thus, deterioration of the transistor due to the electric field of the drain region, such as a shift of the threshold voltage of the transistor, can be inhibited.

Figure 33A:
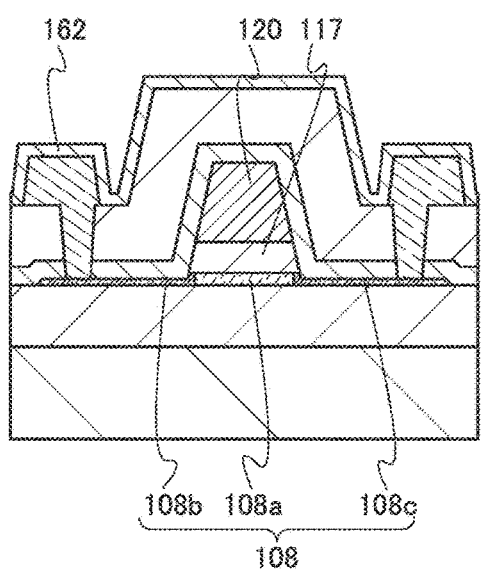
FIGS. 33A to 33D are cross-sectional views each illustrating a structure of a transistor.

The transistor shown in FIG. 33A includes the oxide semiconductor film 108 including the channel region 108a and the low-resistance regions 108b and 108c. The low-resistance regions 108b and 108c each include a region with a thickness smaller than that of the channel region 108a. Typically, the low-resistance regions 108b and 108c each include a region with a thickness smaller than that of the channel region 108a by 0.1 nm or more and 5 nm or less.

Figure 33B:
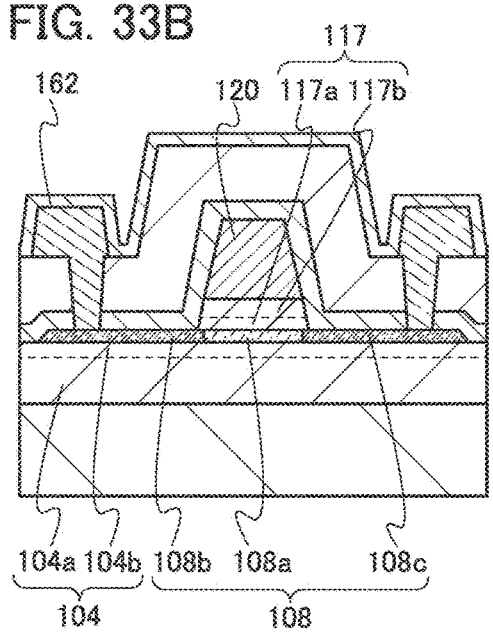

In the transistor shown in FIG. 33B, at least one of the insulating films 104 and 117, which are in contact with the oxide semiconductor film 108, has a multilayer structure. For example, the insulating film 104 includes the insulating film 104a and the insulating film 104b in contact with the insulating film 104a and the oxide semiconductor film 108. For example, the insulating film 117 includes an insulating film 117a in contact with the oxide semiconductor film 108 and an insulating film 117b in contact with the insulating film 117a.

The insulating films 104b and 117a can be formed using an oxide insulating film with a low content of nitrogen oxide and a low density of defect states. The oxide insulating film with a low content of nitrogen oxide and a low density of defect states is, specifically, an oxide insulating film in which the density of defect states located 4.6 eV or more and 8 eV or less lower than a vacuum level is low, that is, an oxide insulating film in which the density of defect states attributed to nitrogen oxide is low. As the oxide insulating film with a low content of nitrogen oxide and a low density of defect states, a silicon oxynitride film that releases less nitrogen oxide, an aluminum oxynitride film that releases less nitrogen oxide, or the like can be used. The average thickness of each of the insulating films 104b and 117a is greater than or equal to 0.1 nm and less than or equal to 50 nm, or greater than or equal to 0.5 nm and less than or equal to 10 nm.

Note that a silicon oxynitride film that releases less nitrogen oxide is a film of which the amount of released ammonia is larger than the amount of released nitrogen oxide in thermal desorption spectroscopy (TDS) analysis; the amount of released ammonia is typically greater than or equal to 1× molecules/cm$^3$ and less than or equal to 5×10$^{19}$ molecules/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

The insulating films 104a and 117b can be formed using an oxide insulating film that releases oxygen by being heated. Note that the average thickness of each of the insulating films 104a and 117b is greater than or equal to 5 nm and less than or equal to 1000 nm, or greater than or equal to 10 nm and less than or equal to 500 nm.

Typical examples of the oxide insulating film that releases oxygen by being heated include a silicon oxynitride film and an aluminum oxynitride film.

Nitrogen oxide (NO$_x$; x is greater than or equal to 0 and less than or equal to 2, preferably greater than or equal to 1 and less than or equal to 2), typically NO$_2$ or NO, forms levels in the insulating film 104, the insulating film 117, and the like. The level is formed in the energy gap of the oxide semiconductor film 108. Therefore, when nitrogen oxide is diffused to the interface between the insulating film 104 and the oxide semiconductor film 108, the interface between the insulating film 117 and the oxide semiconductor film 108, and the interface between the insulating film 104 and the insulating film 117, an electron is trapped by the level on the insulating film 104 side and the insulating film 117 side. As a result, the trapped electron remains in the vicinity of the interface between the insulating film 104 and the oxide semiconductor film 108, the interface between the insulating film 117 and the oxide semiconductor film 108, and the interface between the insulating film 104 and the insulating film 117; thus, the threshold voltage of the transistor is shifted in the positive direction.

Nitrogen oxide reacts with ammonia and oxygen in heat treatment. Since nitrogen oxide contained in the insulating films 104a and 117b reacts with ammonia contained in the insulating films 104b and 117a in heat treatment, nitrogen oxide contained in the insulating films 104a and 117b is reduced. Therefore, an electron is hardly trapped at the interface between the insulating film 104 and the oxide semiconductor film 108, the interface between the insulating film 117 and the oxide semiconductor film 108, and the interface between the insulating film 104 and the insulating film 117.

By using the oxide insulating film with a low content of nitrogen oxide and a low density of defect states for the insulating films 104b and 117a, a shift in the threshold voltage of the transistor can be reduced, which leads to a smaller change in the electrical characteristics of the transistor.

Note that in an ESR spectrum at 100 K or lower of the insulating films 104b and 117a, by heat treatment in a manufacturing process of the transistor, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than 1×10$^{18}$ spins/cm$^3$, typically higher than or equal to 1×10$^{17}$ spins/cm$^3$ and lower than 1×10$^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen dioxide (NO$_2$). In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

After heat treatment in a manufacturing process of the transistor, typically heat treatment at a temperature higher than or equal to 300° C. and lower than the strain point of the substrate, the oxide insulating film with a low content of nitrogen oxide and a low density of defect states has a nitrogen concentration measured by secondary ion mass spectrometry (SIMS) of 6×10$^{20}$ atoms/cm$^3$ or lower.

By forming an oxide insulating film with a low content of nitrogen oxide and a low density of defect states by a plasma CVD method using silane and dinitrogen monoxide at a substrate temperature higher than or equal to 220° C., higher than or equal to 280° C., or higher than or equal to 350° C., a dense and hard film can be formed.

Figure 33C:
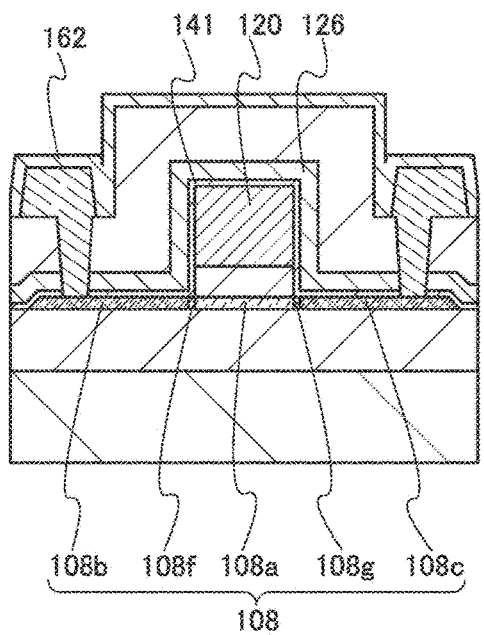

The transistor shown in FIG. 33C includes an insulating film 141 between the insulating film 126 and the oxide semiconductor film 108, the insulating film 117, and the conductive film 120. The insulating film 141 can be formed using the oxide insulating film with a low content of nitrogen oxide and a low density of defect states for the insulating films 104b and 117a shown in FIG. 33B.

Alternatively, in a cross-sectional view in the channel length direction, the low-resistance region 108f between the channel region 108a and the low-resistance region 108b, and the low-resistance region 108g between the channel region 108a and the low-resistance region 108c are provided. The low-resistance regions 108f and 108g have lower impurity element concentrations and higher resistivity than the low-resistance regions 108b and 108c. Here, the low-resistance regions 108f and 108g overlap with the insulating film 141 in contact with side surfaces of the insulating film 117 and the conductive film 120. Note that the low-resistance regions 108f and 108g may overlap with the insulating film 126 and the insulating film 141.

Figure 33D:
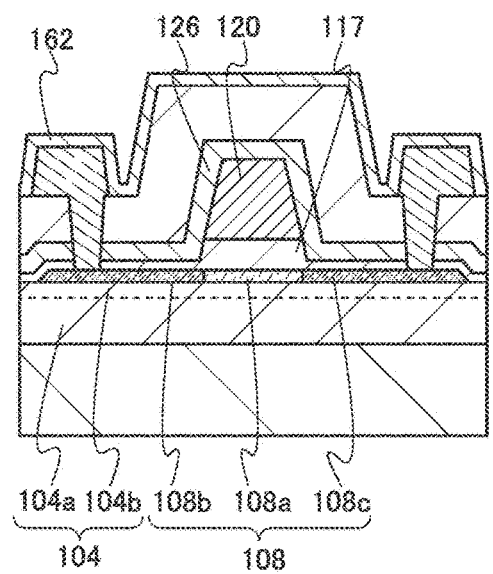

Note that in the transistor illustrated in FIG. 33D, the insulating film 117 is in contact with the channel region 108a of the oxide semiconductor film 108 and is in contact with the low-resistance regions 108b and 108c. Furthermore, in the insulating film 117, thicknesses of regions in contact with the low-resistance regions 108b and 108c are smaller than a thickness of a region in contact with the channel region 108a;

the average thickness of the insulating film 117 is typically greater than or equal to 0.1 nm and less than or equal to 50 nm, or greater than or equal to 0.5 nm and less than or equal to 10 nm. As a result, the impurity element can be added to the oxide semiconductor film 108 through the insulating film 117, and in addition, hydrogen contained in the insulating film 126 can be moved to the oxide semiconductor film 108 through the insulating film 117. Thus, the low-resistance regions 108b and 108c can be formed.

Furthermore, the insulating film 104 has a multilayer structure of the insulating films 104a and 104b; for example, the insulating film 104a is formed using an oxide insulating film that releases oxygen by being heated, and the insulating film 104b is formed using an oxide insulating film with a low content of nitrogen oxide and a low density of defect states. Furthermore, the insulating film 117 is formed using an oxide insulating film with a low content of nitrogen oxide and a low density of defect states. That is, the oxide semiconductor film 108 can be covered with the oxide insulating film with a low content of nitrogen oxide and a low density of defect states. As a result, the carrier trap at the interfaces between the oxide semiconductor film 108 and the insulating films 104b and 117 can be reduced while oxygen contained in the insulating film 104a is moved to the oxide semiconductor film 108 by heat treatment to reduce oxygen vacancies contained in the channel region 108a of the oxide semiconductor film 108. Consequently, a shift in the threshold voltage of the transistor can be reduced, which leads to a smaller change in the electrical characteristics of the transistor.

Embodiment 4

Here, a method in which a film which suppresses release of oxygen is formed over the insulating film and then oxygen is added to the insulating film through the film is described with reference to FIGS. 34A and 34B.

Figure 34A:
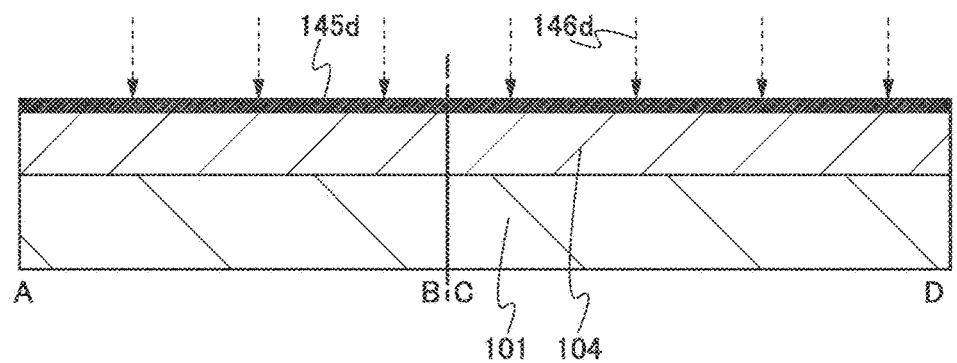
FIGS. 34A and 34B are cross-sectional views illustrating a manufacturing process of transistors.

As shown in FIG. 34A, the insulating film 104 is formed over the substrate 101.

Next, a film 145d which suppresses release of oxygen is formed over the insulating film 104. Next, oxygen 146d is added to the insulating film 104 through the film 145d.

The film 145d which suppresses release of oxygen is formed using any of the following conductive materials: a metal element selected from aluminum, chromium, tantalum, titanium, molybdenum, nickel, iron, cobalt, and tungsten; an alloy containing the above-described metal element as a component; an alloy containing any of the above-described metal elements in combination; a metal nitride containing the above-described metal element; a metal oxide containing the above-described metal element; a metal nitride oxide containing the above-described metal element; and the like.

The thickness of the film 145d which suppresses release of oxygen can be greater than or equal to 1 nm and less than or equal to 20 nm, or greater than or equal to 2 nm and less than or equal to 10 nm.

As a method for adding the oxygen 146d to the insulating film 104 through the film 145d, an ion doping method, an ion implantation method, plasma treatment, or the like is given. Note that it is preferable that the film 145d be exposed to plasma generated in a state where bias is applied to the substrate 101 side, because the amount of oxygen added to the insulating film 104 can be increased. As an example of an apparatus used in such plasma treatment, an ashing apparatus is given.

By adding oxygen to the insulating film 104 with the film 145d provided over the insulating film 104, the film 145d serves as a protective film which suppresses release of oxygen from the insulating film 104. Thus, a larger amount of oxygen can be added to the insulating film 104.

In the case where oxygen is added by plasma treatment, by making oxygen excited by a microwave to generate high density oxygen plasma, the amount of oxygen added to the insulating film 104 can be increased.

Figure 34B:
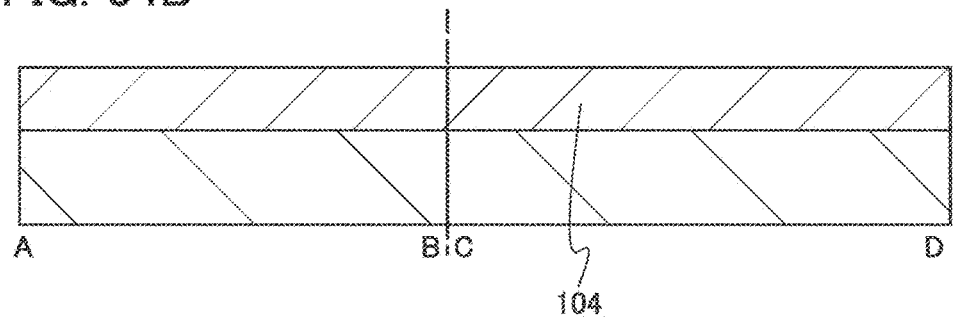

After that, the film 145d is removed; consequently, the insulating film 104 to which oxygen is added can be formed over the substrate 101 as shown in FIG. 34B.

Embodiment 5

In this embodiment, $V_OH$ which is formed in a low-resistance region of an oxide semiconductor film is described.

<(1) Ease of Formation and Stability of $V_OH$>

In the case where an oxide semiconductor film (hereinafter referred to as IGZO) is a complete crystal, H preferentially diffuses along the a-b plane at a room temperature. In heat treatment at 450° C., H diffuses along the a-b plane and in the c-axis direction. Here, calculation was made as to whether H easily enters an oxygen vacancy $V_O$ if $V_O$ exists in IGZO. A state in which 1-1 is in an oxygen vacancy $V_O$ is referred to as $V_OH$.

Figure 35:
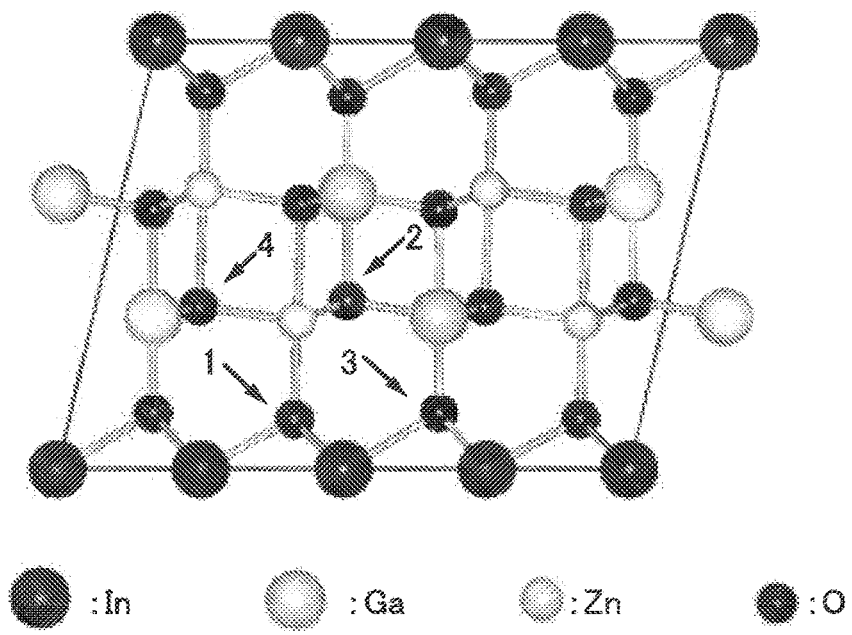
FIG. 35 shows a calculation model.

An $InGaZnO_4$ crystal model shown in FIG. 35 was used for calculation. The activation barrier ($E_a$) along the reaction path where H in $V_OH$ is released from $V_O$ and bonded to oxygen was calculated by a nudged elastic band (NEB) method. The calculation conditions are shown in Table 1.

TABLE 1

| | |
|---|---|
| Software | VASP |
| Calculation method | NEB method |
| Functional | GGA-PBE |
| Pseudopotential | PAW |
| Cut-off energy | 500 eV |
| K points | 2 × 2 × 3 |

In the $InGaZnO_4$ crystal model, there are oxygen sites 1 to 4 as shown in FIG. 35 which differ from each other in metal elements bonded to oxygen and the number of bonded metal elements. Here, calculation was made on the oxygen sites 1 and 2 in which an oxygen vacancy $V_O$ is easily formed.

First, calculation was made on the oxygen site in which an oxygen vacancy $V_O$ is easily formed: an oxygen site 1 that was bonded to three In atoms and one Zn atom.

Figure 37:
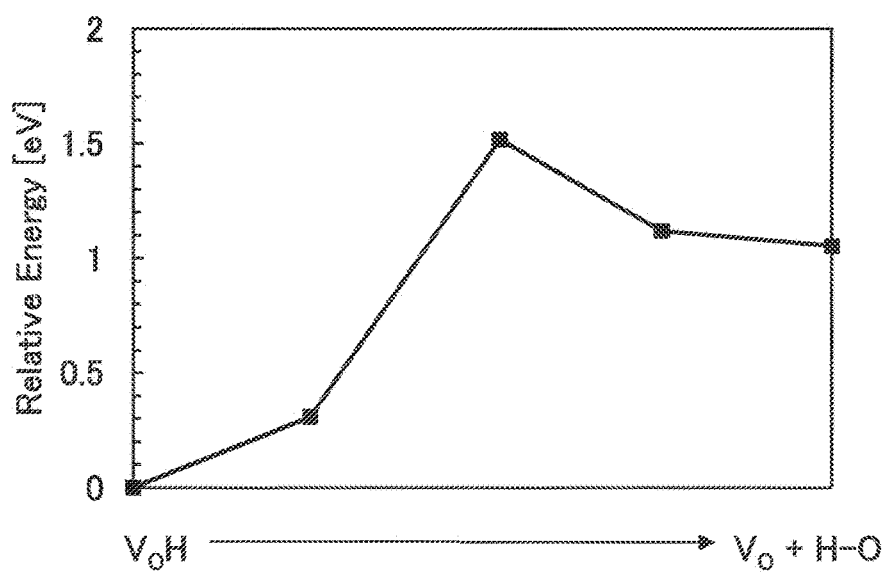
FIG. 37 shows an activation barrier.

FIG. 36A shows a model in the initial state and FIG. 36B shows a model in the final state. FIG. 37 shows the calculated activation barrier ($E_a$) in the initial state and the final state. Note that here, the initial state refers to a state in which H exists in an oxygen vacancy $V_O$ ($V_OH$), and the final state refers to a structure including an oxygen vacancy $V_O$ and a state in which H is bonded to oxygen bonded to one Ga atom and two Zn atoms (H—O).

From the calculation results, bonding of H in an oxygen vacancy $V_O$ to another oxygen atom needs an energy of approximately 1.52 eV, while entry of H bonded to O into an oxygen vacancy $V_O$ needs an energy of approximately 0.46 eV.

Reaction frequency (Γ) was calculated with use of the activation barriers ($E_a$) obtained by the calculation and Formula 1. In Formula 1, $k_B$ represents the Boltzmann constant and T represents the absolute temperature.

$$\Gamma = \nu \exp\left(-\frac{E_a}{k_B T}\right) \quad \text{[Formula 1]}$$

The reaction frequency at 350° C. was calculated on the assumption that the frequency factor $\nu=10^{13}$ [1/sec]. The frequency of H transfer from the model shown in FIG. 36A to the model shown in FIG. 36B was 5.52×10⁰ [1/sec], whereas the frequency of H transfer from the model shown in FIG. 36B to the model shown in FIG. 36A was 1.82×10⁹ [1/sec]. This suggests that H diffusing in IGZO is likely to form $V_O$H if an oxygen vacancy $V_O$ exists in the neighborhood, and H is unlikely to be released from the oxygen vacancy $V_O$ once $V_O$H is formed.

Next, calculation was made on the oxygen site in which an oxygen vacancy $V_O$ is easily formed: an oxygen site 2 that was bonded to one Ga atom and two Zn atoms.

Figure 39:
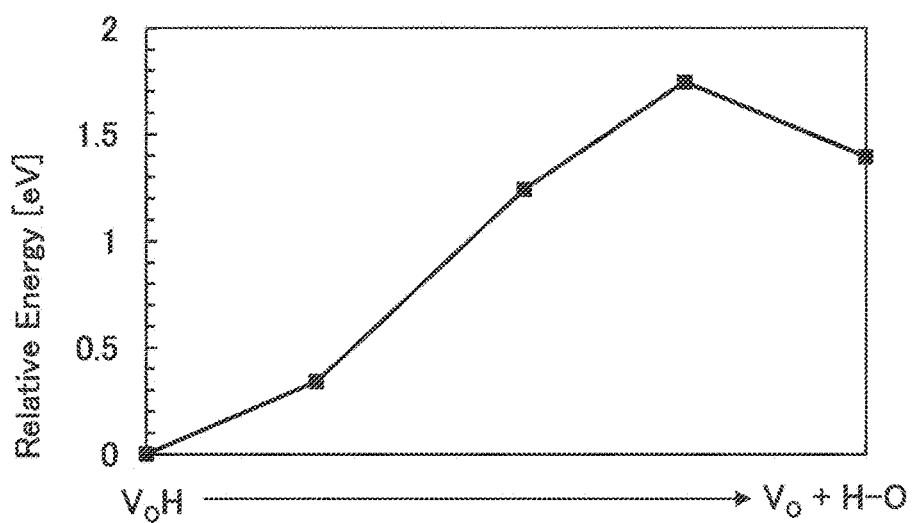
FIG. 39 shows an activation barrier.

FIG. 38A shows a model in the initial state and FIG. 38B shows a model in the final state. FIG. 39 shows the calculated activation barrier ($E_a$) in the initial state and the final state. Note that here, the initial state refers to a state in which H exists in an oxygen vacancy $V_O$ ($V_O$H), and the final state refers to a structure including an oxygen vacancy $V_O$ and a state in which H is bonded to oxygen bonded to one Ga atom and two Zn atoms (H—O).

From the calculation results, bonding of H in an oxygen vacancy $V_O$ to another oxygen atom needs an energy of approximately 1.75 eV, while entry of H bonded to O into an oxygen vacancy $V_O$ needs an energy of approximately 0.35 eV.

Reaction frequency (Γ) was calculated with use of the activation barriers ($E_a$) obtained by the calculation and the above Formula 1.

The reaction frequency at 350° C. was calculated on the assumption that the frequency factor $\nu=10^{13}$ [1/sec]. The frequency of H transfer from the model shown in FIG. 38A to the model shown in FIG. 38B was 7.53×10⁻² [1/sec], whereas the frequency of H transfer from the model shown in FIG. 38B to the model shown in FIG. 38A was 1.44×10¹⁰ [1/sec]. This suggests that H is unlikely to be released from the oxygen vacancy $V_O$ once $V_O$H is formed.

From the above results, it was found that H in IGZO easily diffused in annealing and if an oxygen vacancy $V_O$ existed, H was likely to enter the oxygen vacancy $V_O$ to be $V_O$H.

<(2) Transition Level of $V_O$H>

The calculation by the NEB method, which was described in <(1) Ease of formation and stability of $V_O$H>, indicates that in the case where an oxygen vacancy $V_O$ and H exist in IGZO, the oxygen vacancy $V_O$ and H easily form $V_O$H and $V_O$H is stable. To determine whether $V_O$H is related to a carrier trap, the transition level of $V_O$H was calculated.

The model used for calculation is an InGaZnO₄ crystal model (112 atoms). $V_O$H models of the oxygen sites 1 and 2 shown in FIG. 35 were made to calculate the transition levels. The calculation conditions are shown in Table 2.

TABLE 2

| Software | VASP |
|---|---|
| Model | InGaZnO₄ crystal model (112 atoms) |
| Functional | HSE06 |
| Mixture ratio of exchange terms | 0.25 |
| Pseudopotential | GGA-PBE |
| Cut-off energy | 800 eV |
| K points | 1 × 1 × 1 |

The mixture ratio of exchange terms was adjusted to have a band gap close to the experimental value. As a result, the band gap of the InGaZnO₄ crystal model without defects was 3.08 eV that is close to the experimental value, 3.15 eV.

The transition level (ε(q/q')) of a model having defect D can be calculated by the following Formula 2. Note that $\Delta E(D^q)$ represents the formation energy of defect D at charge q, which is calculated by Formula 3.

$$\varepsilon(q/q') = \frac{\Delta E(D^q) - \Delta E(D^{q'})}{q' - q} \quad \text{[Formula 2]}$$

$$\Delta E(D^q) = \quad \text{[Formula 3]}$$
$$E_{tot}(D^q) - E_{tot}(\text{bulk}) + \sum_i \Delta n_i \mu_i + q(\varepsilon_{VBM} + \Delta V_q + E_F)$$

In Formulae 2 and 3, $E_{tot}(D^q)$ represents the total energy of the model having defect D at the charge q in, $E_{tot}(\text{bulk})$ represents the total energy in a model without defects (complete crystal), $\Delta n_i$ represents a change in the number of atoms i contributing to defects, $\mu_i$ represents the chemical potential of atom i, $\varepsilon_{VBM}$ represents the energy of the valence band maximum in the model without defects, $\Delta v_q$ represents the correction term relating to the electrostatic potential, and $E_F$ represents the Fermi energy.

Figure 40:
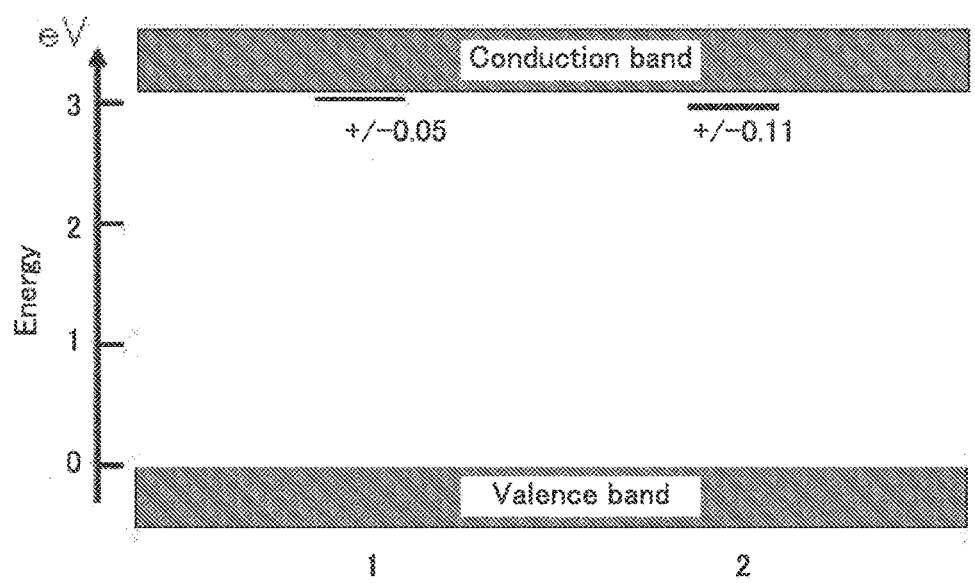
FIG. 40 shows the transition levels of $V_O H$.

FIG. 40 shows the transition levels of $V_O$H obtained from the above formulae. The values in FIG. 40 represent the depth from the conduction band minimum. In FIG. 40, the transition level of $V_O$H in the oxygen site 1 is lower than the conduction band minimum by 0.05 eV, and the transition level of $V_O$H in the oxygen site 2 is lower at 0.11 eV from the conduction band minimum. Therefore, these $V_O$H would be related to electron traps, that is, $V_O$H was found to behave as a donor. It was also found that IGZO including $V_O$H had conductivity.

<Oxide Conductor Film>

The temperature dependence of the resistivity of an oxide conductor film including $V_O$H is described with reference to FIG. 48.

In this embodiment, samples each including an oxide conductor film were manufactured. As the oxide conductor film, an oxide conductor film formed by making the oxide semiconductor film in contact with a silicon nitride film (OC_SiN$_x$), an oxide conductor film formed by making the oxide semiconductor film in contact with a silicon nitride film after addition of argon to the oxide semiconductor film with a doping apparatus (OC_Ar dope+SiN$_x$), or an oxide conductor film formed by making the oxide semiconductor film in contact with a silicon nitride film after exposure of the oxide semiconductor film to argon plasma (OC_Ar plasma+SiN$_x$) with a plasma treatment apparatus was formed. Note that the silicon nitride film contains hydrogen.

A method for forming a sample including the oxide conductor film (OC_SiN$_x$) is as follows. A 400-nm-thick silicon oxynitride film was formed over a glass substrate by a plasma CVD method and then exposed to oxygen plasma, and an oxygen ion was added to the silicon oxynitride film; accordingly, a silicon oxynitride film that releases oxygen by heating was formed. Next, a 100-nm-thick In—Ga—Zn oxide film was formed over the silicon oxynitride film that releases oxygen by heating by a sputtering method using a sputtering target in which the atomic ratio of In to Ga and Zn was 1:1:1.2, and heat treatment was performed at 450° C. in a nitrogen atmosphere and then heat treatment was performed at 450° C. in a mixed atmosphere of nitrogen and oxygen. Then, a 100-nm-thick silicon nitride film was formed by a plasma CVD method. After that, heat treatment was performed at 350° C. in a mixed gas atmosphere of nitrogen and oxygen.

A method for forming a sample including the oxide conductor film (OC_Ar dope+SiN$_x$) is as follows. A 400-nm-thick silicon oxynitride film was formed over a glass substrate by a plasma CVD method and then exposed to oxygen plasma, and an oxygen ion was added to the silicon oxynitride film; accordingly, a silicon oxynitride film that releases oxygen by heating was formed. Next, a 100-nm-thick In—Ga—Zn oxide film was formed over the silicon oxynitride film that releases oxygen by heating by a sputtering method using a sputtering target in which the atomic ratio of In to Ga and Zn was 1:1:1.2, and heat treatment was performed at 450° C. in a nitrogen atmosphere and then heat treatment was performed at 450° C. in a mixed atmosphere of nitrogen and oxygen. Then, with a doping apparatus, argon having a dose of 5×10$^{14}$/cm$^2$ was added to the In—Ga—Zn oxide film at an acceleration voltage of 10 kV, and oxygen vacancies were formed in the In—Ga—Zn oxide film. After that, a 100-nm-thick silicon nitride film was formed by a plasma CVD method. Subsequently, heat treatment was performed at 350° C. in a mixed gas atmosphere of nitrogen and oxygen.

A method for forming a sample including the oxide conductor film (OC_Ar plasma+SiN$_x$) is as follows. A 400-nm-thick silicon oxynitride film was formed over a glass substrate by a plasma CVD method and then exposed to oxygen plasma; accordingly, a silicon oxynitride film that releases oxygen by heating was formed. Next, a 100-nm-thick In—Ga—Zn oxide film was formed over the silicon oxynitride film that releases oxygen by heating by a sputtering method using a sputtering target in which the atomic ratio of In to Ga and Zn was 1:1:1.2, and heat treatment was performed at 450° C. in a nitrogen atmosphere and then heat treatment was performed at 450° C. in a mixed atmosphere of nitrogen and oxygen. Then, in a plasma treatment apparatus, argon plasma was generated, accelerated argon ions were made to collide with the In—Ga—Zn oxide film, and oxygen vacancies were formed in the In—Ga—Zn oxide film. After that, a 100-nm-thick silicon nitride film was formed by a plasma CVD method, Subsequently, heat treatment was performed at 350° C. in a mixed gas atmosphere of nitrogen and oxygen.

Figure 48:
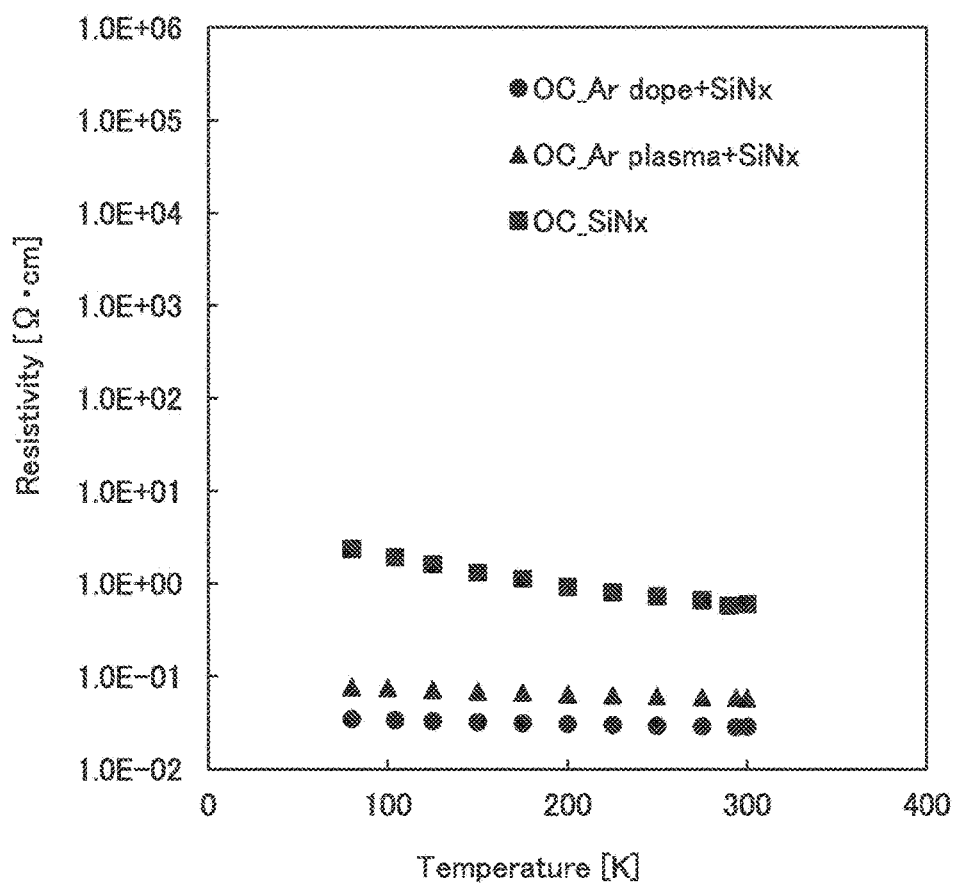
FIG. 48 shows temperature dependence of resistivity.

Next, FIG. 48 shows the measured resistivity of the samples. Here, the resistivity was measured by the Van der Pauw method using four terminals. In FIG. 48, the horizontal axis represents measurement temperature, and the vertical axis represents resistivity. Measurement results of the oxide conductor film (OC_SiN$_x$) are plotted as squares, measurement results of the oxide conductor film (OC_Ar dope+SiN$_x$) are plotted as circles, and measurement results of the oxide conductor film (OC_Ar plasma+SiN$_x$) are plotted as triangles.

Note that although not shown, the oxide semiconductor film which is not in contact with the silicon nitride film had high resistivity, which was difficult to measure. Therefore, it is found that the oxide conductor film has lower resistivity than the oxide semiconductor film.

According to FIG. 48, in the case where the oxide conductor film (OC_Ar dope+SiN$_x$) and the oxide conductor film (OC_Ar plasma+SiN$_x$) contain an oxygen vacancy and hydrogen, variation in resistivity is small. Typically, the variation in resistivity at temperatures from 80 K to 290 K is lower than ±20%. Alternatively, the variation in resistivity at temperatures from 150 K to 250 K is lower than ±10%. In other words, the oxide conductor is a degenerate semiconductor and it is suggested that the conduction band edge agrees with or substantially agrees with the Fermi level. Thus, when the oxide conductor film is used as a source region and a drain region of a transistor, an ohmic contact occurs at a portion where the oxide conductor film is in contact with conductive films functioning as a source electrode and a drain electrode, and the contact resistance between the oxide conductor film and the conductive films functioning as a source electrode and a drain electrode can be reduced. Furthermore, the oxide conductor has low temperature resistance of resistivity; thus, a fluctuation of contact resistance between the oxide conductor film and conductive films functioning as a source electrode and a drain electrode is small, and a highly reliable transistor can be obtained.

Embodiment 6

In this embodiment, the structure of an oxide semiconductor film included in a semiconductor device of one embodiment of the present invention is described below in detail.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a CAAC-OS, a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 49A:
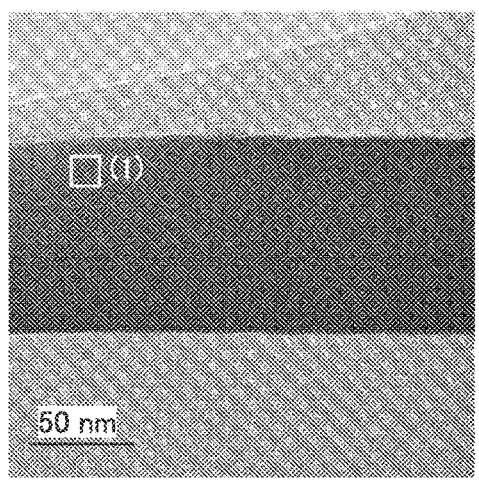
FIGS. 49A to 49D are Cs-corrected high-resolution TEM images of a cross section of a CAAC-OS and a cross-sectional schematic view of a CAAC-OS.

A CAAC-OS observed with TEM is described below. FIG. 49A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 49B:
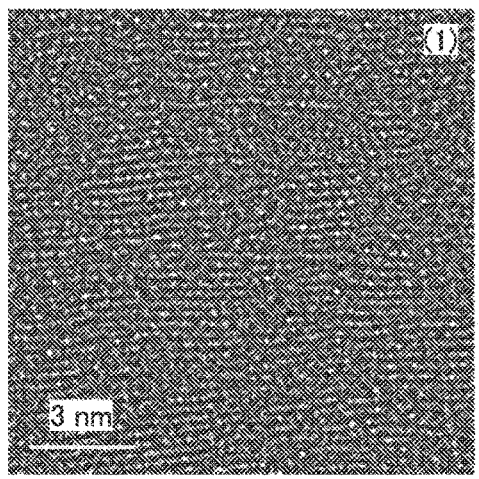

FIG. 49B is an enlarged Cs-corrected high-resolution TEM image of a region (1) in FIG. 49A. FIG. 49B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 49C:
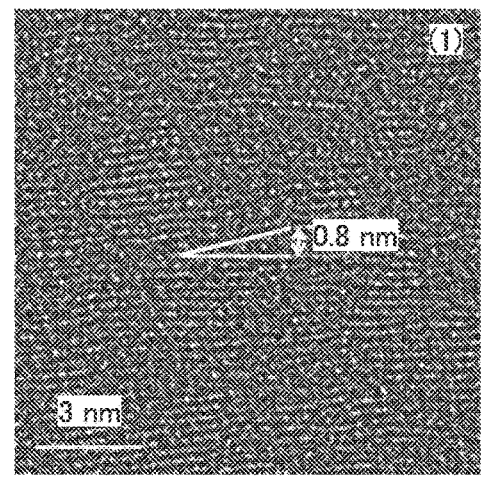

As shown in FIG. 49B, the CAAC-OS has a characteristic atomic arrangement. The characteristic atomic arrangement is denoted by an auxiliary line in FIG. 49C. FIGS. 49B and 49C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 49D:
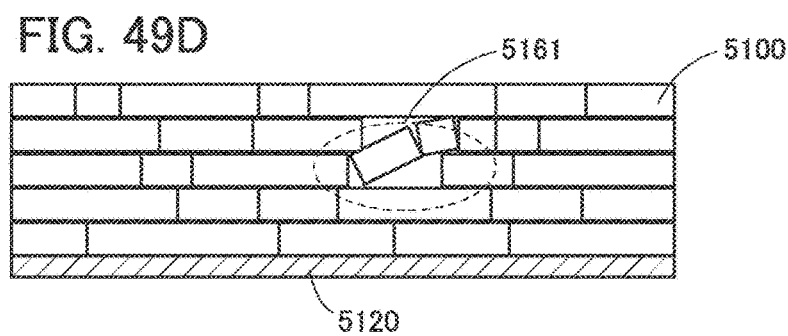

Here, according to the Cs-corrected high-resolution TEM images, the schematic arrangement of pellets 5100 of a CAAC-OS over a substrate 5120 is illustrated by such a structure in which bricks or blocks are stacked (see FIG. 49D). The part in which the pellets are tilted as observed in FIG. 49C corresponds to a region 5161 shown in FIG. 49D.

Figure 50A:
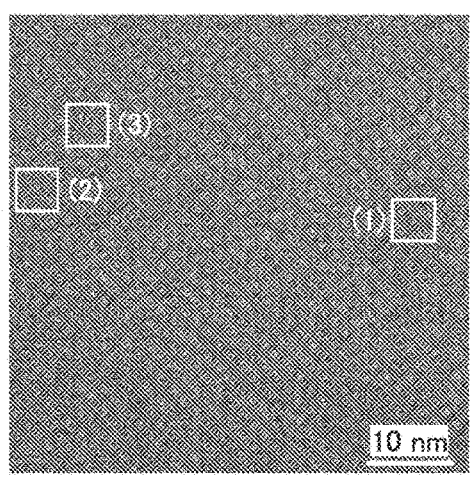
FIGS. 50A to 50D are Cs-corrected high-resolution TEM images of a plane of a CAAC-OS.
Figure 50B:
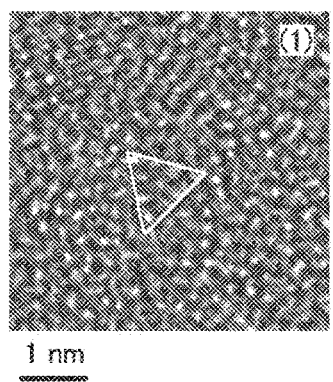
Figure 50C:
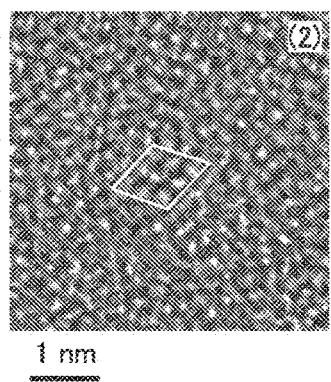
Figure 50D:
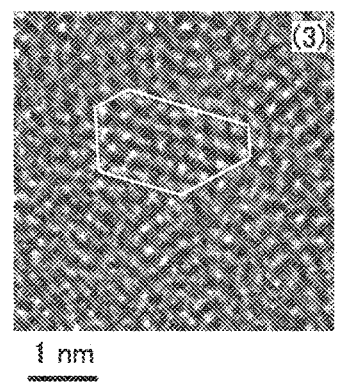

FIG. 50A shows a Cs-corrected high-resolution TEM image of a plane of the CAAC-OS observed from a direction substantially perpendicular to the sample surface. FIGS. 50B, 50C, and 50D are enlarged Cs-corrected high-resolution TEM images of regions (1), (2), and (3) in FIG. 50A, respectively. FIGS. 50B, 50C, and 50D indicate that metal atoms are arranged in a triangular, quadrangular, or hexagonal configuration in a pellet. However, there is no regularity of arrangement of metal atoms between different pellets.

Figure 51A:
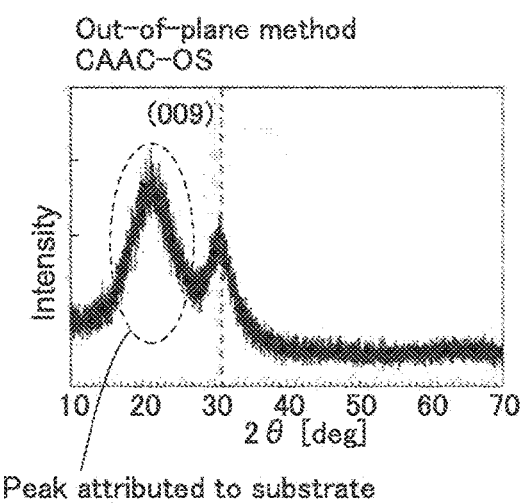
FIGS. 51A to 51C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 51A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 51B:
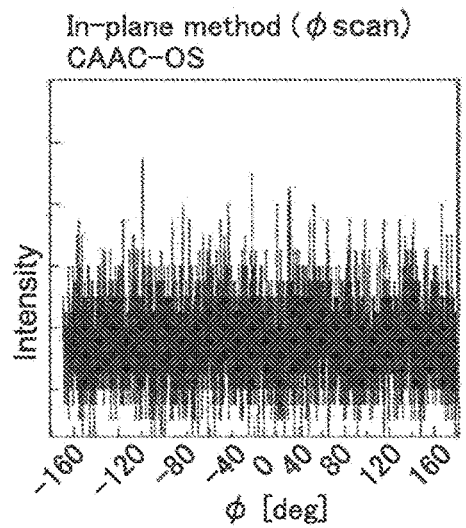
Figure 51C:
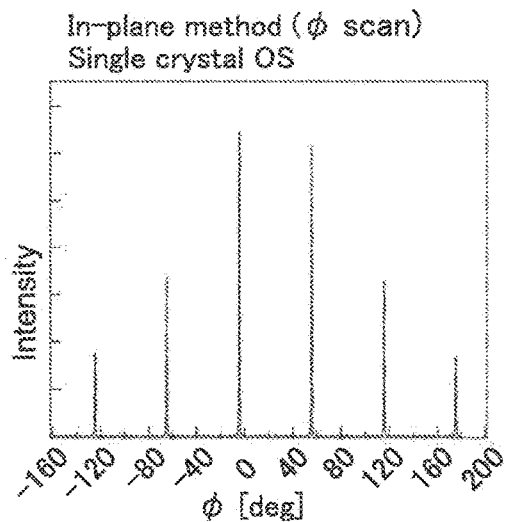

On the other hand, in structural analysis of the CAAC-OS by an in-plane method in which an X-ray beam is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 51B, a peak is not clearly observed. In contrast, in the case of a single crystal oxide semiconductor of $InGaZnO_4$, when $\phi$ scan is performed with $2\theta$ fixed at around 56°, as shown in FIG. 51C, six peaks which are derived from crystal planes equivalent to the (110) plane are observed. Accordingly, the structural analysis using XRD shows that the directions of a-axes and b-axes are irregularly oriented in the CAAC-OS.

Figure 52A:
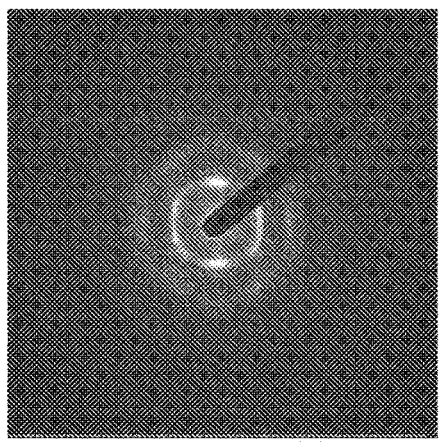
FIGS. 52A and 52B show electron diffraction patterns of a CAAC-OS.
Figure 52B:
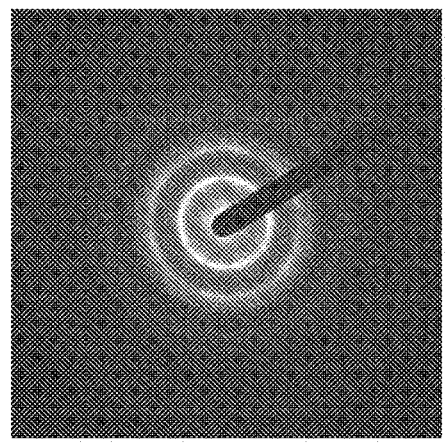

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 52A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 52B shows a diffraction pattern obtained in such a manner that an electron beam with a probe diameter of 300 nm is incident on the same sample in a direction perpendicular to the sample surface. As shown in FIG. 52B, a ring-like diffraction pattern is observed. Thus, the electron diffraction also indicates that the a-axes and b-axes of the pellets included in the CAAC-OS do not have regular alignment. The first ring in FIG. 52B is considered to be derived from the (010) plane, the (100) plane, and the like of the $InGaZnO_4$ crystal. The second ring in FIG. 52B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 μm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 53:
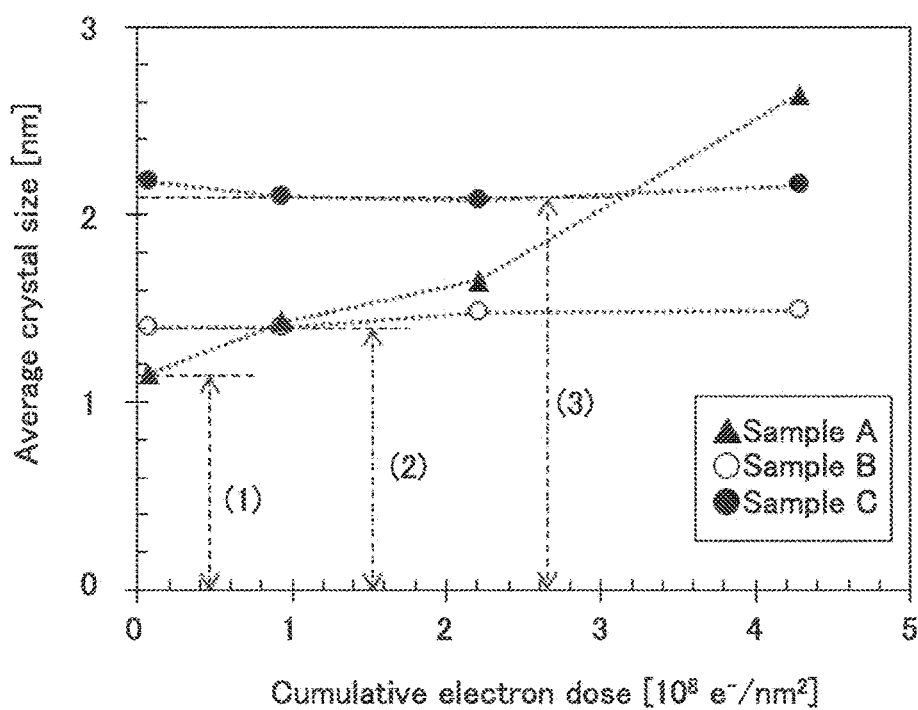
FIG. 53 shows a change in crystal part of an In—Ga—Zn oxide induced by electron irradiation.

FIG. 53 shows change in the average size of crystal parts (at 22 points to 45 points) in each sample, Note that the crystal part size corresponds to the length of a lattice fringe. FIG. 53 indicates that the crystal part size in the a-like OS increases with an increase in the cumulative electron dose. Specifically, as shown by (1) in FIG, 53, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 53, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

The structure and method described in this embodiment can be combined as appropriate with any of the other structures and methods described in the other embodiments.

Embodiment 7

In this embodiment, a display device that can be formed using a semiconductor device of one embodiment of the present invention is described with reference to FIGS. 41A to 41D.

The display device illustrated in FIG. 41A includes a region including pixels of display elements (hereinafter the region is referred to as a pixel portion 542), a circuit portion being provided outside the pixel portion 542 and including a circuit for driving the pixels (hereinafter the portion is referred to as a driver circuit portion 544), circuits each having a function of protecting an element (hereinafter the circuits are referred to as protection circuits 546), and a terminal portion 547. Note that the protection circuits 546 are not necessarily provided.

A part or the whole of the driver circuit portion 544 is preferably formed over a substrate over which the pixel portion 542 is formed, in which case the number of components and the number of terminals can be reduced. When a part or the whole of the driver circuit portion 544 is not formed over the substrate over which the pixel portion 542 is formed, the part or the whole of the driver circuit portion 544 can be mounted by chip on glass (COG) or tape automated bonding (TAB).

The pixel portion 542 includes a plurality of circuits for driving display elements arranged in X rows (X is a natural number of 2 or more) and Y columns (Y is a natural number of 2 or more) (hereinafter, such circuits are referred to as pixel circuits 541). The driver circuit portion 544 includes driver circuits such as a circuit for supplying a signal (scan signal) to select a pixel (hereinafter, the circuit is referred to as a gate driver 544a) and a circuit for supplying a signal (data signal) to drive a display element in a pixel (hereinafter, the circuit is referred to as a source driver 544b).

The gate driver 544a includes a shift register or the like. The gate driver 544a receives a signal for driving the shift register through the terminal portion 547 and outputs a signal. For example, the gate driver 544a receives a start pulse signal, a clock signal, or the like and outputs a pulse signal. The gate driver 544a has a function of controlling the potentials of wirings supplied with scan signals (hereinafter, such wirings are referred to as scan lines GL_1 to GL_X). Note that a plurality of gate drivers 544a may be provided to control the scan lines GL_1 to GL_X separately. Alternatively, the gate driver 544a has a function of supplying an initialization signal. Without being limited thereto, the gate driver 544a can supply another signal.

The source driver 544b includes a shift register or the like. The source driver 544b receives a signal (video signal) from which a data signal is derived, as well as a signal for driving the shift register, through the terminal portion 547. The source driver 544b has a function of generating a data signal to be written to the pixel circuit 541 which is based on the video signal. In addition, the source driver 544b has a function of controlling output of a data signal in response to a pulse signal produced by input of a start pulse signal, a clock signal, or the like. Furthermore, the source driver 544b has a function of controlling the potentials of wirings supplied with data signals (hereinafter such wirings are referred to as signal lines DL_1 to DL_Y). Alternatively, the source driver 544b has a function of supplying an initialization signal. Without being limited thereto, the source driver 544b can supply another signal.

The source driver 544b includes a plurality of analog switches or the like, for example. The source driver 544b can output, as the data signals, signals obtained by time-dividing the video signal by sequentially turning on the plurality of analog switches. The source driver 544b may include a shift register or the like.

A pulse signal and a data signal are input to each of the plurality of pixel circuits 541 through one of the plurality of scan lines GL supplied with scan signals and one of the plurality of signal lines DL supplied with data signals, respectively. Writing and holding of the data signal to and in each of the plurality of pixel circuits 541 are controlled by the gate driver 544a. For example, to the pixel circuit 541 in the m-th row and the n-th column (m is a natural number of less than or equal to A', and n is a natural number of less than or equal to Y), a pulse signal is input from the gate driver 544a through the scan line GL_m, and a data signal is input from the source driver 544b through the signal line DL_n in accordance with the potential of the scan line GL_m.

Figure 41A:
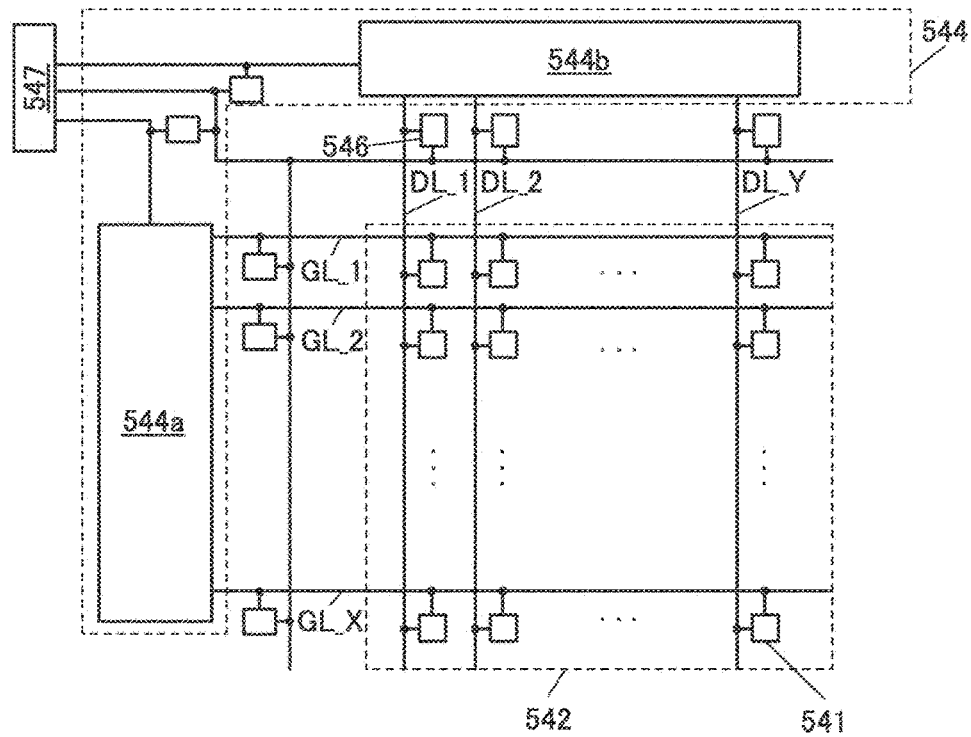
FIGS. 41A to 41D are a block diagram and circuit diagrams illustrating a display device.

The protection circuit 546 shown in FIG. 41A is connected to, for example, the scan line GL between the gate driver 544a and the pixel circuit 541. Alternatively, the protection circuit 546 is connected to the signal line DL between the source driver 544b and the pixel circuit 541. Alternatively, the protection circuit 546 can be connected to a wiring between the gate driver 544a and the terminal portion 547. Alternatively, the protection circuit 546 can be connected to a wiring between the source driver 544b and the terminal portion 547. Note that the terminal portion 547 means a portion having terminals for inputting power, control signals, and video signals to the display device from external circuits.

The protection circuit 546 is a circuit that electrically connects a wiring connected to the protection circuit to another wiring when a potential out of a certain range is applied to the wiring connected to the protection circuit.

As illustrated in FIG. 41A, the protection circuits 546 are provided for the pixel portion 542 and the driver circuit portion 544, so that the resistance of the display device to overcurrent generated by electrostatic discharge (ESD) or the like can be improved. Note that the configuration of the protection circuits 546 is not limited to that, and for example, the protection circuit 546 may be configured to be connected to the gate driver 544a or the protection circuit 546 may be configured to be connected to the source driver 544b. Alternatively, the protection circuit 546 may be configured to be connected to the terminal portion 547.

In FIG. 41A, an example in which the driver circuit portion 544 includes the gate driver 544a and the source driver 544b is shown; however, the structure is not limited thereto. For example, only the gate driver 544a may be formed and a separately prepared substrate where a source driver circuit is formed (e.g., a driver circuit substrate formed with a single crystal semiconductor film or a polycrystalline semiconductor film) may be mounted.

Figure 41B:
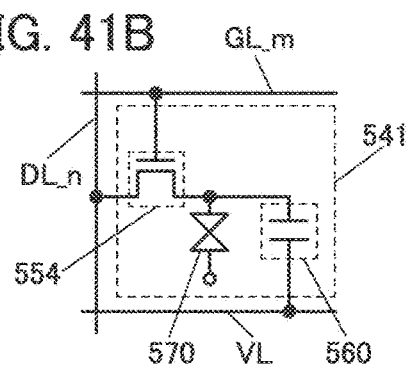

Each of the plurality of pixel circuits 541 in FIG. 41A can have the structure illustrated in FIG. 41B, for example.

The pixel circuit 541 illustrated in FIG. 41B includes a liquid crystal element 570, a transistor 550, and a capacitor 560.

As the transistor 550, any of the transistors described in the above embodiments, for example, can be used as appropriate.

The potential of one of a pair of electrodes of the liquid crystal element 570 is set in accordance with the specifications of the pixel circuit 541 as appropriate. The alignment state of the liquid crystal element 570 depends on written data. A common potential may be supplied to one of the pair of electrodes of the liquid crystal element 570 included in each of the plurality of pixel circuits 541, Furthermore, the potential supplied to one of the pair of electrodes of the liquid crystal element 570 in the pixel circuit 541 in one row may be different from the potential supplied to one of the pair of electrodes of the liquid crystal element 570 in the pixel circuit 541 in another row.

In the pixel circuit 541 in the m-th row and the n-th column, one of a source electrode and a drain electrode of the transistor 550 is electrically connected to the signal line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 541 as appropriate. The capacitor 560 functions as a storage capacitor for storing written data.

For example, in the display device including the pixel circuit 541 in FIG. 41B, the pixel circuits 541 are sequentially selected row by row by the gate driver 544a illustrated in FIG. 41A, whereby the transistors 550 are turned on and a data signal is written.

When the transistors 550 are turned off, the pixel circuits 541 in which the data has been written are brought into a holding state. This operation is sequentially performed row by row; thus, an image can be displayed.

Figure 41C:
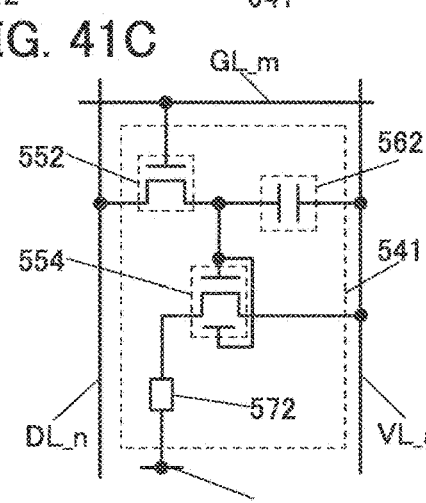

Alternatively, each of the plurality of pixel circuits 541 in FIG. 41A can have the structure illustrated in FIG. 41C, for example.

The pixel circuit 541 illustrated in FIG. 41C includes transistors 552 and 554, a capacitor 562, and a light-emitting element 572. Here, any of the transistors described in the above embodiments, for example, can be used as one or both of the transistors 552 and 554 as appropriate.

One of a source electrode and a drain electrode of the transistor 552 is electrically connected to a wiring to which a data signal is supplied (a signal line DL_n). A gate electrode of the transistor 552 is electrically connected to a wiring to which a gate signal is supplied (a scan line GL_m).

The transistor 552 has a function of controlling whether to write a data signal by being turned on or off.

A transistor having positive threshold voltage (normally-off characteristics) is preferably used as the transistor 552. The cutoff current of the transistor is preferably reduced. Accordingly, it is preferable to use any of the transistors 100h, 100j, 100z, 100n, and 100y described in Embodiment 1 and the transistors 100t, 100w, 111b, 111e, 111h, and 111k described in Embodiment 2 as appropriate.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

The transistor 554 has a function of controlling current flowing in the light-emitting element 572 by being turned on or off.

To obtain sufficient luminance for the light-emitting element 572, a transistor having high on-state current needs to be used as the transistor 554 serving as a driver transistor. Further, to improve the drive frequency of the display device and achieve smoother image display, the transistor needs to have high field-effect mobility. Accordingly, it is preferable to use, as the transistor 554, any of the transistors 100u, 100x, 111c, 111f, 111i, and 111m described in Embodiment 2 as appropriate.

A transistor with a short channel length can have high field-effect mobility; at the same time, the threshold voltage of the transistor might shift in the negative direction in some cases. The channel length of the transistor 554 is set to greater than or equal to 0.5 μm and less than or equal to 4.5 μm and a pair of gate electrodes electrically connected to each other is provided as in the transistors 111*i* and 111*m* described in Embodiment 2; thus, the on-state current and the field-effect mobility can be improved and a negative shift in the threshold voltage can be suppressed.

In contrast, because the transistor 552 serving as a selection transistor does not require field-effect mobility as high as that of the transistor 554, the channel length of the transistor 552 is made longer than that of the transistor 554. As a result, a negative shift in the threshold voltage of the transistor 554 is suppressed. With such a structure, the display device can operate at high speed with low power consumption.

In the case where the channel length of the transistor 554 is set to greater than or equal to 0.5 μm and less than or equal to 4.5 μm, for example, the channel length of the transistor 552 can be 6 μm. Note that the channel length of the transistor 552 can be set as appropriate depending on characteristics required for the display device, as long as it is at least longer than the channel length of the transistor 554.

Further, the cutoff current of the transistor 552 is preferably lower than that of the transistor 554. For example, when the ratio of the channel length to the channel width (L/W ratio) of the transistor 552 is made larger than the L/W ratio of the transistor 554, the cutoff current of the transistor 552 can be lower than that of the transistor 554. In the case where the channel widths of the transistor 554 and the transistor 552 are substantially the same, the channel length of the transistor 552 is made longer than that of the transistor 554, whereby the cutoff current of the transistor 552 can be reduced.

The transistor 552 may include a pair of gate electrodes electrically connected to each other. Note that when the transistor 552 has a single-gate structure, a region where the pair of gate electrodes are connected to each other can be omitted, so that the area of the transistor can be reduced and a decrease in the aperture ratio of the pixel can be prevented. In the case where the display device is increased in size, parasitic capacitance of a gate wiring which is applied to the transistor 552 serving as a selection transistor of the pixel is increased; accordingly, using the transistor 552 with a single-gate structure is effective.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 541 in FIG. 41C, the pixel circuits 541 are sequentially selected row by row by the gate driver 544*a* illustrated in FIG. 41A, whereby the transistors 552 are turned on and a data signal is written.

When the transistors 552 are turned off, the pixel circuits 541 in which the data has been written are brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

Figure 41D:
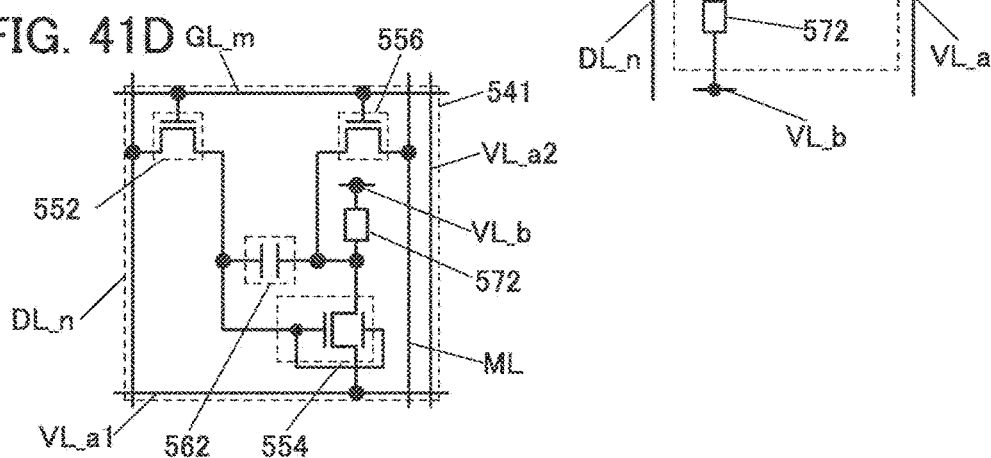

Alternatively, each of the plurality of pixel circuits 541 in FIG. 41A can have the structure illustrated in FIG. 41D, for example.

The pixel circuit 541 illustrated in FIG. 41D includes the transistor 552 serving as a selection transistor which controls writing of a data signal, the transistor 554 serving as a driver transistor, a transistor 556, the capacitor 562, and the light-emitting element 572. Here, any of the transistors 100*t*, 100*w*, 111*b*, 111*e*, 111*h*, and 111*k* described in Embodiment 2 can be used as the transistor 552 as appropriate, and any of the transistors 100*u*, 100*x*, 111*c*, 111*f*, 111*i*, and 111*m* described in Embodiment 2 can be used as the transistor 554 as appropriate.

One of a source electrode and a drain electrode of the transistor 552 is electrically connected to a wiring to which a data signal is supplied (a signal line DL_n). A gate electrode of the transistor 552 is electrically connected to a wiring to which a gate signal is supplied (a scan line GL_m).

The transistor 552 has a function of controlling whether to write a data signal by being turned on or off. This means that the transistor 552 serves as a selection transistor.

One of a source electrode and a drain electrode of the transistor 554 is electrically connected to a wiring to which a potential is supplied (hereinafter referred to as a potential supply line VL_a1), and the other of the source electrode and the drain electrode of the transistor 554 is electrically connected to one electrode of the light-emitting element 572. A gate electrode of the transistor 554 is electrically connected to the other of the source electrode and the drain electrode of the transistor 552 and one electrode of the capacitor 562.

One of a source electrode and a drain electrode of the transistor 556 is connected to a wiring ML to which a reference potential of data is supplied, and the other is electrically connected to the one electrode of the light-emitting element 572 and the other electrode of the capacitor 562. A gate electrode of the transistor 556 is electrically connected to the scan line GL_m to which a gate signal is supplied.

The transistor 556 has a function of controlling current flowing through the light-emitting element 572. For example, in the case where the transistors 554 deteriorate or vary in threshold voltage or field-effect mobility, current that flows in each light-emitting element 572 can be corrected through monitoring of current flowing in the wiring ML connected to one of the source electrode and the drain electrode of each transistor 556. The wiring ML can be supplied with, for example, voltage lower than or equal to the threshold voltage of the light-emitting element 572.

In this embodiment, the channel length of the transistor 556 is preferably longer than the channel length of the transistor 554, for example. Note that the transistor 556 can have a single-gate structure, or have a dual-gate structure like the transistor 554. It is preferable that the transistor 556 have a single-gate structure because a region where a first gate electrode and a second gate electrode are in contact with each other is not necessary, so that the area of the transistor can be reduced, which can increase the aperture ratio of the pixel.

The one of the pair of electrodes of the capacitor 562 is electrically connected to the other of the source electrode and the drain electrode of the transistor 552 and the gate electrode of the transistor 554. The other of the pair of electrodes of the capacitor 562 is electrically connected to the other of the source electrode and the drain electrode of the transistor 554, the other of the source electrode and the drain electrode of the transistor 556, and the one electrode of the light-emitting element 572.

The one of the pair of electrodes of the light-emitting element 572 is electrically connected to the other of the source electrode and the drain electrode of the transistor 554, the other electrode of the capacitor 562, and the other of the source electrode and the drain electrode of the transistor 556. The other of the pair of electrodes of the light-emitting element 572 is electrically connected to a potential supply line VL_b serving as a cathode.

A potential supply line VL_a2 extends in a direction parallel to the wiring ML. The potential supply line VL_a2 is connected to the potential supply line VL_a1 serving as an anode line, so that the wiring resistance of the potential supply lines VL_a1 and VL_a2 can be reduced. Thus, voltage drop of the wiring in the display device using a large substrate can be reduced; accordingly, unevenness in luminance of the display device can be reduced.

One of a high power supply potential VDD and a low power supply potential VSS is supplied to the potential supply lines VL_a1 and VL_a2, and the other of the high power supply potential VDD and the low power supply potential VSS is supplied to the potential supply line VL_b. In the structure of FIG. 41D, the high power supply potential VDD is supplied to the potential supply lines VL_a1 and VL_a2, and the low power supply potential VSS is supplied to the potential supply line VL_b.

In the display device including the pixel circuit 541 in FIG. 41D, the pixel circuits 541 are sequentially selected row by row by the gate driver 544a illustrated in FIG. 41A, for example, whereby the transistors 552 are turned on and a data signal is written.

When the transistors 552 are turned off, the pixel circuits 541 in which the data has been written are brought into a holding state. Moreover, the transistor 552 is connected to the capacitor 562; thus, the written data can be held for a long time. Further, the amount of current flowing between the source electrode and the drain electrode of the transistor 554 is controlled. The light-emitting element 572 emits light with a luminance corresponding to the amount of flowing current. This operation is sequentially performed row by row; thus, an image can be displayed.

The structure described in this embodiment can be used in appropriate combination with any of the structures described in the other embodiments.

Embodiment 8

In this embodiment, an example of a display device that includes any of the transistors described in the above embodiments is described below with reference to FIG. 42, FIGS. 43A and 43B, and FIGS. 44A and 44B.

Figure 42:
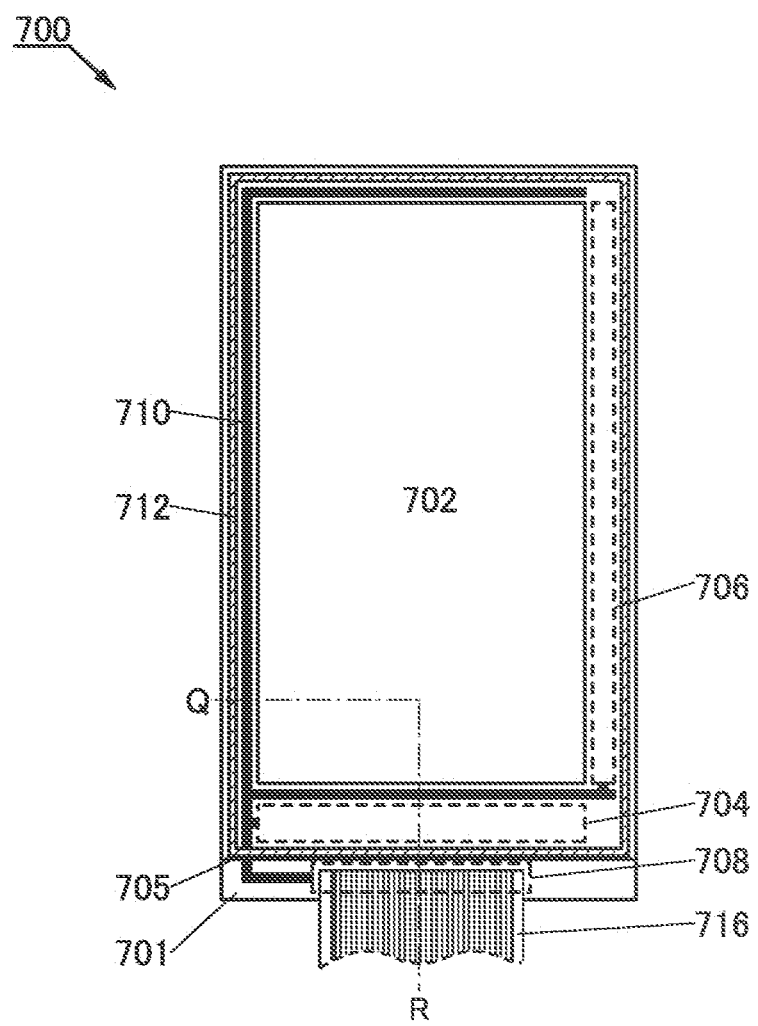
FIG. 42 is a top view illustrating one embodiment of a display device.

FIG. 42 is a top view of an example of a display device. A display device 700 illustrated in FIG. 42 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 42, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are fainted over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a COG method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include any of a variety of elements. Examples of the element include a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Note that examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color components. Embodiments of the disclosed invention are not limited to a display device for color display; the disclosed invention can also be applied to a display device for monochrome display.

In this embodiment, structures including a liquid crystal element and an EL element as display elements are described with reference to FIGS. 43A and 43B and FIGS. 44A and 44B. Note that FIGS. 43A and 43B are cross-sectional views along the dashed-dotted line Q-R shown in FIG. 42 and each show a structure including a liquid crystal element as a display element, whereas FIGS. 44A and 44B are cross-sectional views along the dashed-dotted line Q-R shown in FIG. 42 and each show a structure including an EL element as a display element.

Figure 43:
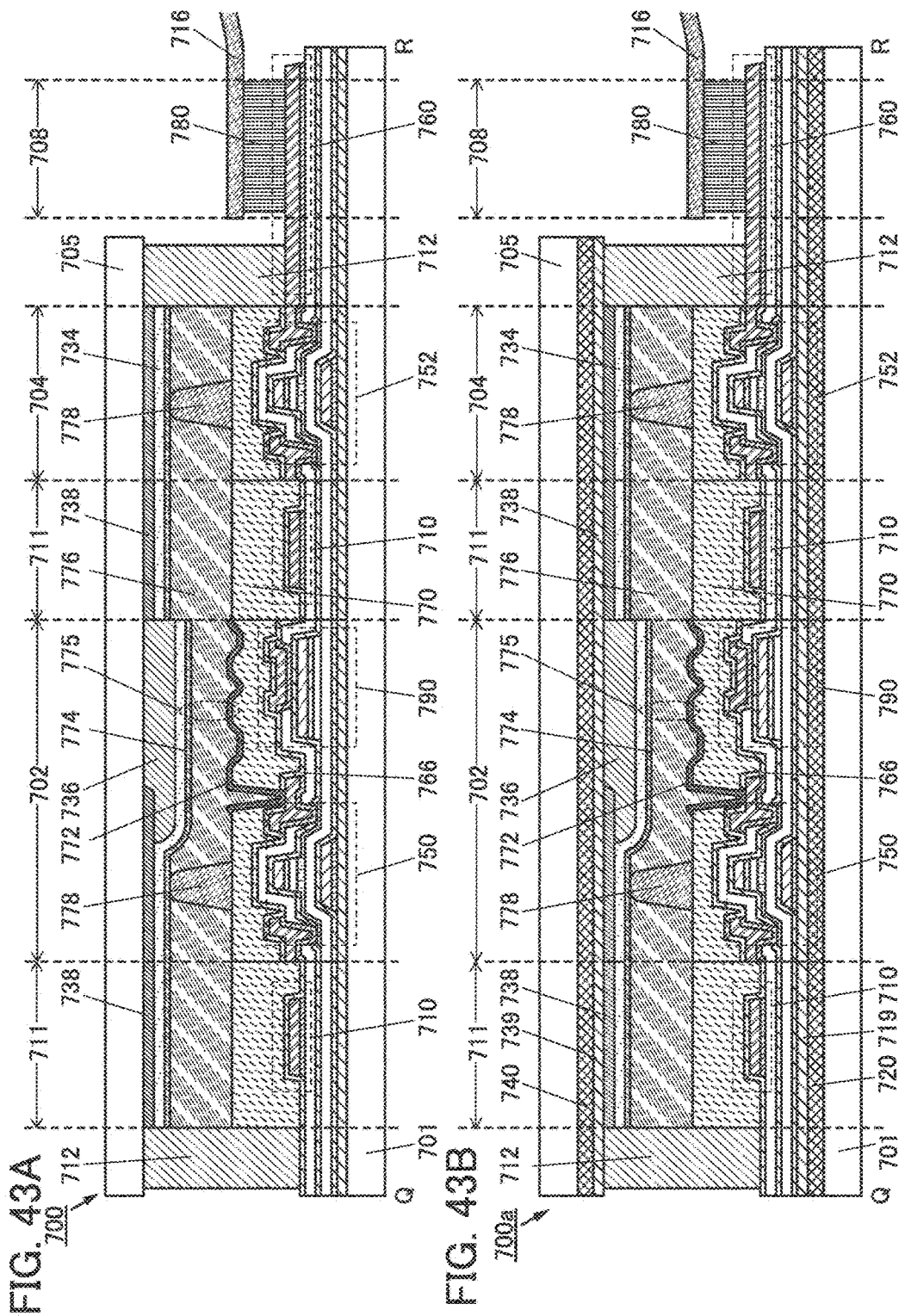
FIGS. 43A and 43B are cross-sectional views each illustrating one embodiment of a display device.
Figure 44:
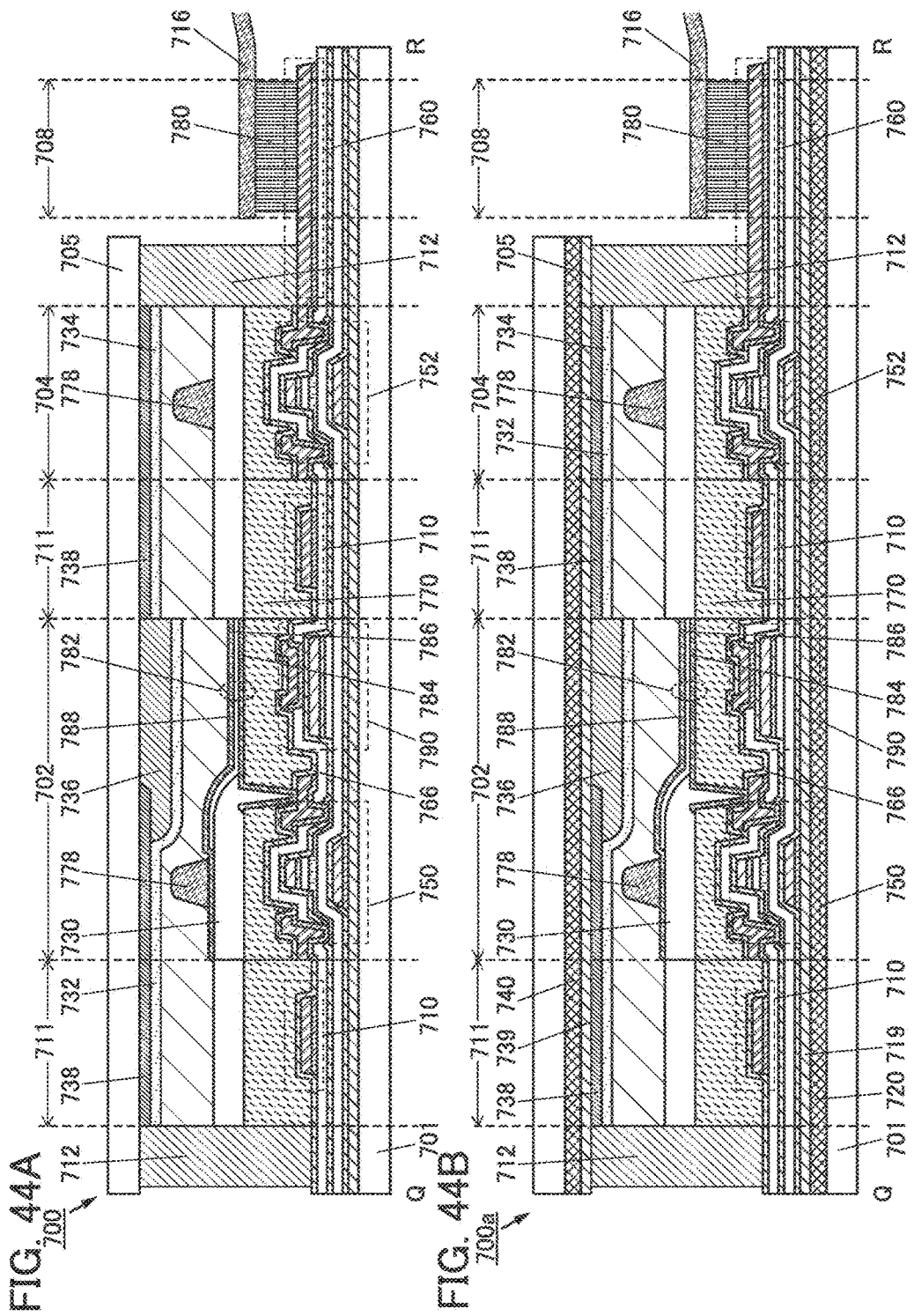
FIGS. 44A and 44B are cross-sectional views each illustrating one embodiment of a display device.

FIG. 43A and FIG. 44A show the display device 700 with high mechanical strength in which glass or the like is used for the first substrate 701 and the second substrate 705. FIG. 43B and FIG. 44B show a flexible display device 700a in which plastic or the like is used for the first substrate 701 and the second substrate 705. The first substrate 701 is fixed, with an adhesive 720, to an insulating film 719 on which transistors 750 and 752 and a capacitor 790 are formed. The second substrate 705 is fixed, with an adhesive 740, to an insulating film 739 on which a coloring film 736, a light-blocking film 738, and the like are formed.

Common portions between FIGS. 43A and 43B and FIGS. 44A and 44B are described first, and then different portions are described.

<Common Portions in Display Devices>

The display devices 700 and 700a illustrated in FIGS. 43A and 43B and FIGS. 44A and 44B each include a lead wiring portion 711, the pixel portion 702, the source driver circuit portion 704, and the FPC terminal portion 708. Note that the lead wiring portion 711 includes the signal line 710. The pixel portion 702 includes the transistor 750 and the capacitor 790. The source driver circuit portion 704 includes the transistor 752.

Any of the structures of the transistors described in the above embodiments can be applied to the transistors 750 and 752 as appropriate.

The transistors used in this embodiment each include an oxide semiconductor film which is highly purified and in which formation of oxygen vacancies is suppressed. In the transistor, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

In FIGS. 43A and 43B and FIGS. 44A and 44B, an insulating film 766 and a planarization insulating film 770 are provided over the transistor 750, the transistor 752, and the capacitor 790.

The insulating film 766 can be formed using materials and methods similar to that of the insulating film 126 described in the above embodiment. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed in the same process as conductive films functioning as a source electrode and a drain electrode of the transistor 750 or 752. Note that the signal line 710 may be formed using a conductive film functioning as a gate electrode of the transistor 750 or 752. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same process as conductive films functioning as a source electrode and a drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure 778 is provided between the first substrate 701 and the second substrate 705. The structure 778 is a columnar spacer obtained by selective etching of an insulating film and is provided to control the thickness (cell gap) between the first substrate 701 and the second substrate 705. Alternatively, a spherical spacer may be used as the structure 778.

Furthermore, the light-blocking film 738 functioning as a black matrix, the coloring film 736 functioning as a color filter, and an insulating film 734 in contact with the light-blocking film 738 and the coloring film 736 are provided on the second substrate 705 side.

<Structure Example of Display Device Using Liquid Crystal Element as Display Element>

The display devices 700 and 700a illustrated in FIGS. 43A and 43B each include a liquid crystal element 775. The liquid crystal element 775 includes a conductive film 772, a conductive film 774, and a liquid crystal layer 776. The conductive film 774 is provided on the second substrate 705 side and functions as a counter electrode. The display devices 700 and 700a in FIGS. 43A and 43B are capable of displaying an image in such a manner that transmission or non-transmission is controlled by change in the alignment state of the liquid crystal layer 776 depending on a voltage applied to the conductive film 772 and the conductive film 774.

The conductive film 772 is connected to the conductive films functioning as a source electrode and a drain electrode included in the transistor 750. The conductive film 772 is formed over the planarization insulating film 770 to function as a pixel electrode, i.e., one electrode of the display element. The conductive film 772 has a function of a reflective electrode. The display devices 700 and 700a in FIGS. 43A and 43B are what is called reflective color liquid crystal display devices in which external light is reflected by the conductive film 772 to display an image through the coloring film 736.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used for the conductive film 772.

Note that projections and depressions are provided in part of the planarization insulating film 770 of the pixel portion 702 in the display devices 700 and 700a in FIGS. 43A and 43B. The projections and depressions can be foamed in such a manner that the planarization insulating film 770 is formed using an organic resin film or the like, and projecting portions or depressed portions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display devices 700 and 700a illustrated in FIGS. 43A and 431:3 are reflective color liquid crystal display devices given as examples, but a display type is not limited thereto. For example, a transmissive color liquid crystal display device in which the conductive film 772 is a conductive film that transmits visible light may be used. In the case of a transmissive color liquid crystal display device, projections and depressions are not necessarily provided on the planarization insulating film 770.

Although not illustrated in FIGS. 43A and 43B, an alignment film may be provided on a side of the conductive film 772 in contact with the liquid crystal layer 776 and on a side of the conductive film 774 in contact with the liquid crystal layer 776. Although not illustrated in FIGS. 43A and 43B, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes a liquid crystal exhibiting a blue phase and a chiral material is preferable because it has a short response time, has optical isotropy, which makes the alignment process unneeded, and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti ferroelectric liquid crystal (AFLC) mode, or the like can be used.

Further, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

<Display Device Using Light-Emitting Element as Display Element>

The display devices 700 and 700a illustrated in FIGS. 44A and 44B each include a light-emitting element 782. The light-emitting element 782 includes a conductive film 784, an EL layer 786, and a conductive film 788. The display devices 700 and 700a shown in FIGS. 44A and 44B are capable of displaying an image by light emission from the EL layer 786 included in the light-emitting element 782.

The conductive film 784 is connected to the conductive films functioning as a source electrode and a drain electrode included in the transistor 750. The conductive film 784 is formed over the planarization insulating film 770 to function as a pixel electrode, i.e., one electrode of the display element. A conductive film which transmits visible light or a conductive film which reflects visible light can be used for the conductive film 784. The conductive film which transmits visible light can be formed using a material including one kind selected from indium (In), zinc (Zn), and tin (Sn), for example. The conductive film which reflects visible light can be formed using a material including aluminum or silver, for example.

In the display devices 700 and 700a shown in FIGS. 44A and 44B, an insulating film 730 is provided over the planarization insulating film 770 and the conductive film 784. The insulating film 730 covers part of the conductive film 784. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as each of the display devices 700 and 700a shown in FIGS. 44A and 44B, the structure is not limited thereto. In the case where the EL layer 786 is formed by a separate coloring method, the coloring film 736 is not necessarily provided.

The structure described in this embodiment can be used in appropriate combination with any of the structures described in the other embodiments.

Embodiment 9

In this embodiment, one embodiment of a light-emitting device using the semiconductor device of one embodiment of the present invention is described. Note that in this embodiment, a structure of a pixel portion of a light-emitting device is described with reference to FIG. 45.

Figure 45:
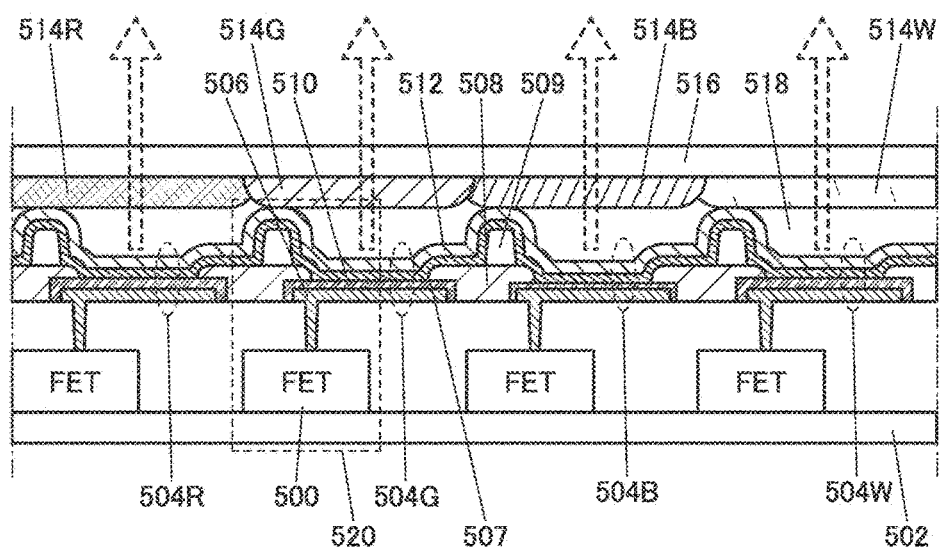
FIG. 45 is a cross-sectional view illustrating a structure of a pixel portion of a light-emitting device.

In FIG. 45, a plurality of FETs 500 is formed over a first substrate 502, and each of the FETs 500 is electrically connected to a light-emitting element (504R, 504G, 504B, or 504W). Specifically, the FET 500 is electrically connected to a first conductive film 506 included in the light-emitting element. Note that the light-emitting elements (504R, 504G, 504B, and 504W) each include the first conductive film 506, a second conductive film 507, an EL layer 510, and a third conductive film 512.

Furthermore, coloring layers (514R, 514G, 514B, and 514W) are provided in positions facing the corresponding light-emitting elements (504R, 504G, 504B, and 504W). Note that the coloring layers (514R, 514G, 514B, and 514W) are provided in contact with a second substrate 516. Furthermore, a sealing film 518 is provided between the first substrate 502 and the second substrate 516. For example, a glass material such as a glass frit, or a resin that is curable at room temperature such as a two-component type resin, a light curable resin, a heat-curable resin, and the like can be used for the sealing film 518.

A partition wall 508 is provided so as to cover end portions of adjacent stacks of the first conductive film 506 and the second conductive film 507. A structure 509 is provided over the partition wall 508. Note that the first conductive film 506 has a function as a reflective electrode and a function as an anode of the light-emitting element. The second conductive film 507 has a function of adjusting the optical path length of each light-emitting element. The EL layer 510 is formed over the second conductive film 507, and the third conductive film 512 is formed over the EL layer 510. The third conductive film 512 has a function as a semi-transmissive and semi-reflective electrode and a function as a cathode of the light-emitting element. The structure 509 is provided between the light-emitting element and the coloring layer and has a function as a spacer.

The EL layer 510 can be shared by the light-emitting elements (504R, 504G, 504B, and 504W). Note that each of the light-emitting elements (504R, 504G, 504B, and 504W) has a micro optical resonator (or microcavity) structure which allows light emitted from the EL layer 510 to resonate by the first conductive film 506 and the third conductive film 512; thus, spectra of light with different wavelengths can be narrowed and extracted even when they include the same EL layer 510. Specifically, by adjusting the thickness of each of the second conductive films 507 provided under the EL layer 510 in the light-emitting element (504R, 504G, 504B, or 504W), a desired emission spectrum can be obtained from the EL layer 510, so that light emission with high color purity can be obtained. Therefore, the structure illustrated in FIG. 45 does not require a process of separately forming EL layers with different colors, and facilitates achieving high resolution.

The light-emitting device illustrated in FIG. 45 includes the coloring layer (color filter); thus, light with a desired emission spectrum can be emitted. Therefore, by using the microcavity structure and the color filter in combination, light emission with higher color purity can be obtained. Specifically, the optical path length of the light-emitting element 504R is adjusted so that red light emission is provided; red light is emitted in the direction indicated by an arrow through the coloring layer 514R. Furthermore, the optical path length of the light-emitting element 504G is adjusted so that green light emission is provided; green light is emitted in the direction indicated by an arrow through the coloring layer 514G. Furthermore, the optical path length of the light-emitting element 504B is adjusted so that blue light emission is provided; blue light is emitted in the direction indicated by an arrow through the coloring layer 514B. Furthermore, the optical path length of the light-emitting element 504W is adjusted so that white light emission is provided; white light is emitted in the direction indicated by an arrow through the coloring layer 514W.

Note that a method for adjusting the optical path length of each light-emitting element is not limited thereto. For example, the optical path length may be adjusted by controlling the film thickness of the EL layer 510 in each light-emitting element.

The coloring layers (514R, 514G, and 514B) may have a function of transmitting light in a particular wavelength region. For example, a red (R) color filter for transmitting light in a red wavelength range, a green (G) color filter for transmitting light in a green wavelength range, a blue (B) color filter for transmitting light in a blue wavelength range, or the like can be used. The coloring layer 514W may be formed using an acrylic-based resin material which does not contain a pigment or the like. The coloring layers (514R, 514G, 514B, and 514W) can be formed using any of various materials by a printing method, an inkjet method, an etching method using a photolithography technique, or the like.

The first conductive film 506 can be formed using, for example, a metal film having high reflectivity (reflection factor of visible light is 40% to 100%, preferably 70% to 100%). The first conductive film 506 can be formed using a single layer or a stacked layer using aluminum, silver, or an alloy containing such a metal material (e.g., an alloy of silver, palladium, and copper).

The second conductive film 507 can be formed using, for example, conductive metal oxide. As the conductive metal oxide, indium oxide, tin oxide, zinc oxide, indium tin oxide (also referred to as ITO), indium zinc oxide, or any of these metal oxide materials in which silicon oxide or tungsten oxide is contained can be used. Providing the second conductive film 507 is preferable because the formation of an insulating film between the EL layer 510 to be formed later and the first conductive film 506 can be suppressed. Furthermore, conductive metal oxide which is used as the second conductive film 507 may be formed in layer lower than the first conductive film 506.

The third conductive film 512 is formed using a conductive material having reflectivity and a conductive material having a light-transmitting property, and visible light reflectivity of the film is preferably 20% to 80%, more preferably 40% to 70%. As the third conductive film 512, for example, silver, magnesium, an alloy of such a metal material, or the like is formed to be thin (e.g., 10 nm or less), and then, conductive metal oxide which can be used for the second conductive film 507 is formed.

The above-described light-emitting device has a structure in which light is extracted from the second substrate 516 side (a top emission structure), but may have a structure in which light is extracted from the first substrate 501 side where the FETs 500 are formed (a bottom emission structure) or a structure in which light is extracted from both the first substrate 501 side and the second substrate 516 side (a dual emission structure). In the case of the bottom emission structure, the coloring layers (514R, 514G, 514B, and 514W) may be formed under the first conductive film 506. Note that a light-transmitting substrate may be used for the substrate through which light is transmitted, and a light-transmitting substrate and a light-blocking substrate may be used for the substrate through which light is not transmitted.

In FIG. 45, the structure in which the light-emitting elements emit light of red (R), green (G), blue (B), and white (W) is illustrated as an example. However, a structure is not limited thereto. For example, a structure in which the light-emitting elements emit light of red (R), green (G), and blue (B) may be used.

Embodiment 10

In this embodiment, a display module and electronic devices that can be formed using a semiconductor device of one embodiment of the present invention are described with reference to FIG. 46 and FIGS. 47A to 47G.

Figure 46:
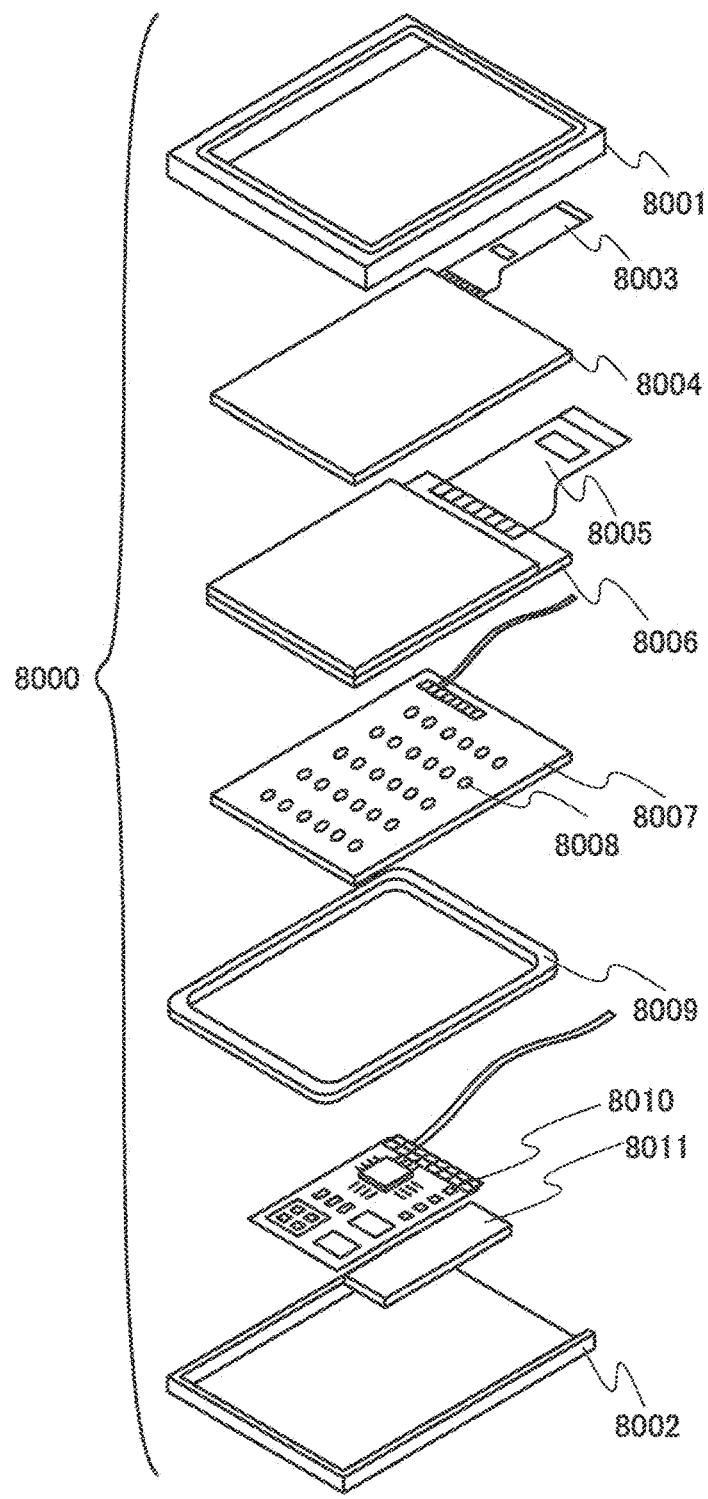
FIG. 46 illustrates a display module.

In a display module 8000 illustrated in FIG. 46, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Note that although a structure in which the light sources 8008 are provided over the backlight 8007 is illustrated in FIG. 46, one embodiment of the present invention is not limited to this structure. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 47A to 47D illustrate electronic devices. These electronic devices can include a housing 600, a display portion 601, a speaker 603, an LED lamp 604, operation keys 605 (including a power switch or an operation switch), a connection terminal 606, a sensor 607 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 608, and the like.

Figure 47A:
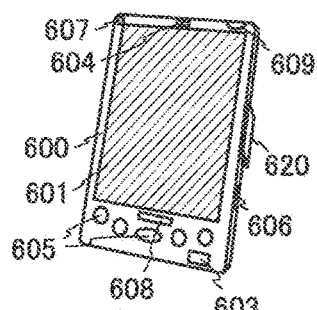
FIGS. 47A to 47G illustrate electronic devices.
Figure 47B:
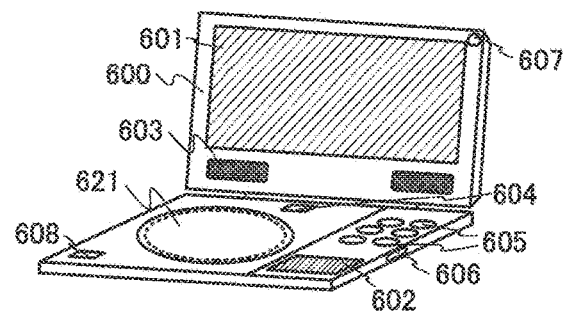
Figure 47C:
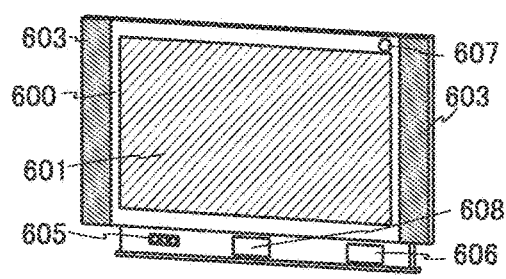
Figure 47D:
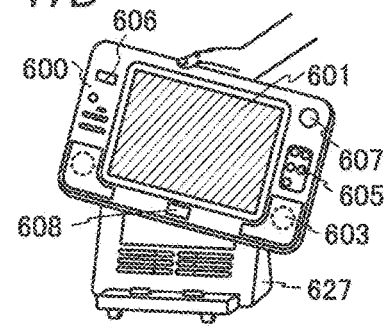

FIG. 47A illustrates a mobile computer that can include a switch 609, an infrared port 620, and the like in addition to the above components. FIG. 4713 illustrates a portable image reproducing device (e.g., a DVD player) that is provided with a memory medium and can include a second display portion 602, a memory medium reading portion 621, and the like in addition to the above components. FIG. 47C illustrates a television receiver that can include a tuner, an image processing portion, and the like in addition to the above components. FIG. 47D illustrates a portable television receiver that can include a charger 627 capable of transmitting and receiving signals, and the like in addition to the above components.

Figure 47E:
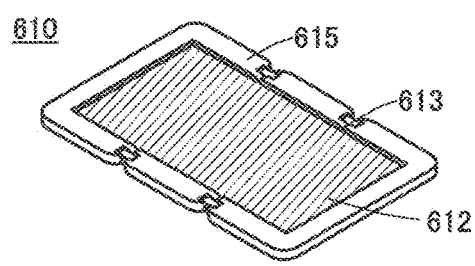
Figure 47F:
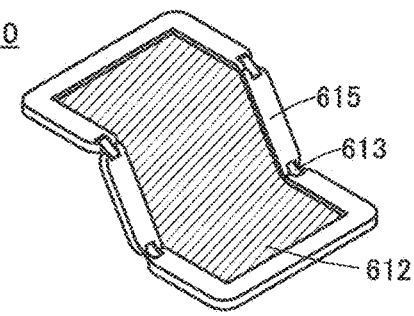
Figure 47G:
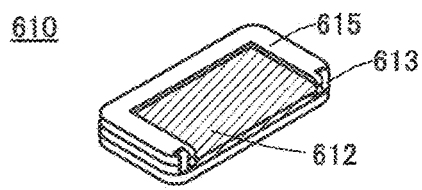

FIGS. 47E to 47G illustrate a foldable portable information terminal 610. FIG. 47E illustrates the portable information terminal 610 that is opened. FIG. 47F illustrates the portable information terminal 610 that is being opened or being folded. FIG. 47G illustrates the portable information terminal 610 that is folded. The portable information terminal 610 is highly portable when folded. When the portable information terminal 610 is opened, a seamless large display region provides high browsability.

A display portion 612 is supported by three housings 615 joined together by hinges 613. By folding the portable information terminal 610 at a connection portion between two housings 615 with the hinges 613, the portable information terminal 610 can be reversibly changed in shape from an opened state to a folded state. A display device according to one embodiment of the present invention can be used for the display portion 612. For example, a display device that can be bent with a radius of curvature of greater than or equal to 1 mm and less than or equal to 150 mm can be used.

The electronic devices illustrated in FIGS. 47A to 47G can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Furthermore, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 47A to 47G are not limited thereto, and the electronic devices can have a variety of functions.

The electronic devices described in this embodiment each include the display portion for displaying some sort of data. Note that the semiconductor device of one embodiment of the present invention can also be used for an electronic device which does not have a display portion.

The structure described in this embodiment can be used in appropriate combination with any of the structures described in the other embodiments.

This application is based on Japanese Patent Application serial no. 2014-022872 filed with Japan Patent Office on Feb. 7, 2014, Japanese Patent Application serial no. 2014-022871 filed with Japan Patent Office on Feb. 7, 2014, Japanese Patent Application serial no. 2014-051131 filed with Japan Patent Office on Mar. 14, 2014, and Japanese Patent Application serial no. 2014-051136 filed with Japan Patent Office on Mar. 14, 2014, the entire contents of which are hereby incorporated by reference.

What is claimed is:

1. A semiconductor device comprising:
a first transistor and a second transistor each over a first insulating
the first transistor comprising:
a first oxide semiconductor film;
a second oxide semiconductor film on and in contact with the first oxide semiconductor film;
a third oxide semiconductor film on and in contact with a top surface of the second oxide semiconductor film and side surfaces of the first oxide semiconductor film and the second oxide semiconductor film;
a first gate insulating film on and in contact with the third oxide semiconductor film; and
a first gate electrode over the first gate insulating film; and
the second transistor comprising:
a fourth oxide semiconductor film;
a second gate insulating film on and in contact with the fourth oxide semiconductor film; and
a second gate electrode over the second gate insulating film,
wherein each of the first oxide semiconductor film, the second oxide semiconductor film, the third oxide semiconductor film, and the fourth oxide semiconductor film comprises indium, gallium, and zinc, and
wherein, in each of the third oxide semiconductor film and the fourth oxide semiconductor film, a proportion of indium atoms is lower than or equal to a proportion of gallium atoms.

2. The semiconductor device according to claim 1, wherein the first transistor comprises a source electrode and a drain electrode each on and in contact with the third oxide semiconductor film.

3. The semiconductor device according to claim 1, comprising a second insulating film over the first gate electrode and the second gate electrode,
wherein the first transistor comprises a first source electrode and a first drain electrode each over the second insulating film, and
wherein the second transistor comprises a second source electrode and a second drain electrode each over the second insulating film.

4. The semiconductor device according to claim 1, comprising a second insulating film over the first gate electrode and the second gate electrode and in contact with the third oxide semiconductor film and the fourth oxide semiconductor film, wherein the second insulating film is a nitride insulating film.

5. The semiconductor device according to claim 1, wherein the third oxide semiconductor film covers the first oxide semiconductor film and the second oxide semiconductor film.

6. The semiconductor device according to claim 1, wherein, in the second oxide semiconductor film, a proportion of indium atoms is higher than a proportion of gallium atoms.

7. A display device comprising the semiconductor device according to claim 1,
wherein the display device comprises:
a driver circuit portion comprising the first transistor; and
a pixel portion comprising:
the second transistor; and
a display element electrically connected to the second transistor.

8. The display device according to claim 7, wherein the display element is a liquid crystal element.

9. The display device according to claim 7, wherein the display element is an electroluminescent element.

10. The semiconductor device according to claim 1, wherein the first gate electrode is electrically connected to one of a source electrode and a drain electrode of the second transistor.

* * * * *